(12) United States Patent
Takamure et al.

(10) Patent No.: US 9,556,516 B2
(45) Date of Patent: Jan. 31, 2017

(54) METHOD FOR FORMING TI-CONTAINING FILM BY PEALD USING TDMAT OR TDEAT

(71) Applicant: ASM IP Holding B.V., Almere (NL)

(72) Inventors: Noboru Takamure, Kawasaki (JP); Tatsuhiro Okabe, Sagamihara (JP)

(73) Assignee: ASM IP Holding B.V, Almere (NL)

( * ) Notice: Subject to any disclaimer, the term of this patent is extended or adjusted under 35 U.S.C. 154(b) by 386 days.

(21) Appl. No.: 14/050,150

(22) Filed: Oct. 9, 2013

(65) Prior Publication Data

US 2015/0099072 A1   Apr. 9, 2015

(51) Int. Cl.
| | |
|---|---|
| C23C 16/44 | (2006.01) |
| C23C 16/40 | (2006.01) |
| C23C 16/34 | (2006.01) |
| C23C 16/36 | (2006.01) |
| C23C 16/30 | (2006.01) |
| C23C 16/455 | (2006.01) |
| C23C 16/52 | (2006.01) |

(52) U.S. Cl.
CPC .......... *C23C 16/405* (2013.01); *C23C 16/308* (2013.01); *C23C 16/34* (2013.01); *C23C 16/36* (2013.01); *C23C 16/4554* (2013.01); *C23C 16/45553* (2013.01); *C23C 16/52* (2013.01)

(58) Field of Classification Search
None
See application file for complete search history.

(56) References Cited

U.S. PATENT DOCUMENTS

| | | |
|---|---|---|
| D56,051 S | 8/1920 | Cohn |
| 2,161,626 A | 6/1939 | Loughner et al. |
| 2,745,640 A | 5/1956 | Cushman |
| 2,990,045 A | 9/1959 | Root |
| 3,089,507 A | 5/1963 | Drake et al. |
| 3,094,396 A | 6/1963 | Sylvester et al. |
| 3,232,437 A | 2/1966 | Hultgren |

(Continued)

FOREIGN PATENT DOCUMENTS

| | | |
|---|---|---|
| CN | 1563483 | 1/2005 |
| CN | 101330015 | 12/2008 |

(Continued)

OTHER PUBLICATIONS

Kim et al. "Thermal Decomposition of Tetrakis(ethylmethylamido) titanium for chemical vapor deposition of titanium nitride" Chem. Vapor Depo of Titanium Nitride Bull Korean CHem Soc. 2006 vol. 27 p. 219-223.*

(Continued)

*Primary Examiner* — Mandy Louie
(74) *Attorney, Agent, or Firm* — Snell & Wilmer LLP

(57) ABSTRACT

A method for forming a Ti-containing film on a substrate by plasma-enhanced atomic layer deposition (PEALD) using tetrakis(dimethylamino)titanium (TDMAT) or tetrakis(diethylamino)titanium (TDEAT), includes: introducing TDMAT and/or TDEAT in a pulse to a reaction space where a substrate is placed; continuously introducing a $NH_3$-free reactant gas to the reaction space; applying RF power in a pulse to the reaction space wherein the pulse of TDMAT and/or TDEAT and the pulse of RF power do not overlap; and repeating the above steps to deposit a Ti-containing film on the substrate.

8 Claims, 15 Drawing Sheets

(56) References Cited

U.S. PATENT DOCUMENTS

| | | |
|---|---|---|
| 3,833,492 A | 9/1974 | Bollyky |
| 3,854,443 A | 12/1974 | Baerg |
| 3,862,397 A | 1/1975 | Anderson et al. |
| 3,887,790 A | 6/1975 | Ferguson |
| 4,054,071 A | 10/1977 | Patejak |
| 4,058,430 A | 11/1977 | Suntola et al. |
| 4,134,425 A | 1/1979 | Gussefeld et al. |
| 4,145,699 A | 3/1979 | Hu et al. |
| 4,176,630 A | 12/1979 | Elmer |
| 4,181,330 A | 1/1980 | Kojima |
| 4,194,536 A | 3/1980 | Stine et al. |
| 4,322,592 A | 3/1982 | Martin |
| 4,389,973 A | 6/1983 | Suntola et al. |
| 4,393,013 A | 7/1983 | McMenamin |
| 4,401,507 A | 8/1983 | Engle |
| 4,414,492 A | 11/1983 | Hanlet |
| 4,436,674 A | 3/1984 | McMenamin |
| 4,479,831 A | 10/1984 | Sandow |
| 4,499,354 A | 2/1985 | Hill et al. |
| 4,512,113 A | 4/1985 | Budinger |
| 4,570,328 A | 2/1986 | Price et al. |
| 4,579,623 A | 4/1986 | Suzuki et al. |
| D288,556 S | 3/1987 | Wallgren |
| 4,653,541 A | 3/1987 | Oehlschlaeger et al. |
| 4,654,226 A | 3/1987 | Jackson et al. |
| 4,681,134 A | 7/1987 | Paris |
| 4,718,637 A | 1/1988 | Contin |
| 4,722,298 A | 2/1988 | Rubin et al. |
| 4,735,259 A | 4/1988 | Vincent |
| 4,753,192 A | 6/1988 | Goldsmith et al. |
| 4,756,794 A | 7/1988 | Yoder |
| 4,780,169 A | 10/1988 | Stark et al. |
| 4,789,294 A | 12/1988 | Sato et al. |
| 4,821,674 A | 4/1989 | deBoer et al. |
| 4,827,430 A | 5/1989 | Aid et al. |
| 4,837,185 A | 6/1989 | Yau et al. |
| 4,854,263 A | 8/1989 | Chang et al. |
| 4,857,139 A | 8/1989 | Tashiro et al. |
| 4,857,504 A | 8/1989 | Sheng et al. |
| 4,882,199 A | 11/1989 | Sadoway et al. |
| 4,976,996 A | 12/1990 | Monkowski et al. |
| 4,978,567 A | 12/1990 | Miller |
| 4,984,904 A | 1/1991 | Nakano et al. |
| 4,985,114 A | 1/1991 | Okudaira |
| 4,986,215 A | 1/1991 | Yamada |
| 4,987,856 A | 1/1991 | Hey |
| 4,991,614 A | 2/1991 | Hammel |
| 5,013,691 A | 5/1991 | Lory et al. |
| 5,027,746 A | 7/1991 | Frijlink |
| 5,028,366 A | 7/1991 | Harakal et al. |
| 5,060,322 A | 10/1991 | Delepine |
| 5,062,386 A | 11/1991 | Christensen |
| 5,065,698 A | 11/1991 | Koike |
| 5,074,017 A | 12/1991 | Toya et al. |
| 5,098,638 A | 3/1992 | Sawada |
| 5,104,514 A | 4/1992 | Quartarone |
| 5,116,018 A | 5/1992 | Friemoth et al. |
| D327,534 S | 6/1992 | Manville |
| 5,119,760 A | 6/1992 | McMillan et al. |
| 5,167,716 A | 12/1992 | Boitnott et al. |
| 5,178,682 A | 1/1993 | Tsukamoto et al. |
| 5,183,511 A | 2/1993 | Yamazaki et al. |
| 5,192,717 A | 3/1993 | Kawakami et al. |
| 5,194,401 A | 3/1993 | Adams et al. |
| 5,199,603 A | 4/1993 | Prescott |
| 5,221,556 A | 6/1993 | Hawkins et al. |
| 5,242,539 A | 9/1993 | Kumihashi et al. |
| 5,243,195 A | 9/1993 | Nishi |
| 5,246,500 A | 9/1993 | Samata et al. |
| 5,271,967 A | 12/1993 | Kramer et al. |
| 5,288,684 A | 2/1994 | Yamazaki et al. |
| 5,306,946 A | 4/1994 | Yamamoto |
| 5,315,092 A | 5/1994 | Takahashi et al. |
| 5,326,427 A | 7/1994 | Jerbic |
| 5,336,327 A | 8/1994 | Lee |
| 5,354,580 A | 10/1994 | Goela et al. |
| 5,356,478 A | 10/1994 | Chen et al. |
| 5,360,269 A | 11/1994 | Ogawa et al. |
| 5,380,367 A | 1/1995 | Bertone |
| 5,382,311 A | 1/1995 | Ishikawa et al. |
| 5,404,082 A | 4/1995 | Hernandez et al. |
| 5,413,813 A | 5/1995 | Cruse et al. |
| 5,415,753 A | 5/1995 | Hurwitt et al. |
| 5,421,893 A | 6/1995 | Perlov |
| 5,422,139 A | 6/1995 | Fischer |
| 5,430,011 A | 7/1995 | Tanaka et al. |
| 5,494,494 A | 2/1996 | Mizuno et al. |
| 5,496,408 A | 3/1996 | Motoda et al. |
| 5,504,042 A | 4/1996 | Cho et al. |
| 5,518,549 A | 5/1996 | Hellwig |
| 5,527,417 A | 6/1996 | Iida et al. |
| 5,531,835 A | 7/1996 | Fodor et al. |
| 5,574,247 A | 11/1996 | Nishitani et al. |
| 5,577,331 A | 11/1996 | Suzuki |
| 5,589,002 A | 12/1996 | Su |
| 5,589,110 A | 12/1996 | Motoda et al. |
| 5,595,606 A | 1/1997 | Fujikawa et al. |
| 5,601,641 A | 2/1997 | Stephens |
| 5,604,410 A | 2/1997 | Vollkommer et al. |
| 5,616,947 A | 4/1997 | Tamura |
| 5,621,982 A | 4/1997 | Yamashita |
| 5,632,919 A | 5/1997 | MacCracken et al. |
| D380,527 S | 7/1997 | Velez |
| 5,679,215 A | 10/1997 | Barnes et al. |
| 5,681,779 A | 10/1997 | Pasch et al. |
| 5,683,517 A | 11/1997 | Shan |
| 5,695,567 A | 12/1997 | Kordina |
| 5,718,574 A | 2/1998 | Shimazu |
| 5,724,748 A | 3/1998 | Brooks |
| 5,728,223 A | 3/1998 | Murakarni et al. |
| 5,730,801 A | 3/1998 | Tepman et al. |
| 5,732,744 A | 3/1998 | Barr et al. |
| 5,736,314 A | 4/1998 | Hayes et al. |
| 5,777,838 A | 7/1998 | Tamagawa et al. |
| 5,781,693 A | 7/1998 | Ballance et al. |
| 5,796,074 A | 8/1998 | Edelstein et al. |
| 5,801,104 A | 9/1998 | Schuegraf et al. |
| 5,819,434 A | 10/1998 | Herchen et al. |
| 5,827,757 A | 10/1998 | Robinson, Jr. et al. |
| 5,836,483 A | 11/1998 | Disel |
| 5,837,320 A | 11/1998 | Hampden-Smith et al. |
| 5,852,879 A | 12/1998 | Schumaier |
| 5,853,484 A | 12/1998 | Jeong |
| 5,855,680 A | 1/1999 | Soininen et al. |
| 5,855,681 A | 1/1999 | Maydan et al. |
| 5,873,942 A | 2/1999 | Park |
| 5,877,095 A | 3/1999 | Tamura et al. |
| D409,894 S | 5/1999 | McClurg |
| 5,908,672 A | 6/1999 | Ryu |
| 5,916,365 A | 6/1999 | Sherman |
| 5,920,798 A | 7/1999 | Higuchi et al. |
| 5,968,275 A | 10/1999 | Lee et al. |
| 5,975,492 A | 11/1999 | Brenes |
| 5,979,506 A | 11/1999 | Aarseth |
| 5,997,588 A | 12/1999 | Goodwin |
| 5,997,768 A | 12/1999 | Scully |
| D419,652 S | 1/2000 | Hall et al. |
| 6,013,553 A | 1/2000 | Wallace |
| 6,015,465 A | 1/2000 | Kholodenko et al. |
| 6,017,779 A | 1/2000 | Miyasaka |
| 6,017,818 A * | 1/2000 | Lu .................... H01L 21/28556 |
| | | 257/751 |
| 6,024,799 A | 2/2000 | Chen |
| 6,035,101 A | 3/2000 | Sajoto et al. |
| 6,042,652 A | 3/2000 | Hyun |
| 6,044,860 A | 4/2000 | Neu |
| 6,050,506 A | 4/2000 | Guo et al. |
| 6,060,691 A | 5/2000 | Minami et al. |
| 6,074,443 A | 6/2000 | Venkatesh |
| 6,083,321 A | 7/2000 | Lei et al. |
| 6,086,677 A | 7/2000 | Umotoy et al. |
| 6,099,302 A | 8/2000 | Hong et al. |
| 6,122,036 A | 9/2000 | Yamasaki et al. |
| 6,124,600 A | 9/2000 | Moroishi et al. |

(56) References Cited

U.S. PATENT DOCUMENTS

| | | | |
|---|---|---|---|
| 6,125,789 A | 10/2000 | Gupta et al. |
| 6,129,044 A | 10/2000 | Zhao et al. |
| 6,134,807 A | 10/2000 | Komino |
| 6,137,240 A | 10/2000 | Bogdan et al. |
| 6,140,252 A | 10/2000 | Cho et al. |
| 6,148,761 A | 11/2000 | Majewski et al. |
| 6,160,244 A | 12/2000 | Ohashi |
| 6,161,500 A | 12/2000 | Kopacz et al. |
| 6,162,323 A | 12/2000 | Koshimizu et al. |
| 6,180,979 B1 | 1/2001 | Hofmann et al. |
| 6,187,691 B1 | 2/2001 | Fukuda |
| 6,190,634 B1 | 2/2001 | Lieber et al. |
| 6,194,037 B1 | 2/2001 | Terasaki et al. |
| 6,201,999 B1 | 3/2001 | Jevtic |
| 6,207,932 B1 | 3/2001 | Yoo |
| 6,212,789 B1 | 4/2001 | Kato |
| 6,218,288 B1 | 4/2001 | Li et al. |
| 6,250,250 B1 | 6/2001 | Maishev et al. |
| 6,271,148 B1 | 8/2001 | Kao |
| 6,274,878 B1 | 8/2001 | Li et al. |
| 6,281,098 B1 | 8/2001 | Wang |
| 6,287,965 B1 | 9/2001 | Kang et al. |
| D449,873 S | 10/2001 | Bronson |
| 6,296,909 B1 | 10/2001 | Spitsberg |
| 6,299,133 B2 | 10/2001 | Waragai et al. |
| 6,302,964 B1 | 10/2001 | Umotoy et al. |
| 6,303,523 B2 | 10/2001 | Cheung |
| 6,305,898 B1 | 10/2001 | Yamagishi et al. |
| 6,312,525 B1 | 11/2001 | Bright et al. |
| 6,315,512 B1 | 11/2001 | Tabrizi et al. |
| D451,893 S | 12/2001 | Robson |
| D452,220 S | 12/2001 | Robson |
| 6,325,858 B1 | 12/2001 | Wengert |
| 6,326,597 B1 | 12/2001 | Lubomirsky et al. |
| 6,329,297 B1 | 12/2001 | Balish |
| 6,342,427 B1 | 1/2002 | Choi et al. |
| 6,347,636 B1 | 2/2002 | Xia |
| 6,352,945 B1 | 3/2002 | Matsuki |
| 6,367,410 B1 | 4/2002 | Leahey et al. |
| 6,368,987 B1 | 4/2002 | Kopacz et al. |
| 6,370,796 B1 | 4/2002 | Zucker |
| 6,372,583 B1 | 4/2002 | Tyagi |
| 6,374,831 B1 | 4/2002 | Chandran |
| 6,375,312 B1 | 4/2002 | Ikeda et al. |
| D457,609 S | 5/2002 | Piano |
| 6,383,566 B1 | 5/2002 | Zagdoun |
| 6,383,955 B1 | 5/2002 | Matsuki |
| 6,387,207 B1 | 5/2002 | Janakiraman |
| 6,391,803 B1 | 5/2002 | Kim et al. |
| 6,398,184 B1 | 6/2002 | Sowada et al. |
| 6,410,459 B2 | 6/2002 | Blalock et al. |
| 6,413,321 B1 | 7/2002 | Kim et al. |
| 6,413,583 B1 | 7/2002 | Moghadam et al. |
| 6,420,279 B1 | 7/2002 | Ono et al. |
| D461,233 S | 8/2002 | Whalen |
| D461,882 S | 8/2002 | Piano |
| 6,435,798 B1 | 8/2002 | Satoh |
| 6,436,819 B1 | 8/2002 | Zhang |
| 6,437,444 B2 | 8/2002 | Andideh |
| 6,445,574 B1 | 9/2002 | Saw et al. |
| 6,446,573 B2 | 9/2002 | Hirayama et al. |
| 6,450,757 B1 | 9/2002 | Saeki |
| 6,454,860 B2 | 9/2002 | Metzner et al. |
| 6,455,445 B2 | 9/2002 | Matsuki |
| 6,461,435 B1 | 10/2002 | Littau et al. |
| 6,468,924 B2 | 10/2002 | Lee |
| 6,472,266 B1 | 10/2002 | Yu et al. |
| 6,475,276 B1 | 11/2002 | Elers et al. |
| 6,475,930 B1 | 11/2002 | Junker et al. |
| 6,478,872 B1 | 11/2002 | Chae et al. |
| 6,482,331 B2 | 11/2002 | Lu et al. |
| 6,482,663 B1 | 11/2002 | Backlund |
| 6,483,989 B1 | 11/2002 | Okada et al. |
| 6,494,065 B2 | 12/2002 | Babbitt |
| 6,499,533 B2 | 12/2002 | Yamada |
| 6,503,562 B1 | 1/2003 | Saito et al. |
| 6,503,826 B1 | 1/2003 | Oda |
| 6,511,539 B1 | 1/2003 | Raaijmakers |
| 6,521,295 B1 | 2/2003 | Remington |
| 6,521,547 B1 | 2/2003 | Chang et al. |
| 6,528,430 B2 | 3/2003 | Kwan |
| 6,528,767 B2 | 3/2003 | Bagley et al. |
| 6,531,193 B2 | 3/2003 | Fonash et al. |
| 6,531,412 B2 | 3/2003 | Conti et al. |
| 6,534,395 B2 | 3/2003 | Werkhoven et al. |
| 6,558,755 B2 | 5/2003 | Berry et al. |
| 6,569,239 B2 | 5/2003 | Arai et al. |
| 6,573,030 B1 | 6/2003 | Fairbairn et al. |
| 6,576,062 B2 | 6/2003 | Matsuse |
| 6,576,064 B2 | 6/2003 | Torres et al. |
| 6,576,300 B1 | 6/2003 | Berry et al. |
| 6,579,833 B1 | 6/2003 | McNallan et al. |
| 6,583,048 B1 | 6/2003 | Vincent et al. |
| 6,590,251 B2 | 7/2003 | Kang et al. |
| 6,594,550 B1 | 7/2003 | Okrah |
| 6,598,559 B1 | 7/2003 | Vellore et al. |
| 6,627,503 B2 | 9/2003 | Ma et al. |
| 6,632,478 B2 | 10/2003 | Gaillard et al. |
| 6,633,364 B2 | 10/2003 | Hayashi |
| 6,635,117 B1 | 10/2003 | Kinnard et al. |
| 6,638,839 B2 | 10/2003 | Deng et al. |
| 6,645,304 B2 | 11/2003 | Yamaguchi |
| 6,648,974 B1 | 11/2003 | Ogliari et al. |
| 6,649,921 B1 | 11/2003 | Cekic et al. |
| 6,652,924 B2 | 11/2003 | Sherman |
| 6,673,196 B1 | 1/2004 | Oyabu |
| 6,682,973 B1 | 1/2004 | Paton et al. |
| D486,891 S | 2/2004 | Cronce |
| 6,688,784 B1 | 2/2004 | Templeton |
| 6,689,220 B1 * | 2/2004 | Nguyen ............ C23C 16/45538 118/695 |
| 6,692,575 B1 | 2/2004 | Omstead et al. |
| 6,692,576 B2 | 2/2004 | Halpin et al. |
| 6,699,003 B2 | 3/2004 | Saeki |
| 6,709,989 B2 | 3/2004 | Ramdani et al. |
| 6,710,364 B2 | 3/2004 | Guldi et al. |
| 6,713,824 B1 | 3/2004 | Mikata |
| 6,716,571 B2 | 4/2004 | Gabriel |
| 6,723,642 B1 | 4/2004 | Lim et al. |
| 6,730,614 B1 | 5/2004 | Lim et al. |
| 6,734,090 B2 | 5/2004 | Agarwala et al. |
| 6,740,853 B1 | 5/2004 | Kitayama et al. |
| 6,743,475 B2 | 6/2004 | Skarp et al. |
| 6,743,738 B2 | 6/2004 | Todd et al. |
| 6,753,507 B2 | 6/2004 | Fure et al. |
| 6,756,318 B2 | 6/2004 | Nguyen et al. |
| 6,759,098 B2 | 7/2004 | Han |
| 6,760,981 B2 | 7/2004 | Leap |
| 6,784,108 B1 | 8/2004 | Donohoe et al. |
| D497,977 S | 11/2004 | Engelbrektsson |
| 6,815,350 B2 | 11/2004 | Kim et al. |
| 6,820,570 B2 | 11/2004 | Kilpela et al. |
| 6,821,910 B2 | 11/2004 | Adomaitis et al. |
| 6,824,665 B2 | 11/2004 | Shelnut et al. |
| 6,825,134 B2 | 11/2004 | Law et al. |
| 6,846,515 B2 | 1/2005 | Vrtis |
| 6,847,014 B1 | 1/2005 | Benjamin et al. |
| 6,858,524 B2 | 2/2005 | Haukka et al. |
| 6,858,547 B2 | 2/2005 | Metzner |
| 6,863,019 B2 | 3/2005 | Shamouilian |
| 6,864,041 B2 | 3/2005 | Brown |
| 6,872,258 B2 | 3/2005 | Park et al. |
| 6,872,259 B2 | 3/2005 | Strang |
| 6,874,247 B1 | 4/2005 | Hsu |
| 6,874,480 B1 | 4/2005 | Ismailov |
| 6,875,677 B1 | 4/2005 | Conley, Jr. et al. |
| 6,876,017 B2 | 4/2005 | Goodner |
| 6,884,066 B2 | 4/2005 | Nguyen et al. |
| 6,884,319 B2 | 4/2005 | Kim |
| 6,889,864 B2 | 5/2005 | Lindfors et al. |
| 6,895,158 B2 | 5/2005 | Aylward et al. |
| 6,899,507 B2 | 5/2005 | Yamagishi et al. |
| 6,909,839 B2 | 6/2005 | Wang et al. |
| 6,911,092 B2 | 6/2005 | Sneh |

(56) References Cited

U.S. PATENT DOCUMENTS

| | | |
|---|---|---|
| 6,913,796 B2 | 7/2005 | Albano et al. |
| 6,930,059 B2 | 8/2005 | Conley, Jr. et al. |
| 6,935,269 B2 | 8/2005 | Lee et al. |
| 6,939,817 B2 | 9/2005 | Sandhu et al. |
| 6,951,587 B1 | 10/2005 | Narushima |
| 6,953,609 B2 | 10/2005 | Carollo |
| 6,955,836 B2 | 10/2005 | Kumagai et al. |
| 6,972,478 B1 | 12/2005 | Waite et al. |
| 6,974,781 B2 | 12/2005 | Timmermans et al. |
| 6,976,822 B2 | 12/2005 | Woodruff |
| 6,984,595 B1 | 1/2006 | Yamazaki |
| 6,990,430 B2 | 1/2006 | Hosek |
| 7,021,881 B2 | 4/2006 | Yamagishi |
| 7,045,430 B2 | 5/2006 | Ahn et al. |
| 7,049,247 B2 | 5/2006 | Gates et al. |
| 7,053,009 B2 | 5/2006 | Conley, Jr. et al. |
| 7,055,875 B2 | 6/2006 | Bonora |
| 7,071,051 B1 | 7/2006 | Jeon et al. |
| 7,084,079 B2 | 8/2006 | Conti et al. |
| 7,088,003 B2 | 8/2006 | Gates et al. |
| 7,092,287 B2 | 8/2006 | Beulens et al. |
| 7,098,149 B2 | 8/2006 | Lukas |
| 7,109,098 B1 | 9/2006 | Ramaswamy et al. |
| 7,115,838 B2 | 10/2006 | Kurara et al. |
| 7,122,085 B2 | 10/2006 | Shero et al. |
| 7,122,222 B2 | 10/2006 | Xiao et al. |
| 7,129,165 B2 | 10/2006 | Basol et al. |
| 7,132,360 B2 | 11/2006 | Schaeffer et al. |
| 7,135,421 B2 | 11/2006 | Ahn et al. |
| 7,143,897 B1 | 12/2006 | Guzman et al. |
| 7,147,766 B2 | 12/2006 | Uzoh et al. |
| 7,153,542 B2 | 12/2006 | Nguyen et al. |
| 7,163,721 B2 | 1/2007 | Zhang et al. |
| 7,163,900 B2 | 1/2007 | Weber |
| 7,172,497 B2 | 2/2007 | Basol et al. |
| 7,192,824 B2 | 3/2007 | Ahn et al. |
| 7,192,892 B2 | 3/2007 | Ahn et al. |
| 7,195,693 B2 | 3/2007 | Cowans |
| 7,201,943 B2 | 4/2007 | Park et al. |
| 7,204,887 B2 | 4/2007 | Kawamura et al. |
| 7,205,246 B2 | 4/2007 | MacNeil et al. |
| 7,205,247 B2 | 4/2007 | Lee et al. |
| 7,207,763 B2 | 4/2007 | Lee |
| 7,208,389 B1 | 4/2007 | Tipton et al. |
| 7,211,524 B2 | 5/2007 | Ryu et al. |
| 7,234,476 B2 | 6/2007 | Arai |
| 7,235,137 B2 | 6/2007 | Kitayama et al. |
| 7,235,482 B2 | 6/2007 | Wu |
| 7,235,501 B2 | 6/2007 | Ahn et al. |
| 7,238,596 B2 | 7/2007 | Kouvetakis et al. |
| 7,265,061 B1 | 9/2007 | Cho et al. |
| D553,104 S | 10/2007 | Oohashi et al. |
| 7,290,813 B2 | 11/2007 | Bonora |
| 7,294,582 B2 | 11/2007 | Haverkort et al. |
| 7,297,641 B2 | 11/2007 | Todd et al. |
| 7,298,009 B2 | 11/2007 | Yan et al. |
| D557,226 S | 12/2007 | Uchino et al. |
| 7,307,178 B2 | 12/2007 | Kiyomori et al. |
| 7,312,148 B2 | 12/2007 | Ramaswamy et al. |
| 7,312,162 B2 | 12/2007 | Ramaswamy et al. |
| 7,312,494 B2 | 12/2007 | Ahn et al. |
| 7,323,401 B2 | 1/2008 | Ramaswamy et al. |
| 7,326,657 B2 | 2/2008 | Xia et al. |
| 7,327,948 B1 | 2/2008 | Shrinivasan |
| 7,329,947 B2 | 2/2008 | Adachi et al. |
| 7,335,611 B2 | 2/2008 | Ramaswamy et al. |
| 7,354,847 B2 | 4/2008 | Chan et al. |
| 7,357,138 B2 | 4/2008 | Ji et al. |
| 7,381,644 B1 | 6/2008 | Subramonium et al. |
| 7,393,418 B2 | 7/2008 | Yokogawa |
| 7,393,736 B2 | 7/2008 | Ahn et al. |
| 7,393,765 B2 | 7/2008 | Hanawa et al. |
| 7,396,491 B2 | 7/2008 | Marking et al. |
| 7,399,388 B2 | 7/2008 | Moghadam et al. |
| 7,402,534 B2 | 7/2008 | Mahajani |
| 7,405,166 B2 | 7/2008 | Liang et al. |
| 7,405,454 B2 | 7/2008 | Ahn et al. |
| D575,713 S | 8/2008 | Ratcliffe |
| 7,411,352 B2 | 8/2008 | Madocks |
| 7,414,281 B1 | 8/2008 | Fastow |
| 7,416,989 B1 | 8/2008 | Liu et al. |
| 7,422,653 B2 | 9/2008 | Blahnik et al. |
| 7,422,775 B2 | 9/2008 | Ramaswamy et al. |
| 7,429,532 B2 | 9/2008 | Ramaswamy et al. |
| 7,431,966 B2 | 10/2008 | Derderian et al. |
| 7,437,060 B2 | 10/2008 | Wang et al. |
| 7,442,275 B2 | 10/2008 | Cowans |
| 7,476,291 B2 | 1/2009 | Wang et al. |
| 7,479,198 B2 | 1/2009 | Guffrey |
| D585,968 S | 2/2009 | Elkins et al. |
| 7,489,389 B2 | 2/2009 | Shibazaki et al. |
| 7,494,882 B2 | 2/2009 | Vitale |
| 7,498,242 B2 | 3/2009 | Kumar et al. |
| 7,501,292 B2 | 3/2009 | Matsushita et al. |
| 7,503,980 B2 | 3/2009 | Kida et al. |
| D590,933 S | 4/2009 | Vansell |
| 7,514,375 B1 | 4/2009 | Shanker et al. |
| D593,969 S | 6/2009 | Li |
| 7,541,297 B2 | 6/2009 | Mallick et al. |
| 7,547,363 B2 | 6/2009 | Tomiyasu et al. |
| 7,550,396 B2 | 6/2009 | Frohberg et al. |
| 7,566,891 B2 | 7/2009 | Rocha-Alvarez et al. |
| 7,575,968 B2 | 8/2009 | Sadaka et al. |
| 7,579,785 B2 | 8/2009 | DeVincentis et al. |
| 7,582,555 B1 | 9/2009 | Lang |
| 7,589,003 B2 | 9/2009 | Kouvetakis et al. |
| 7,589,029 B2 | 9/2009 | Derderian et al. |
| D602,575 S | 10/2009 | Breda |
| 7,598,513 B2 | 10/2009 | Kouvetakis et al. |
| 7,601,223 B2 | 10/2009 | Lindfors et al. |
| 7,601,225 B2 | 10/2009 | Tuominen et al. |
| 7,611,751 B2 | 11/2009 | Elers |
| 7,611,980 B2 | 11/2009 | Wells et al. |
| 7,618,226 B2 | 11/2009 | Takizawa |
| D606,952 S | 12/2009 | Lee |
| 7,629,277 B2 | 12/2009 | Bhatnagar et al. |
| 7,632,549 B2 | 12/2009 | Goundar |
| 7,640,142 B2 | 12/2009 | Tachikawa et al. |
| 7,651,583 B2 | 1/2010 | Kent et al. |
| 7,651,961 B2 | 1/2010 | Clark |
| D609,652 S | 2/2010 | Nagasaka |
| D609,655 S | 2/2010 | Sugimoto |
| 7,678,197 B2 | 3/2010 | Maki |
| 7,678,715 B2 | 3/2010 | Mungekar et al. |
| 7,682,657 B2 | 3/2010 | Sherman |
| D613,829 S | 4/2010 | Griffin et al. |
| D614,153 S | 4/2010 | Fondurulia et al. |
| D614,267 S | 4/2010 | Breda |
| D614,268 S | 4/2010 | Breda |
| D614,593 S | 4/2010 | Lee |
| 7,690,881 B2 | 4/2010 | Yamagishi |
| 7,691,205 B2 | 4/2010 | Ikedo |
| 7,713,874 B2 | 5/2010 | Milligan |
| 7,720,560 B2 | 5/2010 | Menser et al. |
| 7,723,648 B2 | 5/2010 | Tsukamoto et al. |
| 7,727,864 B2 | 6/2010 | Elers |
| 7,732,343 B2 | 6/2010 | Niroomand et al. |
| 7,740,705 B2 | 6/2010 | Li |
| 7,745,346 B2 | 6/2010 | Hausmann et al. |
| 7,748,760 B2 | 7/2010 | Kushida |
| 7,754,621 B2 | 7/2010 | Putjkonen |
| 7,763,869 B2 | 7/2010 | Matsushita et al. |
| 7,767,262 B2 | 8/2010 | Clark |
| 7,771,796 B2 | 8/2010 | Kohno et al. |
| 7,780,440 B2 | 8/2010 | Shibagaki et al. |
| 7,789,965 B2 | 9/2010 | Matsushita et al. |
| 7,790,633 B1 | 9/2010 | Tarafdar et al. |
| 7,803,722 B2 | 9/2010 | Liang |
| 7,807,578 B2 | 10/2010 | Bencher et al. |
| 7,816,278 B2 | 10/2010 | Reed et al. |
| 7,824,492 B2 | 11/2010 | Tois et al. |
| 7,825,040 B1 | 11/2010 | Fukazawa et al. |
| 7,833,353 B2 | 11/2010 | Furukawahara et al. |
| 7,838,084 B2 | 11/2010 | Derderian et al. |

(56) References Cited

U.S. PATENT DOCUMENTS

| | | |
|---|---|---|
| 7,842,518 B2 | 11/2010 | Miyajima |
| 7,842,622 B1 | 11/2010 | Lee et al. |
| D629,874 S | 12/2010 | Hermans |
| 7,851,019 B2 | 12/2010 | Tuominen et al. |
| 7,851,232 B2 | 12/2010 | van Schravendijk et al. |
| 7,865,070 B2 | 1/2011 | Nakamura |
| 7,884,918 B2 | 2/2011 | Hattori |
| 7,888,233 B1 | 2/2011 | Gauri |
| D634,719 S | 3/2011 | Yasuda et al. |
| 7,897,215 B1 | 3/2011 | Fair et al. |
| 7,902,582 B2 | 3/2011 | Forbes et al. |
| 7,910,288 B2 | 3/2011 | Abatchev et al. |
| 7,915,139 B1 | 3/2011 | Lang |
| 7,919,416 B2 | 4/2011 | Lee et al. |
| 7,925,378 B2 | 4/2011 | Gilchrist et al. |
| 7,935,940 B1 | 5/2011 | Smargiassi |
| 7,939,447 B2 | 5/2011 | Bauer et al. |
| 7,955,516 B2 | 6/2011 | Chandrachood et al. |
| 7,963,736 B2 | 6/2011 | Takizawa et al. |
| 7,972,980 B2 | 7/2011 | Lee et al. |
| 7,981,751 B2 | 7/2011 | Zhu et al. |
| D643,055 S | 8/2011 | Takahashi |
| 7,992,318 B2 | 8/2011 | Kawaji |
| 7,994,721 B2 | 8/2011 | Espiau et al. |
| 7,998,875 B2 | 8/2011 | DeYoung |
| 8,003,174 B2 | 8/2011 | Fukazawa |
| 8,004,198 B2 | 8/2011 | Bakre et al. |
| 8,020,315 B2 | 9/2011 | Nishimura |
| 8,030,129 B2 | 10/2011 | Jeong |
| 8,038,835 B2 | 10/2011 | Hayashi et al. |
| 8,041,197 B2 | 10/2011 | Kasai et al. |
| 8,041,450 B2 | 10/2011 | Takizawa et al. |
| 8,043,972 B1 | 10/2011 | Liu et al. |
| 8,055,378 B2 | 11/2011 | Numakura |
| 8,060,252 B2 | 11/2011 | Gage et al. |
| 8,071,451 B2 | 12/2011 | Uzoh |
| 8,071,452 B2 | 12/2011 | Raisanen |
| 8,072,578 B2 | 12/2011 | Yasuda et al. |
| 8,076,230 B2 | 12/2011 | Wei |
| 8,076,237 B2 | 12/2011 | Uzoh |
| 8,082,946 B2 | 12/2011 | Laverdiere et al. |
| D652,896 S | 1/2012 | Gether |
| 8,092,604 B2 | 1/2012 | Tomiyasu et al. |
| D653,734 S | 2/2012 | Sisk |
| D654,884 S | 2/2012 | Honma |
| D655,055 S | 2/2012 | Toll |
| 8,119,466 B2 | 2/2012 | Avouris |
| 8,137,462 B2 | 3/2012 | Fondurulia et al. |
| 8,137,465 B1 | 3/2012 | Shrinivasan et al. |
| 8,138,676 B2 | 3/2012 | Mills |
| 8,142,862 B2 | 3/2012 | Lee et al. |
| 8,143,174 B2 | 3/2012 | Xia et al. |
| 8,147,242 B2 | 4/2012 | Shibagaki et al. |
| 8,173,554 B2 | 5/2012 | Lee et al. |
| 8,187,951 B1 | 5/2012 | Wang |
| 8,192,901 B2 | 6/2012 | Kageyama |
| 8,196,234 B2 | 6/2012 | Glunk |
| 8,197,915 B2 | 6/2012 | Oka et al. |
| 8,216,380 B2 | 7/2012 | White et al. |
| 8,231,799 B2 | 7/2012 | Bera et al. |
| D665,055 S | 8/2012 | Yanagisawa et al. |
| 8,241,991 B2 | 8/2012 | Hsieh et al. |
| 8,242,031 B2 | 8/2012 | Mallick et al. |
| 8,252,114 B2 | 8/2012 | Vukovic |
| 8,252,659 B2 | 8/2012 | Huyghabaert et al. |
| 8,252,691 B2 | 8/2012 | Beynet et al. |
| 8,272,516 B2 | 9/2012 | Salvador |
| 8,278,176 B2 | 10/2012 | Bauer et al. |
| 8,282,769 B2 | 10/2012 | Iizuka |
| 8,287,648 B2 | 10/2012 | Reed et al. |
| 8,293,016 B2 | 10/2012 | Bahng et al. |
| 8,298,951 B1 | 10/2012 | Nakano |
| 8,307,472 B1 | 11/2012 | Saxon et al. |
| 8,309,173 B2 | 11/2012 | Tuominen et al. |
| 8,323,413 B2 | 12/2012 | Son |
| 8,329,599 B2 | 12/2012 | Fukazawa et al. |
| 8,334,219 B2 | 12/2012 | Lee et al. |
| D676,943 S | 2/2013 | Kluss |
| 8,367,528 B2 | 2/2013 | Bauer et al. |
| 8,372,204 B2 | 2/2013 | Nakamura |
| 8,393,091 B2 | 3/2013 | Kawamoto |
| 8,394,466 B2 | 3/2013 | Hong et al. |
| 8,415,259 B2 | 4/2013 | Lee et al. |
| 8,440,259 B2 | 5/2013 | Chiang et al. |
| 8,444,120 B2 | 5/2013 | Gregg et al. |
| 8,445,075 B2 | 5/2013 | Xu et al. |
| 8,465,811 B2 | 6/2013 | Ueda |
| 8,466,411 B2 | 6/2013 | Arai |
| 8,470,187 B2 | 6/2013 | Ha |
| 8,484,846 B2 | 7/2013 | Dhindsa |
| 8,492,170 B2 | 7/2013 | Xie et al. |
| 8,496,756 B2 | 7/2013 | Cruse et al. |
| 8,506,713 B2 | 8/2013 | Takagi |
| 8,535,767 B1 | 9/2013 | Kimura |
| D691,974 S | 10/2013 | Osada et al. |
| 8,551,892 B2 | 10/2013 | Nakano |
| 8,563,443 B2 | 10/2013 | Fukazawa |
| 8,569,184 B2 | 10/2013 | Oka |
| 8,591,659 B1 | 11/2013 | Fang et al. |
| 8,592,005 B2 | 11/2013 | Ueda |
| 8,608,885 B2 | 12/2013 | Goto et al. |
| 8,617,411 B2 | 12/2013 | Singh |
| 8,633,115 B2 | 1/2014 | Chang et al. |
| 8,647,722 B2 | 2/2014 | Kobayashi et al. |
| 8,664,627 B1 | 3/2014 | Ishikawa et al. |
| 8,667,654 B2 | 3/2014 | Gros-Jean |
| 8,668,957 B2 | 3/2014 | Dussarrat et al. |
| 8,669,185 B2 | 3/2014 | Onizawa |
| 8,683,943 B2 | 4/2014 | Onodera et al. |
| 8,711,338 B2 | 4/2014 | Liu et al. |
| D705,745 S | 5/2014 | Kurs et al. |
| 8,720,965 B2 | 5/2014 | Hino et al. |
| 8,722,546 B2 | 5/2014 | Fukazawa et al. |
| 8,726,837 B2 | 5/2014 | Patalay et al. |
| 8,728,832 B2 | 5/2014 | Raisanen et al. |
| 8,742,668 B2 | 6/2014 | Nakano et al. |
| 8,764,085 B2 | 7/2014 | Urabe |
| 8,784,950 B2 | 7/2014 | Fukazawa et al. |
| 8,784,951 B2 | 7/2014 | Fukazawa et al. |
| 8,785,215 B2 | 7/2014 | Kobayashi et al. |
| 8,790,743 B1 | 7/2014 | Omori et al. |
| 8,802,201 B2 | 8/2014 | Raisanen et al. |
| 8,820,809 B2 | 9/2014 | Ando et al. |
| 8,821,640 B2 | 9/2014 | Cleary et al. |
| 8,841,182 B1 | 9/2014 | Chen et al. |
| 8,845,806 B2 | 9/2014 | Aida et al. |
| D715,410 S | 10/2014 | Lohmann |
| 8,864,202 B1 | 10/2014 | Schrameyer |
| D716,742 S | 11/2014 | Jang et al. |
| 8,877,655 B2 | 11/2014 | Shero et al. |
| 8,883,270 B2 | 11/2014 | Shero et al. |
| 8,901,016 B2 | 12/2014 | Ha et al. |
| 8,911,826 B2 | 12/2014 | Adachi et al. |
| 8,912,101 B2 | 12/2014 | Tsuji et al. |
| D720,838 S | 1/2015 | Yamagishi et al. |
| 8,933,375 B2 | 1/2015 | Dunn et al. |
| 8,940,646 B1 | 1/2015 | Chandrasekharan |
| D723,153 S | 2/2015 | Borkholder |
| 8,946,830 B2 | 2/2015 | Jung et al. |
| 8,956,983 B2 | 2/2015 | Swaminathan |
| D724,553 S | 3/2015 | Choi |
| D724,701 S | 3/2015 | Yamagishi et al. |
| D725,168 S | 3/2015 | Yamagishi |
| 8,967,608 B2 | 3/2015 | Mitsumori et al. |
| 8,986,456 B2 | 3/2015 | Fondurulia et al. |
| 8,991,887 B2 | 3/2015 | Shin et al. |
| 8,993,054 B2 | 3/2015 | Jung et al. |
| D726,365 S | 4/2015 | Weigensberg |
| D726,884 S | 4/2015 | Yamagishi et al. |
| 9,005,539 B2 | 4/2015 | Halpin et al. |
| 9,017,481 B1 | 4/2015 | Pettinger et al. |
| 9,018,093 B2 | 4/2015 | Tsuji et al. |
| 9,018,111 B2 | 4/2015 | Milligan et al. |
| 9,021,985 B2 | 5/2015 | Alokozai et al. |

(56) References Cited

U.S. PATENT DOCUMENTS

| | | |
|---|---|---|
| 9,023,737 B2 | 5/2015 | Beynet et al. |
| 9,029,253 B2 | 5/2015 | Milligan et al. |
| 9,029,272 B1 | 5/2015 | Nakano |
| D732,145 S | 6/2015 | Yamagishi |
| D732,644 S | 6/2015 | Yamagishi et al. |
| D733,261 S | 6/2015 | Yamagishi et al. |
| D733,843 S | 7/2015 | Yamagishi et al. |
| D734,377 S | 7/2015 | Hirakida |
| D735,836 S | 8/2015 | Yamagishi |
| 9,096,931 B2 | 8/2015 | Yednak et al. |
| 9,117,657 B2 | 8/2015 | Nakano et al. |
| 9,117,866 B2 | 8/2015 | Marquardt et al. |
| D739,222 S | 9/2015 | Chadbourne |
| 9,123,510 B2 | 9/2015 | Nakano et al. |
| 9,136,108 B2 | 9/2015 | Matsushita et al. |
| 9,142,393 B2 | 9/2015 | Okabe et al. |
| 9,169,975 B2 | 10/2015 | Sarin et al. |
| 9,171,714 B2 | 10/2015 | Mori |
| 9,171,716 B2 | 10/2015 | Fukuda |
| D743,513 S | 11/2015 | Yamagishi |
| 9,177,784 B2 | 11/2015 | Raisanen et al. |
| 9,190,263 B2 | 11/2015 | Ishikawa et al. |
| 9,196,483 B1 | 11/2015 | Lee et al. |
| 9,202,727 B2 | 12/2015 | Dunn et al. |
| 9,228,259 B2 | 1/2016 | Haukka et al. |
| 9,240,412 B2 | 1/2016 | Xie et al. |
| 2001/0017103 A1 | 8/2001 | Takeshita et al. |
| 2001/0018267 A1 | 8/2001 | Shinriki et al. |
| 2001/0019777 A1 | 9/2001 | Tanaka et al. |
| 2001/0019900 A1 | 9/2001 | Hasegawa |
| 2001/0028924 A1 | 10/2001 | Sherman |
| 2001/0046765 A1 | 11/2001 | Cappellani et al. |
| 2001/0049202 A1 | 12/2001 | Maeda et al. |
| 2002/0001974 A1 | 1/2002 | Chan |
| 2002/0001976 A1* | 1/2002 | Danek .................. C23C 16/34 438/798 |
| 2002/0011210 A1 | 1/2002 | Satoh et al. |
| 2002/0014204 A1 | 2/2002 | Pyo |
| 2002/0064592 A1 | 5/2002 | Datta et al. |
| 2002/0064598 A1* | 5/2002 | Wang .................. C23C 16/34 427/255.391 |
| 2002/0076507 A1 | 6/2002 | Chiang et al. |
| 2002/0079714 A1 | 6/2002 | Soucy et al. |
| 2002/0088542 A1 | 7/2002 | Nishikawa et al. |
| 2002/0098627 A1 | 7/2002 | Pomarede et al. |
| 2002/0108670 A1 | 8/2002 | Baker et al. |
| 2002/0110991 A1 | 8/2002 | Li |
| 2002/0114886 A1 | 8/2002 | Chou et al. |
| 2002/0115252 A1 | 8/2002 | Haukka et al. |
| 2002/0155219 A1* | 10/2002 | Wang .................. C23C 16/34 427/255.391 |
| 2002/0172768 A1 | 11/2002 | Endo et al. |
| 2002/0187650 A1 | 12/2002 | Blalock et al. |
| 2002/0197849 A1 | 12/2002 | Mandal |
| 2003/0003635 A1 | 1/2003 | Paranjpe et al. |
| 2003/0010452 A1 | 1/2003 | Park et al. |
| 2003/0012632 A1 | 1/2003 | Saeki |
| 2003/0019428 A1 | 1/2003 | Ku et al. |
| 2003/0019580 A1 | 1/2003 | Strang |
| 2003/0025146 A1 | 2/2003 | Narwankar et al. |
| 2003/0040158 A1 | 2/2003 | Saitoh |
| 2003/0042419 A1 | 3/2003 | Katsumata et al. |
| 2003/0049375 A1 | 3/2003 | Nguyen et al. |
| 2003/0054670 A1 | 3/2003 | Wang et al. |
| 2003/0059535 A1 | 3/2003 | Luo et al. |
| 2003/0059980 A1 | 3/2003 | Chen et al. |
| 2003/0066826 A1 | 4/2003 | Lee et al. |
| 2003/0075925 A1 | 4/2003 | Lindfors et al. |
| 2003/0082307 A1 | 5/2003 | Chung et al. |
| 2003/0091938 A1 | 5/2003 | Fairbairn et al. |
| 2003/0094133 A1 | 5/2003 | Yoshidome et al. |
| 2003/0111963 A1 | 6/2003 | Tolmachev et al. |
| 2003/0134038 A1 | 7/2003 | Paranjpe |
| 2003/0141820 A1 | 7/2003 | White et al. |
| 2003/0143328 A1* | 7/2003 | Chen .................. C23C 16/06 427/255.28 |
| 2003/0157436 A1 | 8/2003 | Manger et al. |
| 2003/0168001 A1 | 9/2003 | Sneh |
| 2003/0170583 A1 | 9/2003 | Nakashima |
| 2003/0180458 A1 | 9/2003 | Sneh |
| 2003/0183156 A1 | 10/2003 | Dando |
| 2003/0192875 A1 | 10/2003 | Bieker et al. |
| 2003/0198587 A1 | 10/2003 | Kaloyeros |
| 2003/0209323 A1 | 11/2003 | Yokogaki |
| 2003/0217915 A1* | 11/2003 | Ouellet ............. B22F 1/0051 204/192.15 |
| 2003/0228772 A1 | 12/2003 | Cowans |
| 2003/0232138 A1 | 12/2003 | Tuominen et al. |
| 2004/0009307 A1* | 1/2004 | Koh .................. C23C 16/34 427/569 |
| 2004/0009679 A1 | 1/2004 | Yeo et al. |
| 2004/0013577 A1 | 1/2004 | Ganguli et al. |
| 2004/0013818 A1 | 1/2004 | Moon et al. |
| 2004/0016637 A1 | 1/2004 | Yang |
| 2004/0018307 A1 | 1/2004 | Park et al. |
| 2004/0018750 A1 | 1/2004 | Sophie et al. |
| 2004/0023516 A1 | 2/2004 | Londergan et al. |
| 2004/0029052 A1 | 2/2004 | Park et al. |
| 2004/0036129 A1 | 2/2004 | Forbes et al. |
| 2004/0063289 A1 | 4/2004 | Ohta |
| 2004/0071897 A1 | 4/2004 | Verplancken et al. |
| 2004/0077182 A1 | 4/2004 | Lim et al. |
| 2004/0079960 A1 | 4/2004 | Shakuda |
| 2004/0080697 A1 | 4/2004 | Song |
| 2004/0082171 A1 | 4/2004 | Shin et al. |
| 2004/0101622 A1 | 5/2004 | Park et al. |
| 2004/0103914 A1 | 6/2004 | Cheng et al. |
| 2004/0106249 A1 | 6/2004 | Huotari |
| 2004/0124549 A1 | 7/2004 | Curran |
| 2004/0134429 A1 | 7/2004 | Yamanaka |
| 2004/0144980 A1 | 7/2004 | Ahn et al. |
| 2004/0146644 A1 | 7/2004 | Xia et al. |
| 2004/0168627 A1 | 9/2004 | Conley et al. |
| 2004/0169032 A1 | 9/2004 | Murayama et al. |
| 2004/0198069 A1 | 10/2004 | Metzner et al. |
| 2004/0200499 A1 | 10/2004 | Harvey et al. |
| 2004/0209477 A1 | 10/2004 | Buxbaum et al. |
| 2004/0212947 A1 | 10/2004 | Nguyen |
| 2004/0214445 A1 | 10/2004 | Shimizu et al. |
| 2004/0219793 A1 | 11/2004 | Hishiya et al. |
| 2004/0221807 A1 | 11/2004 | Verghese et al. |
| 2004/0247779 A1 | 12/2004 | Selvamanickam et al. |
| 2004/0261712 A1 | 12/2004 | Hayashi et al. |
| 2004/0266011 A1 | 12/2004 | Lee et al. |
| 2005/0003662 A1 | 1/2005 | Jursich et al. |
| 2005/0008799 A1 | 1/2005 | Tomiyasu et al. |
| 2005/0019026 A1 | 1/2005 | Wang et al. |
| 2005/0020071 A1 | 1/2005 | Sonobe et al. |
| 2005/0023624 A1 | 2/2005 | Ahn et al. |
| 2005/0034674 A1 | 2/2005 | Ono |
| 2005/0037154 A1 | 2/2005 | Koh et al. |
| 2005/0051093 A1 | 3/2005 | Makino et al. |
| 2005/0054228 A1 | 3/2005 | March |
| 2005/0059262 A1 | 3/2005 | Yin et al. |
| 2005/0064207 A1 | 3/2005 | Senzaki et al. |
| 2005/0064719 A1 | 3/2005 | Liu |
| 2005/0066893 A1 | 3/2005 | Soininen |
| 2005/0069651 A1 | 3/2005 | Miyoshi |
| 2005/0070123 A1 | 3/2005 | Hirano |
| 2005/0070729 A1 | 3/2005 | Kiyomori et al. |
| 2005/0072357 A1 | 4/2005 | Shero et al. |
| 2005/0074983 A1 | 4/2005 | Shinriki et al. |
| 2005/0092249 A1 | 5/2005 | Kilpela et al. |
| 2005/0095770 A1 | 5/2005 | Kumagai et al. |
| 2005/0100669 A1 | 5/2005 | Kools et al. |
| 2005/0101154 A1 | 5/2005 | Huang |
| 2005/0106893 A1 | 5/2005 | Wilk |
| 2005/0110069 A1 | 5/2005 | Kil et al. |
| 2005/0120962 A1 | 6/2005 | Ushioda et al. |
| 2005/0123690 A1 | 6/2005 | Derderian et al. |
| 2005/0133161 A1 | 6/2005 | Carpenter et al. |
| 2005/0142361 A1 | 6/2005 | Nakanishi |
| 2005/0145338 A1 | 7/2005 | Park et al. |

(56) References Cited

U.S. PATENT DOCUMENTS

| | | |
|---|---|---|
| 2005/0153571 A1 | 7/2005 | Senzaki |
| 2005/0173003 A1 | 8/2005 | Laverdiere et al. |
| 2005/0181535 A1 | 8/2005 | Yun et al. |
| 2005/0187647 A1 | 8/2005 | Wang et al. |
| 2005/0191828 A1 | 9/2005 | Al-Bayati et al. |
| 2005/0199013 A1 | 9/2005 | Vandroux et al. |
| 2005/0208718 A1 | 9/2005 | Lim et al. |
| 2005/0212119 A1 | 9/2005 | Shero |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0221618 A1 | 10/2005 | AmRhein et al. |
| 2005/0223994 A1 | 10/2005 | Blomiley et al. |
| 2005/0227502 A1 | 10/2005 | Schmitt et al. |
| 2005/0229848 A1 | 10/2005 | Shinriki |
| 2005/0229972 A1 | 10/2005 | Hoshi et al. |
| 2005/0241176 A1 | 11/2005 | Shero et al. |
| 2005/0241763 A1 | 11/2005 | Huang et al. |
| 2005/0255257 A1 | 11/2005 | Choi et al. |
| 2005/0258280 A1 | 11/2005 | Goto et al. |
| 2005/0260347 A1 | 11/2005 | Narwankar et al. |
| 2005/0260850 A1 | 11/2005 | Loke |
| 2005/0263075 A1 | 12/2005 | Wang et al. |
| 2005/0263932 A1 | 12/2005 | Heugel |
| 2005/0271813 A1 | 12/2005 | Kher et al. |
| 2005/0274323 A1 | 12/2005 | Seidel et al. |
| 2005/0282101 A1 | 12/2005 | Adachi |
| 2005/0287725 A1 | 12/2005 | Kitagawa |
| 2005/0287771 A1 | 12/2005 | Seamons et al. |
| 2006/0013946 A1 | 1/2006 | Park et al. |
| 2006/0014384 A1 | 1/2006 | Lee et al. |
| 2006/0014397 A1 | 1/2006 | Seamons et al. |
| 2006/0016783 A1 | 1/2006 | Wu et al. |
| 2006/0019033 A1 | 1/2006 | Muthukrishnan et al. |
| 2006/0019502 A1 | 1/2006 | Park et al. |
| 2006/0021703 A1 | 2/2006 | Umotoy et al. |
| 2006/0024439 A2 | 2/2006 | Tuominen et al. |
| 2006/0032443 A1* | 2/2006 | Hasebe .............. C23C 16/30 118/715 |
| 2006/0046518 A1 | 3/2006 | Hill et al. |
| 2006/0051520 A1 | 3/2006 | Behle et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0063346 A1 | 3/2006 | Lee et al. |
| 2006/0068121 A1 | 3/2006 | Lee et al. |
| 2006/0068125 A1 | 3/2006 | Radhakrishnan |
| 2006/0105566 A1 | 5/2006 | Waldfried et al. |
| 2006/0110934 A1 | 5/2006 | Fukuchi |
| 2006/0113675 A1 | 6/2006 | Chang et al. |
| 2006/0113806 A1 | 6/2006 | Tsuji et al. |
| 2006/0128168 A1 | 6/2006 | Ahn et al. |
| 2006/0130767 A1 | 6/2006 | Herchen |
| 2006/0137609 A1 | 6/2006 | Puchacz et al. |
| 2006/0147626 A1 | 7/2006 | Blomberg |
| 2006/0148180 A1 | 7/2006 | Ahn et al. |
| 2006/0163612 A1 | 7/2006 | Kouvetakis et al. |
| 2006/0172531 A1 | 8/2006 | Lin et al. |
| 2006/0191555 A1 | 8/2006 | Yoshida et al. |
| 2006/0193979 A1 | 8/2006 | Meiere et al. |
| 2006/0199357 A1 | 9/2006 | Wan et al. |
| 2006/0205223 A1 | 9/2006 | Smayling |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0226117 A1 | 10/2006 | Bertram et al. |
| 2006/0228888 A1 | 10/2006 | Lee et al. |
| 2006/0236934 A1 | 10/2006 | Choi et al. |
| 2006/0240574 A1 | 10/2006 | Yoshie |
| 2006/0240662 A1 | 10/2006 | Conley et al. |
| 2006/0251827 A1 | 11/2006 | Nowak |
| 2006/0257563 A1 | 11/2006 | Doh et al. |
| 2006/0257584 A1 | 11/2006 | Derderian et al. |
| 2006/0258078 A1 | 11/2006 | Lee et al. |
| 2006/0258173 A1 | 11/2006 | Xiao et al. |
| 2006/0260545 A1 | 11/2006 | Ramaswamy et al. |
| 2006/0264060 A1 | 11/2006 | Ramaswamy et al. |
| 2006/0264066 A1 | 11/2006 | Bartholomew |
| 2006/0266289 A1 | 11/2006 | Verghese et al. |
| 2006/0269692 A1 | 11/2006 | Balseanu |
| 2006/0278524 A1 | 12/2006 | Stowell |
| 2007/0006806 A1 | 1/2007 | Imai |
| 2007/0010072 A1 | 1/2007 | Bailey et al. |
| 2007/0020953 A1 | 1/2007 | Tsai et al. |
| 2007/0022954 A1 | 2/2007 | Iizuka et al. |
| 2007/0028842 A1 | 2/2007 | Inagawa et al. |
| 2007/0031598 A1 | 2/2007 | Okuyama et al. |
| 2007/0031599 A1 | 2/2007 | Gschwandtner et al. |
| 2007/0032082 A1 | 2/2007 | Ramaswamy et al. |
| 2007/0037412 A1 | 2/2007 | Dip et al. |
| 2007/0042117 A1 | 2/2007 | Kupurao et al. |
| 2007/0049053 A1 | 3/2007 | Mahajani |
| 2007/0054499 A1 | 3/2007 | Jang |
| 2007/0059948 A1 | 3/2007 | Metzner et al. |
| 2007/0062453 A1 | 3/2007 | Ishikawa |
| 2007/0065578 A1 | 3/2007 | McDougall |
| 2007/0066010 A1 | 3/2007 | Ando |
| 2007/0066079 A1 | 3/2007 | Kolster et al. |
| 2007/0077355 A1 | 4/2007 | Chacin et al. |
| 2007/0082132 A1 | 4/2007 | Shinriki |
| 2007/0084405 A1 | 4/2007 | Kim |
| 2007/0096194 A1 | 5/2007 | Streck et al. |
| 2007/0098527 A1 | 5/2007 | Hall et al. |
| 2007/0107845 A1 | 5/2007 | Ishizawa et al. |
| 2007/0111545 A1 | 5/2007 | Lee et al. |
| 2007/0116873 A1 | 5/2007 | Li et al. |
| 2007/0123037 A1 | 5/2007 | Lee et al. |
| 2007/0125762 A1 | 6/2007 | Cui et al. |
| 2007/0128538 A1 | 6/2007 | Fairbairn et al. |
| 2007/0134942 A1 | 6/2007 | Ahn et al. |
| 2007/0146621 A1 | 6/2007 | Yeom |
| 2007/0148990 A1 | 6/2007 | Deboer et al. |
| 2007/0155138 A1 | 7/2007 | Tomasini et al. |
| 2007/0158026 A1 | 7/2007 | Amikura |
| 2007/0163440 A1 | 7/2007 | Kim et al. |
| 2007/0166457 A1 | 7/2007 | Yamoto et al. |
| 2007/0166966 A1 | 7/2007 | Todd et al. |
| 2007/0166999 A1 | 7/2007 | Vaartstra |
| 2007/0173071 A1 | 7/2007 | Afzali-Ardakani et al. |
| 2007/0175393 A1 | 8/2007 | Nishimura et al. |
| 2007/0175397 A1 | 8/2007 | Tomiyasu et al. |
| 2007/0186952 A1 | 8/2007 | Honda et al. |
| 2007/0207275 A1 | 9/2007 | Nowak et al. |
| 2007/0209590 A1 | 9/2007 | Li |
| 2007/0210890 A1 | 9/2007 | Hsu et al. |
| 2007/0215048 A1 | 9/2007 | Suzuki et al. |
| 2007/0218200 A1 | 9/2007 | Suzuki et al. |
| 2007/0218705 A1 | 9/2007 | Matsuki et al. |
| 2007/0224777 A1 | 9/2007 | Hamelin |
| 2007/0224833 A1 | 9/2007 | Morisada et al. |
| 2007/0232031 A1 | 10/2007 | Singh et al. |
| 2007/0232071 A1 | 10/2007 | Balseanu et al. |
| 2007/0232501 A1 | 10/2007 | Tonomura |
| 2007/0234955 A1 | 10/2007 | Suzuki et al. |
| 2007/0237697 A1 | 10/2007 | Clark |
| 2007/0241688 A1 | 10/2007 | DeVincentis et al. |
| 2007/0248767 A1 | 10/2007 | Okura |
| 2007/0249131 A1 | 10/2007 | Allen et al. |
| 2007/0251444 A1 | 11/2007 | Gros-Jean et al. |
| 2007/0252244 A1 | 11/2007 | Srividya et al. |
| 2007/0252532 A1 | 11/2007 | DeVincentis et al. |
| 2007/0264807 A1 | 11/2007 | Leone et al. |
| 2007/0275166 A1 | 11/2007 | Thridandam et al. |
| 2007/0277735 A1 | 12/2007 | Mokhlesi et al. |
| 2007/0281496 A1 | 12/2007 | Ingle et al. |
| 2007/0298362 A1 | 12/2007 | Rocha-Alvarez et al. |
| 2008/0003824 A1 | 1/2008 | Padhi et al. |
| 2008/0003838 A1 | 1/2008 | Haukka et al. |
| 2008/0006208 A1 | 1/2008 | Ueno et al. |
| 2008/0023436 A1 | 1/2008 | Gros-Jean et al. |
| 2008/0026574 A1 | 1/2008 | Brcka |
| 2008/0026597 A1 | 1/2008 | Munro et al. |
| 2008/0029790 A1 | 2/2008 | Ahn et al. |
| 2008/0036354 A1 | 2/2008 | Letz et al. |

(56) References Cited

U.S. PATENT DOCUMENTS

| | | |
|---|---|---|
| 2008/0038485 A1 | 2/2008 | Fukazawa et al. |
| 2008/0054332 A1 | 3/2008 | Kim et al. |
| 2008/0054813 A1 | 3/2008 | Espiau et al. |
| 2008/0057659 A1 | 3/2008 | Forbes et al. |
| 2008/0061667 A1 | 3/2008 | Gaertner et al. |
| 2008/0066778 A1 | 3/2008 | Matsushita et al. |
| 2008/0069955 A1 | 3/2008 | Hong et al. |
| 2008/0075881 A1 | 3/2008 | Won et al. |
| 2008/0076266 A1 | 3/2008 | Fukazawa et al. |
| 2008/0081104 A1 | 4/2008 | Hasebe et al. |
| 2008/0081113 A1 | 4/2008 | Clark |
| 2008/0081121 A1 | 4/2008 | Morita et al. |
| 2008/0085226 A1 | 4/2008 | Fondurulia et al. |
| 2008/0092815 A1 | 4/2008 | Chen et al. |
| 2008/0113094 A1 | 5/2008 | Casper |
| 2008/0113096 A1 | 5/2008 | Mahajani |
| 2008/0113097 A1 | 5/2008 | Mahajani et al. |
| 2008/0124197 A1 | 5/2008 | van der Meulen et al. |
| 2008/0124908 A1 | 5/2008 | Forbes et al. |
| 2008/0124946 A1 | 5/2008 | Xiao et al. |
| 2008/0133154 A1 | 6/2008 | Krauss et al. |
| 2008/0149031 A1 | 6/2008 | Chu et al. |
| 2008/0152463 A1 | 6/2008 | Chidambaram et al. |
| 2008/0153311 A1 | 6/2008 | Padhi et al. |
| 2008/0173240 A1 | 7/2008 | Furukawahara |
| 2008/0173326 A1 | 7/2008 | Gu et al. |
| 2008/0176375 A1 | 7/2008 | Erben et al. |
| 2008/0178805 A1 | 7/2008 | Paterson et al. |
| 2008/0179715 A1 | 7/2008 | Coppa |
| 2008/0182075 A1 | 7/2008 | Chopra |
| 2008/0182390 A1 | 7/2008 | Lemmi et al. |
| 2008/0191193 A1 | 8/2008 | Li et al. |
| 2008/0199977 A1 | 8/2008 | Weigel et al. |
| 2008/0203487 A1 | 8/2008 | Hohage et al. |
| 2008/0211423 A1 | 9/2008 | Shinmen et al. |
| 2008/0211526 A1 | 9/2008 | Shinma |
| 2008/0216077 A1 | 9/2008 | Emani et al. |
| 2008/0220619 A1 | 9/2008 | Matsushita et al. |
| 2008/0224240 A1 | 9/2008 | Ahn et al. |
| 2008/0233288 A1 | 9/2008 | Clark |
| 2008/0237572 A1 | 10/2008 | Chui et al. |
| 2008/0241384 A1 | 10/2008 | Jeong |
| 2008/0242116 A1 | 10/2008 | Clark |
| 2008/0248310 A1 | 10/2008 | Kim et al. |
| 2008/0257494 A1 | 10/2008 | Hayashi et al. |
| 2008/0261413 A1 | 10/2008 | Mahajani |
| 2008/0264337 A1 | 10/2008 | Sano et al. |
| 2008/0267598 A1 | 10/2008 | Nakamura |
| 2008/0277715 A1 | 11/2008 | Ohmi et al. |
| 2008/0282970 A1 | 11/2008 | Heys et al. |
| 2008/0295872 A1 | 12/2008 | Riker et al. |
| 2008/0299326 A1 | 12/2008 | Fukazawa |
| 2008/0302303 A1 | 12/2008 | Choi et al. |
| 2008/0305246 A1 | 12/2008 | Choi et al. |
| 2008/0305443 A1 | 12/2008 | Nakamura |
| 2008/0315292 A1 | 12/2008 | Ji et al. |
| 2008/0317972 A1 | 12/2008 | Hendriks |
| 2009/0000550 A1 | 1/2009 | Tran et al. |
| 2009/0000551 A1 | 1/2009 | Choi et al. |
| 2009/0011608 A1 | 1/2009 | Nabatame |
| 2009/0020072 A1 | 1/2009 | Mizunaga et al. |
| 2009/0023229 A1 | 1/2009 | Matsushita |
| 2009/0029528 A1 | 1/2009 | Sanchez et al. |
| 2009/0029564 A1 | 1/2009 | Yamashita et al. |
| 2009/0033907 A1 | 2/2009 | Watson |
| 2009/0035947 A1 | 2/2009 | Horii |
| 2009/0041952 A1 | 2/2009 | Yoon et al. |
| 2009/0041984 A1 | 2/2009 | Mayers et al. |
| 2009/0045829 A1 | 2/2009 | Awazu |
| 2009/0050621 A1 | 2/2009 | Awazu |
| 2009/0061644 A1 | 3/2009 | Chiang et al. |
| 2009/0061647 A1 | 3/2009 | Mallick et al. |
| 2009/0085156 A1 | 4/2009 | Dewey et al. |
| 2009/0090382 A1 | 4/2009 | Morisada |
| 2009/0093094 A1 | 4/2009 | Ye et al. |
| 2009/0095221 A1 | 4/2009 | Tam et al. |
| 2009/0104789 A1 | 4/2009 | Mallick et al. |
| 2009/0107404 A1 | 4/2009 | Ogliari et al. |
| 2009/0120580 A1 | 5/2009 | Kagoshima et al. |
| 2009/0122293 A1 | 5/2009 | Shibazaki |
| 2009/0130331 A1* | 5/2009 | Asai .................. C23C 16/34 427/535 |
| 2009/0136668 A1 | 5/2009 | Gregg et al. |
| 2009/0136683 A1 | 5/2009 | Fukasawa et al. |
| 2009/0139657 A1 | 6/2009 | Lee et al. |
| 2009/0142935 A1 | 6/2009 | Fukuzawa et al. |
| 2009/0146322 A1 | 6/2009 | Weling et al. |
| 2009/0156015 A1 | 6/2009 | Park et al. |
| 2009/0209081 A1 | 8/2009 | Matero |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0246399 A1 | 10/2009 | Goundar |
| 2009/0246971 A1 | 10/2009 | Reid et al. |
| 2009/0250955 A1 | 10/2009 | Aoki |
| 2009/0261331 A1 | 10/2009 | Yang et al. |
| 2009/0269506 A1 | 10/2009 | Okura et al. |
| 2009/0275205 A1 | 11/2009 | Kiehlbauch et al. |
| 2009/0277510 A1 | 11/2009 | Shikata |
| 2009/0283041 A1 | 11/2009 | Tomiyasu et al. |
| 2009/0283217 A1 | 11/2009 | Lubomirsky et al. |
| 2009/0286400 A1 | 11/2009 | Heo et al. |
| 2009/0286402 A1 | 11/2009 | Xia et al. |
| 2009/0289300 A1 | 11/2009 | Sasaki et al. |
| 2009/0304558 A1 | 12/2009 | Patton |
| 2009/0311857 A1 | 12/2009 | Todd et al. |
| 2010/0001409 A1 | 1/2010 | Humbert et al. |
| 2010/0006031 A1 | 1/2010 | Choi et al. |
| 2010/0014479 A1 | 1/2010 | Kim |
| 2010/0015813 A1 | 1/2010 | McGinnis et al. |
| 2010/0024727 A1 | 2/2010 | Kim et al. |
| 2010/0025796 A1 | 2/2010 | Dabiran |
| 2010/0032842 A1* | 2/2010 | Herdt .................. C23C 14/0641 257/770 |
| 2010/0040441 A1 | 2/2010 | Obikane |
| 2010/0041179 A1 | 2/2010 | Lee |
| 2010/0041243 A1 | 2/2010 | Cheng et al. |
| 2010/0055312 A1 | 3/2010 | Kato et al. |
| 2010/0055442 A1 | 3/2010 | Kellock |
| 2010/0075507 A1 | 3/2010 | Chang et al. |
| 2010/0089320 A1 | 4/2010 | Kim |
| 2010/0093187 A1 | 4/2010 | Lee et al. |
| 2010/0102417 A1 | 4/2010 | Ganguli et al. |
| 2010/0116209 A1 | 5/2010 | Kato |
| 2010/0124610 A1 | 5/2010 | Aikawa et al. |
| 2010/0124618 A1 | 5/2010 | Kobayashi et al. |
| 2010/0124621 A1 | 5/2010 | Kobayashi et al. |
| 2010/0126605 A1 | 5/2010 | Stones |
| 2010/0130017 A1 | 5/2010 | Luo et al. |
| 2010/0134023 A1 | 6/2010 | Mills |
| 2010/0136216 A1 | 6/2010 | Tsuei et al. |
| 2010/0140221 A1 | 6/2010 | Kikuchi et al. |
| 2010/0144162 A1 | 6/2010 | Lee et al. |
| 2010/0151206 A1 | 6/2010 | Wu et al. |
| 2010/0159638 A1 | 6/2010 | Jeong |
| 2010/0162752 A1 | 7/2010 | Tabata et al. |
| 2010/0170441 A1 | 7/2010 | Won et al. |
| 2010/0178137 A1 | 7/2010 | Chintalapati et al. |
| 2010/0178423 A1 | 7/2010 | Shimizu et al. |
| 2010/0184302 A1 | 7/2010 | Lee et al. |
| 2010/0193501 A1 | 8/2010 | Zucker et al. |
| 2010/0195392 A1 | 8/2010 | Freeman |
| 2010/0221452 A1 | 9/2010 | Kang |
| 2010/0230051 A1 | 9/2010 | Iizuka |
| 2010/0233886 A1 | 9/2010 | Yang et al. |
| 2010/0243166 A1 | 9/2010 | Hayashi et al. |
| 2010/0244688 A1 | 9/2010 | Braun et al. |
| 2010/0255198 A1 | 10/2010 | Cleary et al. |
| 2010/0255625 A1 | 10/2010 | De Vries |
| 2010/0259152 A1 | 10/2010 | Yasuda et al. |
| 2010/0270675 A1 | 10/2010 | Harada |
| 2010/0275846 A1 | 11/2010 | Kitagawa |

(56) References Cited

U.S. PATENT DOCUMENTS

| | | |
|---|---|---|
| 2010/0285319 A1 | 11/2010 | Kwak et al. |
| 2010/0294199 A1 | 11/2010 | Tran et al. |
| 2010/0301752 A1 | 12/2010 | Bakre et al. |
| 2010/0304047 A1 | 12/2010 | Yang et al. |
| 2010/0307415 A1 | 12/2010 | Shero et al. |
| 2010/0317198 A1 | 12/2010 | Antonelli |
| 2010/0322604 A1 | 12/2010 | Fondurulia et al. |
| 2011/0000619 A1 | 1/2011 | Suh |
| 2011/0006402 A1 | 1/2011 | Zhou |
| 2011/0006406 A1 | 1/2011 | Urbanowicz et al. |
| 2011/0014795 A1 | 1/2011 | Lee |
| 2011/0027999 A1 | 2/2011 | Sparks et al. |
| 2011/0034039 A1 | 2/2011 | Liang et al. |
| 2011/0048642 A1 | 3/2011 | Mihara et al. |
| 2011/0052833 A1 | 3/2011 | Hanawa et al. |
| 2011/0056513 A1 | 3/2011 | Hombach et al. |
| 2011/0056626 A1 | 3/2011 | Brown et al. |
| 2011/0061810 A1 | 3/2011 | Ganguly et al. |
| 2011/0070380 A1 | 3/2011 | Shero et al. |
| 2011/0081519 A1 | 4/2011 | Dillingh |
| 2011/0086516 A1 | 4/2011 | Lee et al. |
| 2011/0089469 A1 | 4/2011 | Merckling |
| 2011/0097901 A1 | 4/2011 | Banna et al. |
| 2011/0107512 A1 | 5/2011 | Gilbert |
| 2011/0108194 A1 | 5/2011 | Yoshioka et al. |
| 2011/0108741 A1 | 5/2011 | Ingram |
| 2011/0108929 A1 | 5/2011 | Meng |
| 2011/0117490 A1 | 5/2011 | Bae et al. |
| 2011/0117737 A1 | 5/2011 | Agarwala et al. |
| 2011/0124196 A1 | 5/2011 | Lee |
| 2011/0139748 A1 | 6/2011 | Donnelly et al. |
| 2011/0143032 A1 | 6/2011 | Vrtis et al. |
| 2011/0143461 A1 | 6/2011 | Fish et al. |
| 2011/0159202 A1 | 6/2011 | Matsushita |
| 2011/0159673 A1 | 6/2011 | Hanawa et al. |
| 2011/0175011 A1 | 7/2011 | Ehrne et al. |
| 2011/0183079 A1 | 7/2011 | Jackson et al. |
| 2011/0183269 A1 | 7/2011 | Zhu |
| 2011/0192820 A1 | 8/2011 | Yeom et al. |
| 2011/0198736 A1 | 8/2011 | Shero et al. |
| 2011/0210468 A1 | 9/2011 | Shannon et al. |
| 2011/0220874 A1 | 9/2011 | Hanrath |
| 2011/0236600 A1 | 9/2011 | Fox et al. |
| 2011/0239936 A1 | 10/2011 | Suzaki et al. |
| 2011/0254052 A1 | 10/2011 | Kouvetakis |
| 2011/0256675 A1 | 10/2011 | Avouris |
| 2011/0256726 A1 | 10/2011 | Lavoie et al. |
| 2011/0256727 A1 | 10/2011 | Beynet et al. |
| 2011/0256734 A1 | 10/2011 | Hausmann et al. |
| 2011/0265549 A1 | 11/2011 | Cruse et al. |
| 2011/0265951 A1 | 11/2011 | Xu et al. |
| 2011/0275166 A1 | 11/2011 | Shero et al. |
| 2011/0281417 A1 | 11/2011 | Gordon et al. |
| 2011/0283933 A1 | 11/2011 | Makarov et al. |
| 2011/0294075 A1 | 12/2011 | Chen et al. |
| 2011/0308460 A1 | 12/2011 | Hong et al. |
| 2012/0003500 A1 | 1/2012 | Yoshida et al. |
| 2012/0006489 A1 | 1/2012 | Okita |
| 2012/0024479 A1 | 2/2012 | Palagashvili et al. |
| 2012/0032311 A1 | 2/2012 | Gates |
| 2012/0043556 A1 | 2/2012 | Dube et al. |
| 2012/0052681 A1 | 3/2012 | Marsh |
| 2012/0070136 A1 | 3/2012 | Koelmel et al. |
| 2012/0070997 A1 | 3/2012 | Larson |
| 2012/0090704 A1 | 4/2012 | Laverdiere et al. |
| 2012/0098107 A1 | 4/2012 | Raisanen et al. |
| 2012/0100464 A1 | 4/2012 | Kageyama |
| 2012/0103264 A1 | 5/2012 | Choi et al. |
| 2012/0103939 A1 | 5/2012 | Wu et al. |
| 2012/0107607 A1 | 5/2012 | Takaki et al. |
| 2012/0114877 A1 | 5/2012 | Lee |
| 2012/0121823 A1 | 5/2012 | Chhabra |
| 2012/0122302 A1 | 5/2012 | Weidman et al. |
| 2012/0128897 A1 | 5/2012 | Xiao et al. |
| 2012/0135145 A1 | 5/2012 | Je et al. |
| 2012/0156108 A1 | 6/2012 | Fondurulia et al. |
| 2012/0160172 A1 | 6/2012 | Wamura et al. |
| 2012/0164327 A1 | 6/2012 | Sato |
| 2012/0164837 A1 | 6/2012 | Tan et al. |
| 2012/0164842 A1 | 6/2012 | Watanabe |
| 2012/0171391 A1 | 7/2012 | Won |
| 2012/0171874 A1 | 7/2012 | Thridandam et al. |
| 2012/0207456 A1 | 8/2012 | Kim et al. |
| 2012/0212121 A1 | 8/2012 | Lin |
| 2012/0214318 A1 | 8/2012 | Fukazawa et al. |
| 2012/0220139 A1 | 8/2012 | Lee et al. |
| 2012/0225561 A1 | 9/2012 | Watanabe |
| 2012/0240858 A1 | 9/2012 | Taniyama et al. |
| 2012/0263876 A1 | 10/2012 | Haukka et al. |
| 2012/0270339 A1 | 10/2012 | Xie et al. |
| 2012/0270393 A1 | 10/2012 | Pore et al. |
| 2012/0289053 A1 | 11/2012 | Holland et al. |
| 2012/0295427 A1 | 11/2012 | Bauer |
| 2012/0304935 A1 | 12/2012 | Oosterlaken et al. |
| 2012/0305196 A1 | 12/2012 | Mori et al. |
| 2012/0315113 A1 | 12/2012 | Hiroki |
| 2012/0318334 A1 | 12/2012 | Bedell et al. |
| 2012/0321786 A1 | 12/2012 | Satitpunwaycha et al. |
| 2012/0322252 A1 | 12/2012 | Son et al. |
| 2012/0325148 A1 | 12/2012 | Yamagishi et al. |
| 2012/0328780 A1 | 12/2012 | Yamagishi et al. |
| 2013/0005122 A1 | 1/2013 | Schwarzenbach et al. |
| 2013/0011983 A1 | 1/2013 | Tsai |
| 2013/0014697 A1 | 1/2013 | Kanayama |
| 2013/0014896 A1 | 1/2013 | Shoji et al. |
| 2013/0019944 A1 | 1/2013 | Hekmatshoar-Tabari et al. |
| 2013/0019945 A1 | 1/2013 | Hekmatshoar-Tabari et al. |
| 2013/0023129 A1 | 1/2013 | Reed |
| 2013/0048606 A1 | 2/2013 | Mao et al. |
| 2013/0064973 A1 | 3/2013 | Chen et al. |
| 2013/0068970 A1 | 3/2013 | Matsushita |
| 2013/0078392 A1 | 3/2013 | Xiao et al. |
| 2013/0081702 A1 | 4/2013 | Mohammed et al. |
| 2013/0084156 A1 | 4/2013 | Shimamoto |
| 2013/0084714 A1 | 4/2013 | Oka et al. |
| 2013/0104988 A1 | 5/2013 | Yednak et al. |
| 2013/0104992 A1 | 5/2013 | Yednak et al. |
| 2013/0115383 A1 | 5/2013 | Lu et al. |
| 2013/0115763 A1 | 5/2013 | Takamure et al. |
| 2013/0122712 A1 | 5/2013 | Kim et al. |
| 2013/0126515 A1 | 5/2013 | Shero et al. |
| 2013/0129577 A1 | 5/2013 | Halpin et al. |
| 2013/0134148 A1 | 5/2013 | Tachikawa |
| 2013/0168354 A1 | 7/2013 | Kanarik |
| 2013/0174982 A1* | 7/2013 | Lin .................. H01L 21/0332 |
| | | 156/345.3 |
| 2013/0180448 A1 | 7/2013 | Sakaue et al. |
| 2013/0183814 A1 | 7/2013 | Huang et al. |
| 2013/0210241 A1 | 8/2013 | Lavoie et al. |
| 2013/0217239 A1 | 8/2013 | Mallick et al. |
| 2013/0217240 A1 | 8/2013 | Mallick et al. |
| 2013/0217241 A1 | 8/2013 | Underwood et al. |
| 2013/0217243 A1 | 8/2013 | Underwood et al. |
| 2013/0224964 A1 | 8/2013 | Fukazawa |
| 2013/0230814 A1 | 9/2013 | Dunn et al. |
| 2013/0256838 A1 | 10/2013 | Sanchez et al. |
| 2013/0264659 A1 | 10/2013 | Jung |
| 2013/0288480 A1 | 10/2013 | Sanchez et al. |
| 2013/0292047 A1 | 11/2013 | Tian et al. |
| 2013/0292676 A1 | 11/2013 | Milligan et al. |
| 2013/0292807 A1 | 11/2013 | Raisanen et al. |
| 2013/0295779 A1 | 11/2013 | Chandra et al. |
| 2013/0319290 A1 | 12/2013 | Xiao et al. |
| 2013/0323435 A1 | 12/2013 | Xiao et al. |
| 2013/0330165 A1 | 12/2013 | Wimplinger |
| 2013/0330911 A1 | 12/2013 | Huang et al. |
| 2013/0330933 A1 | 12/2013 | Fukazawa et al. |
| 2013/0337583 A1 | 12/2013 | Kobayashi et al. |
| 2014/0000843 A1 | 1/2014 | Dunn et al. |
| 2014/0014642 A1 | 1/2014 | Elliot et al. |
| 2014/0014644 A1 | 1/2014 | Akiba et al. |
| 2014/0020619 A1 | 1/2014 | Vincent et al. |
| 2014/0027884 A1 | 1/2014 | Tang et al. |
| 2014/0033978 A1 | 2/2014 | Adachi et al. |

(56) References Cited

U.S. PATENT DOCUMENTS

| | | |
|---|---|---|
| 2014/0036274 A1 | 2/2014 | Marquardt et al. |
| 2014/0048765 A1 | 2/2014 | Ma et al. |
| 2014/0056679 A1 | 2/2014 | Yamabe et al. |
| 2014/0060147 A1 | 3/2014 | Sarin et al. |
| 2014/0062304 A1 | 3/2014 | Nakano et al. |
| 2014/0067110 A1 | 3/2014 | Lawson et al. |
| 2014/0073143 A1 | 3/2014 | Alokozai et al. |
| 2014/0077240 A1 | 3/2014 | Roucka et al. |
| 2014/0084341 A1 | 3/2014 | Weeks |
| 2014/0087544 A1 | 3/2014 | Tolle |
| 2014/0094027 A1 | 4/2014 | Azumo et al. |
| 2014/0096716 A1 | 4/2014 | Chung et al. |
| 2014/0099798 A1 | 4/2014 | Tsuji |
| 2014/0103145 A1 | 4/2014 | White et al. |
| 2014/0116335 A1 | 5/2014 | Tsuji et al. |
| 2014/0120487 A1 | 5/2014 | Kaneko |
| 2014/0127907 A1 | 5/2014 | Yang |
| 2014/0141625 A1 | 5/2014 | Fukazawa et al. |
| 2014/0159170 A1 | 6/2014 | Raisanen et al. |
| 2014/0174354 A1 | 6/2014 | Arai |
| 2014/0175054 A1 | 6/2014 | Carlson et al. |
| 2014/0182053 A1 | 7/2014 | Huang |
| 2014/0217065 A1 | 8/2014 | Winkler et al. |
| 2014/0220247 A1 | 8/2014 | Haukka et al. |
| 2014/0225065 A1 | 8/2014 | Rachmady et al. |
| 2014/0227072 A1 | 8/2014 | Lee et al. |
| 2014/0251953 A1 | 9/2014 | Winkler et al. |
| 2014/0251954 A1 | 9/2014 | Winkler et al. |
| 2014/0283747 A1 | 9/2014 | Kasai et al. |
| 2014/0346650 A1 | 11/2014 | Raisanen et al. |
| 2014/0349033 A1 | 11/2014 | Nonaka et al. |
| 2014/0363980 A1 | 12/2014 | Kawamata et al. |
| 2014/0363985 A1 | 12/2014 | Jang et al. |
| 2014/0367043 A1 | 12/2014 | Bishara et al. |
| 2015/0004316 A1 | 1/2015 | Thompson et al. |
| 2015/0004317 A1 | 1/2015 | Dussarrat et al. |
| 2015/0007770 A1 | 1/2015 | Chandrasekharan et al. |
| 2015/0014632 A1 | 1/2015 | Kim et al. |
| 2015/0021599 A1 | 1/2015 | Ridgeway |
| 2015/0024609 A1 | 1/2015 | Milligan et al. |
| 2015/0048485 A1 | 2/2015 | Tolle |
| 2015/0078874 A1 | 3/2015 | Sansoni |
| 2015/0086316 A1 | 3/2015 | Greenberg |
| 2015/0091057 A1 | 4/2015 | Xie et al. |
| 2015/0096973 A1 | 4/2015 | Dunn et al. |
| 2015/0099072 A1 | 4/2015 | Takamure et al. |
| 2015/0132212 A1 | 5/2015 | Winkler et al. |
| 2015/0140210 A1 | 5/2015 | Jung et al. |
| 2015/0147483 A1 | 5/2015 | Fukazawa |
| 2015/0147877 A1 | 5/2015 | Jung |
| 2015/0167159 A1 | 6/2015 | Halpin et al. |
| 2015/0170954 A1 | 6/2015 | Agarwal |
| 2015/0174768 A1 | 6/2015 | Rodnick |
| 2015/0184291 A1 | 7/2015 | Alokozai et al. |
| 2015/0187568 A1 | 7/2015 | Pettinger et al. |
| 2015/0217456 A1 | 8/2015 | Tsuji et al. |
| 2015/0240359 A1 | 8/2015 | Jdira et al. |
| 2015/0267295 A1 | 9/2015 | Hill et al. |
| 2015/0267297 A1 | 9/2015 | Shiba |
| 2015/0267299 A1 | 9/2015 | Hawkins |
| 2015/0267301 A1 | 9/2015 | Hill et al. |
| 2015/0284848 A1 | 10/2015 | Nakano et al. |
| 2015/0287626 A1 | 10/2015 | Arai |
| 2015/0308586 A1 | 10/2015 | Shugrue et al. |
| 2015/0315704 A1 | 11/2015 | Nakano et al. |
| 2016/0013024 A1 | 1/2016 | Milligan et al. |
| 2016/0024656 A1 | 1/2016 | White et al. |
| 2016/0051964 A1 | 2/2016 | Tolle et al. |

FOREIGN PATENT DOCUMENTS

| | | |
|---|---|---|
| CN | 101522943 | 9/2009 |
| CN | 101423937 | 9/2011 |
| DE | 102008052750 | 6/2009 |
| EP | 2036600 | 3/2009 |
| EP | 2426233 | 7/2012 |
| JP | 03-044472 | 2/1991 |
| JP | H04115531 | 4/1992 |
| JP | 06-53210 | 2/1994 |
| JP | 07-130731 | 5/1995 |
| JP | 07-034936 | 8/1995 |
| JP | 7-272694 | 10/1995 |
| JP | H07283149 | 10/1995 |
| JP | 08-181135 | 7/1996 |
| JP | H08335558 | 12/1996 |
| JP | 10-064696 | 3/1998 |
| JP | 10-0261620 | 9/1998 |
| JP | 2845163 | 1/1999 |
| JP | 2001-15698 | 1/2001 |
| JP | 2001342570 | 12/2001 |
| JP | 2004014952 | 1/2004 |
| JP | 2004091848 | 3/2004 |
| JP | 2004128019 | 4/2004 |
| JP | 2004134553 | 4/2004 |
| JP | 2004294638 | 10/2004 |
| JP | 2004310019 | 11/2004 |
| JP | 2004538374 | 12/2004 |
| JP | 2005507030 | 3/2005 |
| JP | 2006186271 | 7/2006 |
| JP | 3140111 | 3/2008 |
| JP | 2008060304 | 3/2008 |
| JP | 2008527748 | 7/2008 |
| JP | 2008202107 | 9/2008 |
| JP | 2009016815 | 1/2009 |
| JP | 2009099938 | 5/2009 |
| JP | 2010067940 | 3/2010 |
| JP | 2010097834 | 4/2010 |
| JP | 2010205967 | 9/2010 |
| JP | 2010251444 | 10/2010 |
| JP | 2012089837 | 5/2012 |
| JP | 2012146939 | 8/2012 |
| KR | 20100020834 | 2/2010 |
| TW | I226380 | 1/2005 |
| TW | 200701301 | 1/2007 |
| WO | 9832893 | 7/1998 |
| WO | 2004008827 | 1/2004 |
| WO | 2004010467 | 1/2004 |
| WO | 2006054854 | 5/2006 |
| WO | 2006056091 | 6/2006 |
| WO | 2006078666 | 7/2006 |
| WO | 2006080782 | 8/2006 |
| WO | 2006/101857 | 9/2006 |
| WO | 2006101857 | 9/2006 |
| WO | 2007140376 | 12/2007 |
| WO | 2010039363 | 4/2010 |
| WO | 2010118051 | 1/2011 |
| WO | 2011019950 | 2/2011 |
| WO | 2013078065 | 5/2013 |
| WO | 2013078066 | 5/2013 |

OTHER PUBLICATIONS

Caubet "Low temperature low resistivity PEALD TiN using TDMAT under hydrogen reducing ambient" Journal of Electrochemical Society 155 (8) H625-H632 (2008).*

USPTO; Office Action dated Aug. 27, 2010 in U.S. Appl. No. 12/118,596.

USPTO; Office Action dated Feb. 15, 2011 in U.S. Appl. No. 12/118,596.

USPTO; Notice of Allowance dated Aug. 4, 2011 in U.S. Appl. No. 12/118,596.

USPTO; Non-Final Office Action dated Apr. 1, 2010 in U.S. Appl. No. 12/357,174.

USPTO; Final Office Action dated Sep. 1, 2010 in U.S. Appl. No. 12/357,174.

USPTO; Notice of Allowance dated Dec. 13, 2010 in U.S. Appl. No. 12/357,174.

USPTO; Non-Final Office Action dated Dec. 29, 2010 in U.S. Appl. No. 12/362,023.

USPTO; Non-Final Office Action dated Jul. 26, 2011 in U.S. Appl. No. 12/416,809.

(56) References Cited

OTHER PUBLICATIONS

USPTO; Final Office Action dated Dec. 6, 2011 in U.S. Appl. No. 12/416,809.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Notice of Allowance dated Oct. 1, 2010 in U.S. Appl. No. 12/467,017.
USPTO; Non-Final Office Action dated Mar. 18, 2010 in U.S. Appl. No. 12/489,252.
USPTO; Notice of Allowance dated Sep. 2, 2010 in U.S. Appl. No. 12/489,252.
USPTO; Non-Final Office Action dated Dec. 15, 2010 in U.S. Appl. No. 12/553,759.
USPTO; Final Office Action dated May 4, 2011 in U.S. Appl. No. 12/553,759.
USPTO; Non-Final Office Action dated Sep. 6, 2011 in U.S. Appl. No. 12/553,759.
USPTO; Notice of Allowance dated Jan. 24, 2012 in U.S. Appl. No. 12/553,759.
USPTO; Non-Final Office Action dated Oct. 19, 2012 in U.S. Appl. No. 12/618,355.
USPTO; Final Office Action dated May 8, 2013 in U.S. Appl. No. 12/618,355.
USPTO; Non-Final Office Action dated Apr. 8, 2015 in U.S. Appl. No. 12/618,355.
USPTO; Final Office Action dated Oct. 22, 2015 in U.S. Appl. No. 12/618,355.
USPTO; Non-Final Office Action dated Feb. 16, 2012 in U.S. Appl. No. 12/618,419.
USPTO; Final Office Action dated Jun. 22, 2012 in U.S. Appl. No. 12/618,419.
USPTO; Non-Final Office Action dated Nov. 27, 2012 in U.S. Appl. No. 12/618,419.
USPTO; Notice of Allowance dated Apr. 12, 2013 in U.S. Appl. No. 12/618,419.
USPTO; Non-Final Office Action dated Dec. 6, 2011 in U.S. Appl. No. 12/718,731.
USPTO; Notice of Allowance dated Mar. 16, 2012 in U.S. Appl. No. 12/718,731.
USPTO; Restriction Requirement dated Jan. 15, 2013 in U.S. Appl. No. 12/754,223.
USPTO; Office Action dated Feb. 26, 2013 in U.S. Appl. No. 12/754,223.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Final Office Action dated Jul. 14, 2014 in U.S. Appl. No. 12/754,223.
USPTO; Non-Final Office Action dated Mar. 25, 2015 in U.S. Appl. No. 12/754,223.
USPTO; Final Office Action dated Aug. 12, 2015 in U.S. Appl. No. 12/754,223.
USPTO; Office Action dated Apr. 23, 2013 in U.S. Appl. No. 12/763,037.
USPTO; Final Office Action dated Oct. 21, 2013 in U.S. Appl. No. 12/763,037.
USPTO; Office Action dated Oct. 8, 2014 in U.S. Appl. No. 12/763,037.
USPTO; Notice of Allowance dated Jan. 27, 2015 in U.S. Appl. No. 12/763,037.
USPTO; Non-Final Office Action dated Jan. 24, 2011 in U.S. Appl. No. 12/778,808.
USPTO; Notice of Allowance dated May 9, 2011 in U.S. Appl. No. 12/778,808.
USPTO; Notice of Allowance dated Oct. 12, 2012 in U.S. Appl. No. 12/832,739.
USPTO; Non-Final Office Action dated Oct. 16, 2012 in U.S. Appl. No. 12/847,848.
USPTO; Final Office Action dated Apr. 22, 2013 in U.S. Appl. No. 12/847,848.
USPTO; Notice of Allowance dated Jan. 16, 2014 in U.S. Appl. No. 12/847,848.
USPTO; Restriction Requirement dated Sep. 25, 2012 in U.S. Appl. No. 12/854,818.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Office Action dated Jun. 3, 2014 in U.S. Appl. No. 12/854,818.
USPTO; Non-Final Office Action dated Jul. 11, 2012 in U.S. Appl. No. 12/875,889.
USPTO; Notice of Allowance dated Jan. 4, 2013 in U.S. Appl. No. 12/875,889.
USPTO; Notice of Allowance dated Jan. 9, 2012 in U.S. Appl. No. 12/901,323.
USPTO; Non-Final Office Action dated Nov. 20, 2013 in U.S. Appl. No. 12/910,607.
USPTO; Final Office Action dated Apr. 28, 2014 in U.S. Appl. No. 12/910,607.
USPTO; Notice of Allowance dated Aug. 15, 2014 in U.S. Appl. No. 12/910,607.
USPTO; Non-Final Office Action dated Oct. 24, 2012 in U.S. Appl. No. 12/940,906.
USPTO; Final Office Action dated Feb. 13, 2013 in U.S. Appl. No. 12/940,906.
USPTO; Notice of Allowance dated Apr. 23, 2013 in U.S. Appl. No. 12/940,906.
USPTO; Non-Final Office Action dated Dec. 7, 2012 in U.S. Appl. No. 12/953,870.
USPTO; Final Office Action dated Apr. 22, 2013 in U.S. Appl. No. 12/953,870.
USPTO; Non-Final Office Action dated Sep. 19, 2012 in U.S. Appl. No. 13/016,735.
USPTO; Final Office Action dated Feb. 11, 2013 in U.S. Appl. No. 13/016,735.
USPTO; Notice of Allowance dated Apr. 24, 2013 in U.S. Appl. No. 13/016,735.
USPTO; Non-Final Office Action dated Apr. 4, 2012 in U.S. Appl. No. 13/030,438.
USPTO; Final Office Action dated Aug. 22, 2012 in U.S. Appl. No. 13/030,438.
USPTO; Notice of Allowance dated Oct. 24, 2012 in U.S. Appl. No. 13/030,438.
USPTO; Non-Final Office Action dated Dec. 3, 2012 in U.S. Appl. No. 13/040,013.
USPTO; Notice of Allowance dated May 3, 2013 in U.S. Appl. No. 13/040,013.
USPTO; Notice of Allowance dated Sep. 13, 2012 in U.S. Appl. No. 13/085,698.
USPTO; Non-Final Office Action dated Mar. 29, 2013 in U.S. Appl. No. 13/094,402.
USPTO; Final Office Action dated Jul. 17, 2013 in U.S. Appl. No. 13/094,402.
USPTO; Notice of Allowance dated Sep. 30, 2013 in U.S. Appl. No. 13/094,402.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Notice of Allowance dated Jul. 3, 2014 in U.S. Appl. No. 13/102,980.

(56) References Cited

OTHER PUBLICATIONS

USPTO; Non-Final Office Action dated Jul. 17, 2014 in U.S. Appl. No. 13/154,271.
USPTO; Final Office Action dated Jan. 2, 2015 in U.S. Appl. No. 13/154,271.
USPTO; Non-Final Office Action dated May 27, 2015 in U.S. Appl. No. 13/154,271.
USPTO; Final Office Action dated Nov. 23, 2015 in U.S. Appl. No. 13/154,271.
USPTO; Notice of Allowance dated Feb. 10, 2016 in U.S. Appl. No. 13/154,271.
USPTO; Non-Final Office Action dated Oct. 27, 2014 in U.S. Appl. No. 13/169,951.
USPTO; Final Office Action dated May 26, 2015 in U.S. Appl. No. 13/169,591.
USPTO; Non-Final Office Action dated Sep. 1, 2015 in U.S. Appl. No. 13/169,951.
USPTO; Non-Final Office Action dated Jun. 24, 2014 in U.S. Appl. No. 13/181,407.
USPTO; Final Office Action dated Sep. 24, 2014 in U.S. Appl. No. 13/181,407.
USPTO; Non-Final Office Action dated Jan. 2, 2015 in U.S. Appl. No. 13/181,407.
USPTO; Final Office Action dated Apr. 8, 2015 in U.S. Appl. No. 13/181,407.
USPTO; Non-Final Office Action dated Jan. 23, 2013 in U.S. Appl. No. 13/184,351.
USPTO; Final Office Action dated Jul. 29, 2013 in U.S. Appl. No. 13/184,351.
USPTO; Non-Final Office Action dated Jul. 16, 2014 in U.S. Appl. No. 13/184,351.
USPTO; Final Office Action dated Feb. 17, 2015 in U.S. Appl. No. 13/184,351.
USPTO; Non-Final Office Action dated Aug. 10, 2015 in U.S. Appl. No. 13/184,351.
USPTO; Non-Final Office Action dated Sep. 17, 2014 in U.S. Appl. No. 13/187,300.
USPTO; Final Office Action dated Apr. 15, 2015 in U.S. Appl. No. 13/187,300.
USPTO; Non-Final Office Action dated Apr. 7, 2016 in U.S. Appl. No. 13/187,300.
USPTO; Non-Final Office Action dated Oct. 1, 2012 in U.S. Appl. No. 13/191,762.
USPTO; Final Office Action dated Apr. 10, 2013 in U.S. Appl. No. 13/191,762.
USPTO; Notice of Allowance dated Aug. 15, 2013 in U.S. Appl. No. 13/191,762.
USPTO; Non-Final Office Action dated Oct. 22, 2012 in U.S. Appl. No. 13/238,960.
USPTO; Final Office Action dated May 3, 2013 in U.S. Appl. No. 13/238,960.
USPTO; Non-Final Office Action dated Apr. 26, 2013 in U.S. Appl. No. 13/250,721.
USPTO; Notice of Allowance dated Sep. 11, 2013 in U.S. Appl. No. 13/250,721.
USPTO; Non-Final Office Action dated Jul. 2, 2014 in U.S. Appl. No. 13/283,408.
USPTO; Final Office Action dated Jan. 29, 2015 in U.S. Appl. No. 13/283,408.
USPTO; Non-Final Office Action dated Jun. 17, 2015 in U.S. Appl. No. 13/283,408.
USPTO; Final Office Action dated Dec. 18, 2015 in U.S. Appl. No. 13/283,408.
USPTO; Notice of Allowance dated Mar. 28, 2016 in U.S. Appl. No. 13/283,408.
USPTO; Restriction Requirement dated Dec. 16, 2013 in U.S. Appl. No. 13/284,642.
USPTO; Restriction Requirement dated Apr. 21, 2014 in U.S. Appl. No. 13/284,642.
USPTO; Office Action dated Jul. 30, 2014 in U.S. Appl. No. 13/284,642.
USPTO; Notice of Allowance dated Feb. 11, 2015 in U.S. Appl. No. 13/284,642.
USPTO; Office Action dated Jan. 28, 2014 in U.S. Appl. No. 13/312,591.
USPTO; Final Office Action dated May 14, 2014 in U.S. Appl. No. 13/312,591.
USPTO; Non-Final Office Action dated Nov. 26, 2014 in U.S. Appl. No. 13/312,591.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Non-Final Office Action dated Apr. 9, 2014 in U.S. Appl. No. 13/333,420.
USPTO; Notice of Allowance dated Sep. 15, 2014 in U.S. Appl. No. 13/333,420.
USPTO; Office Action dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Non-Final Office Action dated Oct. 10, 2012 in U.S. Appl. No. 13/406,791.
USPTO; Final Office Action dated Jan. 31, 2013 in U.S. Appl. No. 13/406,791.
USPTO; Non-Final Office Action dated Apr. 25, 2013 in U.S. Appl. No. 13/406,791.
USPTO; Final Office Action dated Aug. 23, 2013 in U.S. Appl. No. 13/406,791.
USPTO; Non-Final Office Action dated Dec. 4, 2013 in U.S. Appl. No. 13/406,791.
USPTO; Final Office Action dated Apr. 21, 2014 in U.S. Appl. No. 13/406,791.
USPTO; Non-Final Office Action dated Jan. 14, 2013 in U.S. Appl. No. 13/410,970.
USPTO; Notice of Allowance dated Feb. 14, 2013 in U.S. Appl. No. 13/410,970.
USPTO; Non-Final Office Action dated Feb. 13, 2014 in U.S. Appl. No. 13/411,271.
USPTO; Non-Final Office Action dated Jul. 31, 2014 in U.S. Appl. No. 13/411,271.
USPTO; Final Office Action dated Jan. 16, 2015 in U.S. Appl. No. 13/411,271.
USPTO; Notice of Allowance dated Oct. 6, 2015 in U.S. Appl. No. 13/411,271.
USPTO; Restriction Requirement dated Oct. 29, 2013 in U.S. Appl. No. 13/439,528.
USPTO; Office Action dated Feb. 4, 2014 in U.S. Appl. No. 13/439,528.
USPTO; Final Office Action dated Jul. 8, 2014 in U.S. Appl. No. 13/439,528.
UPPTO; Notice of Allowance dated Oct. 21, 2014 in U.S. Appl. No. 13/439,528.
USPTO; Non-Final Office Action dated Apr. 11, 2013 in U.S. Appl. No. 13/450,368.
USPTO; Notice of Allowance dated Jul. 17, 2013 in U.S. Appl. No. 13/450,368.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.

(56) References Cited

OTHER PUBLICATIONS

USPTO; Non-Final Office Action dated Oct. 17, 2013 in U.S. Appl. No. 13/493,897.
USPTO; Notice of Allowance dated Mar. 20, 2014 in U.S. Appl. No. 13/493,897.
USPTO; Office Action dated Dec. 20, 2013 in U.S. Appl. No. 13/535,214.
USPTO; Final Office Action dated Jun. 18, 2014 in U.S. Appl. No. 13/535,214.
USPTO; Notice of Allowance dated Oct. 23, 2014 in U.S. Appl. No. 13/535,214.
USPTO; Non-Final Office Action dated Sep. 11, 2013 in U.S. Appl. No. 13/550,419.
USPTO; Final Office Action dated Jan. 27, 2014 in U.S. Appl. No. 13/550,419.
USPTO; Notice of Allowance dated May 29, 2014 in U.S. Appl. No. 13/550,419.
USPTO; Non-Final Office Action dated Aug. 8, 2014 in U.S. Appl. No. 13/563,066.
USPTO; Final Office Action dated Feb. 12, 2015 in U.S. Appl. No. 13/563,066.
USPTO; Notice of Allowance dated Jun. 12, 2015 in U.S. Appl. No. 13/563,066.
USPTO; Notice of Allowance dated Jul. 16, 2015 in U.S. Appl. No. 13/563,066.
USPTO; Non-Final Office Action dated Nov. 7, 2013 in U.S. Appl. No. 13/565,564.
USPTO; Final Office Action dated Feb. 28, 2014 in U.S. Appl. No. 13/565,564.
USPTO; Non-Final Office Action dated Jul. 2, 2014 in U.S. Appl. No. 13/565,564.
USPTO; Notice of Allowance dated Nov. 3, 2014 in U.S. Appl. No. 13/565,564.
USPTO; Non-Final Office Action dated Aug. 30, 2013 in U.S. Appl. No. 13/570,067.
USPTO; Notice of Allowance dated Jan. 6, 2014 in U.S. Appl. No. 13/570,067.
USPTO; Non-Final Office Action dated Oct. 15, 2014 in U.S. Appl. No. 13/597,043.
USPTO; Final Office Action dated Mar. 13, 2015 in U.S. Appl. No. 13/597,043.
USPTO; USPTO; Notice of Allowance dated Aug. 28, 2015 in U.S. Appl. No. 13/597,043.
USPTO; Non-Final Office Action dated Feb. 12, 2015 in U.S. Appl. No. 13/597,108.
USPTO; Final Office Action dated Jun. 1, 2015 in U.S. Appl. No. 13/597,108.
USPTO; Non-Final Office Action dated Dec. 8, 2015 in U.S. Appl. No. 13/597,108.
USPTO; Notice of Allowance dated Mar. 27, 2014 in U.S. Appl. No. 13/604,498.
USPTO; Office Action dated Nov. 15, 2013 in U.S. Appl. No. 13/612,538.
USPTO; Office Action dated Jul. 10, 2014 in U.S. Appl. No. 13/612,538.
USPTO; Non-Final Office Action dated Apr. 15, 2015 in U.S. Appl. No. 13/646,403.
USPTO; Final Office Action dated Oct. 15, 2015 in U.S. Appl. No. 13/646,403.
USPTO; Notice of Allowance dated Feb. 2, 2016 in U.S. Appl. No. 13/646,403.
USPTO; Non-Final Office Action dated May 15, 2014 in U.S. Appl. No. 13/646,471.
USPTO; Final Office Action dated Aug. 18, 2014 in U.S. Appl. No. 13/646,471.
USPTO; Non-Final Office Action dated Dec. 16, 2014 in U.S. Appl. No. 13/646,471.
USPTO; Final Office Action dated Apr. 21, 2015 in U.S. Appl. No. 13/646,471.
USPTO; Non-Final Office Action dated Aug. 19, 2015 in U.S. Appl. No. 13/646,471.
USPTO; Final Office Action dated Jan. 22, 2016 in U.S. Appl. No. 13/646,471.
USPTO; Non-Final Office Action dated May 28, 2015 in U.S. Appl. No. 13/651,144.
USPTO; Final Office Action dated Nov. 19, 2015 in U.S. Appl. No. 13/651,144.
USPTO; Non-Final Office Action dated Nov. 19, 2015 in U.S. Appl. No. 14/659,437.
USPTO; Non-Final Office Action dated Jun. 18, 2015 in U.S. Appl. No. 13/665,366.
USPTO; Non-Final Office Action dated Apr. 3, 2015 in U.S. Appl. No. 13/677,133.
USPTO; Notice of Allowance dated Aug. 4, 2015 in U.S. Appl. No. 13/677,133.
USPTO; Office Action dated Jun. 2, 2014 in U.S. Appl. No. 13/677,151.
USPTO; Final Office Action dated Nov. 14, 2014 in U.S. Appl. No. 13/677,151.
USPTO; Notice of Allowance dated Feb. 26, 2015 in U.S. Appl. No. 13/677,151.
USPTO; Non-Final Office Action dated Aug. 20, 2013 in U.S. Appl. No. 13/679,502.
USPTO; Final Office Action dated Feb. 25, 2014 in U.S. Appl. No. 13/679,502.
USPTO; Notice of Allowance dated May 2, 2014 in U.S. Appl. No. 13/679,502.
USPTO; Non-Final Office Action dated Jul. 21, 2015 in U.S. Appl. No. 13/727,324.
USPTO; Final Office Action dated Jan. 22, 2016 in U.S. Appl. No. 13/727,324.
USPTO; Non-Final Office Action dated Oct. 24, 2013 in U.S. Appl. No. 13/749,878.
USPTO; Non-Final Office Action dated Jun. 18, 2014 in U.S. Appl. No. 13/749,878.
USPTO; Final Office Action dated Dec. 10, 2014 in U.S. Appl. No. 13/749,878.
USPTO; Notice of Allowance Mar. 13, 2015 dated in U.S. Appl. No. 13/749,878.
USPTO; Office Action dated Apr. 23, 2014 in U.S. Appl. No. 13/784,362.
USPTO; Notice of Allowance dated Aug. 13, 2014 in U.S. Appl. No. 13/784,362.
USPTO; Non-Final Office Action dated Dec. 19, 2013 in U.S. Appl. No. 13/784,388.
USPTO; Notice of Allowance dated Jun. 4, 2014 in U.S. Appl. No. 13/784,388.
USPTO; Restriction Requirement dated May 8, 2014 in U.S. Appl. No. 13/791,246.
USPTO; Non-Final Office Action dated Sep. 19, 2014 in U.S. Appl. No. 13/791,246.
USPTO; Final Office Action dated Mar. 25, 2015 in U.S. Appl. No. 13/791,246.
USPTO; Non-Final Office Action dated Oct. 26, 2015 in U.S. Appl. No. 13/791,246.
USPTO; Final Office Action dated Apr. 20, 2016 in U.S. Appl. No. 13/791,246.
USPTO; Non-Final Office Action dated Nov. 6, 2015 in U.S. Appl. No. 13/791,339.
USPTO; Final Office Action dated Apr. 12, 2016 in U.S. Appl. No. 13/791,339.
USPTO; Non-Final Office Action dated Mar. 21, 2014 in U.S. Appl. No. 13/799,708.
USPTO; Notice of Allowance dated Oct. 31, 2014 in U.S. Appl. No. 13/799,708.
USPTO; Restriction Requirement dated Jun. 26, 2014 in U.S. Appl. No. 13/874,708.
USPTO; Non-Final Office Action dated Oct. 9, 2014 in U.S. Appl. No. 13/874,708.
USPTO; Notice of Allowance dated Mar. 10, 2015 in U.S. Appl. No. 13/874,708.

(56) References Cited

OTHER PUBLICATIONS

USPTO; Notice of Allowance dated Apr. 10, 2014 in U.S. Appl. No. 13/901,341.
USPTO; Notice of Allowance dated Jun. 6, 2014 in U.S. Appl. No. 13/901,341.
USPTO; Non-Final Office Action dated Jan. 2, 2015 in U.S. Appl. No. 13/901,372.
USPTO; Final Office Action dated Apr. 16, 2015 in U.S. Appl. No. 13/901,372.
USPTO; Non-Final Office Action dated Jul. 8, 2015 in U.S. Appl. No. 13/901,400.
USPTO; Final Office Action dated Jan. 14, 2016 in U.S. Appl. No. 13/901,400.
USPTO; Notice of Allowance dated Aug. 5, 2015 in U.S. Appl. No. 13/901,372.
USPTO; Non-Final Office Action dated Apr. 24, 2014 in U.S. Appl. No. 13/912,666.
USPTO; Final Office Action dated Sep. 25, 2014 in U.S. Appl. No. 13/912,666.
USPTO; Non-Final Office Action dated Jan. 26, 2015 in U.S. Appl. No. 13/912,666.
USPTO; Notice of Allowance dated Jun. 25, 2015 in U.S. Appl. No. 13/912,666.
USPTO; Non-Final Office Action dated Dec. 16, 2014 in U.S. Appl. No. 13/915,732.
USPTO; Final Office Action dated Apr. 10, 2015 in U.S. Appl. No. 13/915,732.
USPTO; Notice of Allowance dated Jun. 19, 2015 in U.S. Appl. No. 13/915,732.
USPTO; Notice of Allowance dated Mar. 17, 2015 in U.S. Appl. No. 13/923,197.
USPTO; Non-Final Office Action dated Sep. 12, 2014 in U.S. Appl. No. 13/941,134.
USPTO; Notice of Allowance dated Jan. 20, 2015 in U.S. Appl. No. 13/941,134.
USPTO; Restriction Requirement dated Apr. 30, 2015 in U.S. Appl. No. 13/941,216.
USPTO; Non-Final Office Action dated Jul. 30, 2015 in U.S. Appl. No. 13/941,216.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Non-Final Office Action dated Jun. 29, 2015 in U.S. Appl. No. 13/966,782.
USPTO; Final Office Action dated Jan. 4, 2016 in U.S. Appl. No. 13/966,782.
USPTO; Notice of Allowance dated Oct. 7, 2015 in U.S. Appl. No. 13/973,777.
USPTO; Non-Final Office Action dated Feb. 20, 2015 in U.S. Appl. No. 14/018,231.
USPTO; Notice of Allowance dated Jul. 20, 2015 in U.S. Appl. No. 14/018,231.
USPTO; Restriction Requirement Action dated Jan. 28, 2015 in U.S. Appl. No. 14/018,345.
USPTO; Non-Final Office Action dated Apr. 7, 2015 in U.S. Appl. No. 14/018,345.
USPTO; Final Office Action dated Sep. 14, 2015 in U.S. Appl. No. 14/018,345.
USPTO; Notice of Allowance dated Jan. 14, 2016 in U.S. Appl. No. 14/018,345.
USPTO; Notice of Allowance dated Mar. 17, 2016 in U.S. Appl. No. 14/018,345.
USPTO; Non-Final Office Action dated Mar. 26, 2015 in U.S. Appl. No. 14/031,982.
USPTO; Final Office Action dated Aug. 28, 2015 in U.S. Appl. No. 14/031,982.
USPTO; Notice of Allowance dated Nov. 17, 2015 in U.S. Appl. No. 14/031,982.
USPTO; Non-Final Office Action dated Apr. 28, 2015 in U.S. Appl. No. 14/040,196.
USPTO; Notice of Allowance dated Sep. 11, 2015 in U.S. Appl. No. 14/040,196.
USPTO; Non-Final Action dated Dec. 3, 2015 in U.S. Appl. No. 14/050,150.
USPTO; Non-Final Office Action dated Dec. 15, 2014 in U.S. Appl. No. 14/065,114.
USPTO; Final Office Action dated Jun. 19, 2015 in U.S. Appl. No. 14/065,114.
USPTO; Non-Final Office Action dated Oct. 7, 2015 in U.S. Appl. No. 14/065,114.
USPTO; Notice of Allowance dated Feb. 22, 2016 in U.S. Appl. No. 14/065,114.
USPTO; Non-Final Office Action dated Nov. 14, 2014 in U.S. Appl. No. 14/069,244.
USPTO; Notice of Allowance dated Mar. 25, 2015 in U.S. Appl. No. 14/069,244.
USPTO; Non-Final Office Action dated Sep. 9, 2015 in U.S. Appl. No. 14/090,750.
USPTO; Final Office Action dated Feb. 11, 2016 U.S. Appl. No. 14/090,750.
USPTO; Non-Final Office Action dated Mar. 19, 2015 in U.S. Appl. No. 14/079,302.
USPTO; Final Office Action dated Sep. 1, 2015 in U.S. Appl. No. 14/079,302.
USPTO; Non-Final Office Action dated Mar. 19, 2015 in U.S. Appl. No. 14/166,462.
USPTO; Notice of Allowance dated Sep. 3, 2015 in U.S. Appl. No. 14/166,462.
USPTO; Non-Final Office Action dated Nov. 17, 2015 in U.S. Appl. No. 14/172,220.
USPTO; Office Action dated May 29, 2014 in U.S. Appl. No. 14/183,187.
USPTO; Final Office Action dated Nov. 7, 2014 in U.S. Appl. No. 14/183,187.
USPTO; Non-Final Office Action dated Mar. 16, 2015 in U.S. Appl. No. 14/183,187.
USPTO; Final Office Action dated Jul. 10, 2015 in U.S. Appl. No. 14/183,187.
USPTO; Non-Final Office Action dated Jan. 11, 2016 in U.S. Appl. No. 14/188,760.
USPTO; Non-Final Office Action dated Oct. 8, 2015 in U.S. Appl. No. 14/218,374.
USPTO; Final Office Action dated Feb. 23, 2016 in U.S. Appl. No. 14/218,374.
USPTO; Non-Final Office Action dated Sep. 22, 2015 in U.S. Appl. No. 14/219,839.
USPTO; Non-Final Office Action dated Nov. 25, 2015 in U.S. Appl. No. 14/219,879.
USPTO; Final Office Action dated Mar. 25, 2016 in U.S. Appl. No. 14/219,839.
USPTO; Non-Final Office Action dated Sep. 18, 2015 in U.S. Appl. No. 14/244,689.
USPTO; Notice of Allowance dated Feb. 11, 2016 in U.S. Appl. No. 14/244,689.
USPTO; Non-Final Office Action dated Oct. 7, 2015 in U.S. Appl. No. 14/246,969.
USPTO; Non-Final Office Action dated Nov. 20, 2015 in U.S. Appl. No. 14/260,701.
USPTO; Non-Final Office Action dated Aug. 19, 2015 in U.S. Appl. No. 14/268,348.
USPTO; Non-Final Office Action dated Jan. 6, 2016 in U.S. Appl. No. 14/268,348.
USPTO; Non-Final Office Action dated Oct. 20, 2015 in U.S. Appl. No. 14/281,477.
USPTO1; Notice of Allowance dated Feb. 23, 2016 in U.S. Appl. No. 14/327,134.
USPTO; Non-Final Office Action dated Feb. 12, 2015 in U.S. Appl. No. 14/457,058.
USPTO; Final Office Action dated Jul. 14, 2015 in U.S. Appl. No. 14/457,058.

(56) References Cited

OTHER PUBLICATIONS

USPTO; Non-Final Office Action dated Nov. 6, 2015 in U.S. Appl. No. 14/457,058.
USPTO; Non-Final Office Action dated Nov. 24, 2015 in U.S. Appl. No. 14/498,036.
USPTO; Final Office Action dated Apr. 5, 2016 in U.S. Appl. No. 14/498,036.
USPTO; Non-Final Office Action dated Apr. 10, 2015 in U.S. Appl. No. 14/505,290.
USPTO; Notice of Allowance dated Aug. 21, 2015 in U.S. Appl. No. 14/505,290.
USPTO; Non-Final Office Action dated Jan. 16, 2015 in U.S. Appl. No. 14/563,044.
USPTO; Final Office Action dated Jul. 16, 2015 in U.S. Appl. No. 14/563,044.
USPTO; Notice of Allowance dated Oct. 15, 2015 in U.S. Appl. No. 14/563,044.
USPTO; Notice of Allowance dated Dec. 2, 2015 in U.S. Appl. No. 14/563,044.
USPTO; Non-Final Office Action dated Oct. 1, 2015 in U.S. Appl. No. 14/571,126.
USPTO; Final Office Action dated Feb. 22, 2016 in U.S. Appl. No. 14/571,126.
USPTO; Non-Final Office Action dated Nov. 25, 2015 in U.S. Appl. No. 14/598,532.
USPTO; Non-Final Office Action dated Jan. 15, 2016 in U.S. Appl. No. 14/606,364.
USPTO; Non-Final Office Action dated Mar. 3, 2016 in U.S. Appl. No. 14/622,603.
USPTO; Non-Final Office Action dated Mar. 21, 2016 in U.S. Appl. No. 14/659,152.
USPTO; Final Office Action dated Mar. 17, 2016 in U.S. Appl. No. 14/659,437.
USPTO;Notice of Allowance dated Mar. 25, 2016 in U.S. Appl. No. 14/693,138.
USPTO; Non-Final Office Action dated Mar. 30, 2016 in U.S. Appl. No. 14/808,979.
USPTO; Non-Final Office Action dated Mar. 22, 2016 in U.S. Appl. No. 14/987,420.
USPTO; Non-Final Office Action dated Mar. 16, 2015 in U.S. Appl. No. 29/447,298.
USPTO; Notice of Allowance dated Jul. 6, 2015 in U.S. Appl. No. 29/447,298.
USPTO; Notice of Allowance dated Nov. 26, 2014 in U.S. Appl. No. 29/481,301.
USPTO; Notice of Allowance dated Feb. 17, 2015 in U.S. Appl. No. 29/481,308.
USPTO; Notice of Allowance dated Jan. 12, 2015 in U.S. Appl. No. 29/481,312.
USPTO; Notice of Allowance dated Apr. 30, 2015 in U.S. Appl. No. 29/481,315.
USPTO; Notice of Allowance dated May 11, 2015 in U.S. Appl. No. 29/511,011.
USPTO; Notice of Allowance dated May 11, 2015 in U.S. Appl. No. 29/514,153.
USPTO; Notice of Allowance dated Dec. 14, 2015 in U.S. Appl. No. 29/514,264.
PCT; International Search report and Written Opinion dated Nov. 12, 2010 in Application No. PCT/US2010/030126.
PCT; International Preliminary Report on Patentability dated Oct. 11, 2011 Application No. PCT/US2010/030126.
PCT; International Search report and Written Opinion dated Jan. 20, 2011 in Application No. PCT/US2010/045368.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 in Application No. 201080015699.9.
Chinese Patent Office; Office Action dated Jan. 12, 2015 in Application No. 201080015699.9.
Chinese Patent Office; Office Action dated May 24, 2013 in Application No. 201080036764.6.
Chinese Patent Office; Office Action dated Jan. 2, 2014 in Application No. 201080036764.6.
Chinese Patent Office; Office Action dated Jul. 1, 2014 in Application No. 201080036764.6.
Chinese Patent Office; Office Action dated Feb. 8, 2014 in Application No. 201110155056.
Chinese Patent Office; Office Action dated Sep. 16, 2014 in Application No. 201110155056.
Chinese Patent Office; Office Action dated Feb. 9, 2015 in Application No. 201110155056.
Japanese Patent Office; Office Action dated Jan. 25, 2014 in Application No. 2012-504786.
Japanese Patent Office; Office Action dated Dec. 1, 2014 in Application No. 2012-504786.
Korean Patent Office; Office Action dated Dec. 10, 2015 in Application No. 10-2010-0028336.
Taiwan Patent Office; Office Action dated Jul. 4, 2014 in Application No. 099110511.
Taiwan Patent Office; Office Action dated Dec. 19, 2014 in Taiwan Application No. 099127063.
Bearzotti, et al., "Fast Humidity Response of a Metal Halide-Doped Novel Polymer," Sensors and Actuators B, 7, pp. 451-454, (1992).
Bhatnagar et al., "Copper Interconnect Advances to Meet Moore's Law Milestones," Solid State Technology, 52, 10 (2009).
Buriak, "Organometallic Chemistry on Silicon and Germanium Surfaces," Chemical Reviews, 102, 5 (2002).
Cant et al., "Chemisorption Sites on Porous Silica Glass and on Mixed-Oxide Catalysis," Can. J. Chem. 46, 1373 (1968).
Chang et al. "Small-Subthreshold-Swing and Low-Voltage Flexible Organic Thin-Film Transistors Which Use HfLaO as the Gate Dielectric," IEEE Electron Device Letters, 30, 2, IEEE Electron Device Society 133-135 (2009).
Chen et al., "A Self-Aligned Airgap Interconnect Scheme," IEEE International Interconnect Technology Conference, 1-3, 146-148 (2009).
Choi et al., "Improvement of Silicon Direct Bonding using Surfaces Activated by Hydrogen Plasma Treatment," Journal of the Korean Physical Society, 37, 6, 878-881 (2000).
Choi et al., "Low Temperature Formation of Silicon Oxide Thin Films by Atomic Layer Deposition Using NH3/O2 Plasma," ECS Solid State Letters, 2(12) 114-116 (2013).
Crowell, "Chemical methods of thin film deposition: Chemical vapor deposition, atomic layer deposition, and related technologies," Journal of Vacuum Science & Technology A 21.5, S88-S95 (2003).
Cui et al., "Impact of Reductive N2/H2 Plasma on Porous Low-Dielectric Constant SiCOH Thin Films," Journal of Applied Physics 97, 113302, 1-8 (2005).
Dingemans et al., "Comparison Between Aluminum Oxide Surface Passivation Films Deposited with Thermal Aid," Plasma Aid and Pecvd, 35th IEEE PVCS, Jun. 2010.
Drummond et al., "Hydrophobic Radiofrequency Plasma-Deposited Polymer Films: Dielectric Properties and Surface Forces," Colloids and Surfaces A, 129-130, 117-129 (2006).
Easley et al., "Thermal Isolation of Microchip Reaction Chambers for Rapid Non-Contact DNA Amplification," J. Micromech. Microeng. 17, 1758-1766 (2007).
Ge et al., "Carbon Nanotube-Based Synthetic Gecko Tapes," Department of Polymer Science, PNAS, 10792-10795 (2007).
George et al., "Atomic Layer Deposition: An Overview," Chem. Rev. 110, 111-131 (2010).
Grill et al., "The Effect of Plasma Chemistry on the Damage Induced Porous SiCOH Dielectrics," IBM Research Division, RC23683 (W0508-008), Materials Science, 1-19 (2005).
Gupta et al., "Conversion of Metal Carbides to Carbide Derived Carbon by Reactive Ion Etching in Halogen Gas," Proceedings of SPIE—The International Society for Optical Engineering and Nanotechnologies for Space Applications, ISSN: 0277-786X (2006).

(56) References Cited

OTHER PUBLICATIONS

Heo et al., "Structural Characterization of Nanoporous Low-Dielectric Constant SiCOH Films Using Organosilane Precursors," NSTI-Nanotech, vol. 4, 122-123 (2007).
H.J. Yun et al., "Comparison of Atomic Scale Etching of Poly-Si in Inductively Coupled Ar and He Plasmas," Korean Journal of Chemical Engineering, 24, 670-673 (2007).
Jung et al., "Double Patterning of Contact Array with Carbon Polymer," Proc. of SPIE, 6924, 69240C, 1-10 (2008).
Katamreddy et al., "ALD and Characterization of Aluminum Oxide Deposited on Si(100) using Tris(diethylamino) Aluminum and Water Vapor," Journal of the Electrochemical Society, 153 (10) C701-C706 (2006).
Kim et al., "Passivation Effect on Low-k S/OC Dielectrics by H2 Plasma Treatment," Journal of the Korean Physical Society, 40, 1, 94-98 (2002).
Kim et al., "Characteristics of Low Tempemure High Quality Silicon Oxide by Plasma Enhanced Atomic Layer Deposition with In-Situ Plasma Densification Process," The Electrochemical Society, ECS Transactions, College of Information and Communication Engineerign, Sungkyunkwan University, 53(1), 321-329 (2013).
King, Plasma Enhanced Atomic Layer Deposition of SiNx: H and SiO2, J. Vac. Sci. Technol., A29(4) (2011).
Kobayshi et al. "Temperature Dependence of SiO2 Film Growth with Plasma-Enhanced Atomic Layer Deposition," International Journal on the Science and Technology of Condensed Matter, 520, 3994-3998, (2012).
Koo et al., "Characteristics of Al2O3 Thin Films Deposited Using Dimethylaluminum Isopropoxide and Trimethylaluminum Precursors by the Plasma-Enhanced Atomic-Layer Deposition Method," Journal of Physical Society, 48, 1, 131-136 (2006).
Koutsokeras et al. Texture and Microstructure Evolution in Single-Phase TixTal-xN Alloys of Rocksalt Structure. Journal of Applied Physics, 110, 043535-1-043535-6, (2011).
Krenek et al. "IR Laser CVD of Nanodisperse Ge—Si—Sn Alloys Obtained by Dielectric Breakdown of GeH4/SiH4/SnH4 Mixtures", NanoCon, Brno, Czech Republic, EU (2014).
Kurosawa et al., "Synthesis and Characterization of Plasma-Polymerized Hexamethyldisiloxane Films," Thin Solid Films, 506-507, 176-179 (2006).
Lieberman, et al., "Principles of Plasma Discharges and Materials Processing," Second Edition, 368-381.
Lim et al., "Low-Temperature Growth of SiO2 Films by Plasma-Enhanced Atomic Layer Deposition," ETRI Journal, 27 (1), 118-121 (2005).
Liu et al., "Research, Design, and Experimen of End Effector for Wafer Transfer Robot," Industrial Robot: An International Journal, 79-91 (2012).
Mackus et al., "Optical Emission Spectroscopy as a Tool for Studying Optimizing, and Monitoring Plasma-Assisted Atomic Layer Deposition Processes," Journal of Vacuum Science and Technology, 77-87 (2010).
Maeno, "Gecko Tape Using Carbon Nanotubes," Nitto Denko Gihou, 47, 48-51.
Maeng et al., "Electrical properties of atomic layer disposition Hf02 and HfOxNy on Si Substrates with Various Crystal Orientations," Journal of the Electrochemical Society, 155, Department of Materials Science and Engineering, Pohang University of Science and Technology, H267-H271 (2008).
Marsik et al., "Effect of Ultraviolet Curing Wavelength on Low-k Dielectric Material Properties and Plasma Damage Resistance," Sciencedirect.com, 519, 11, 3619-3626 (2011).
Moeen, "Design, Modelling and Characterization of Si/SiGe Structures for IR Bolometer Applications," KTH Royal Institute of Technology. Information and Communication Technology, Department of Integrated Devices and Circuits, Stockholm Sweden (2015).
Morishige et al., "Thermal Desorption and Infrared Studies of Ammonia Amines and Pyridines Chemisorbed on Chromic Oxide," J.Chem. Soc., Faraday Trans. 1, 78, 2947-2957 (1982).
Mukai et al., "A Study of CD Budget in Spacer Patterning Technology," Proc. of SPIE, 6924, 1-8 (2008).
Nogueira et al., "Production of Highly Hydrophobic Films Using Low Frequency and High Density Plasma," Revista Brasileira de Aplicacoes de Vacuo, 25(1), 45-53 (2006).
Novaro et al., "Theoretical Study on a Reaction Pathway of Ziegler-Natta-Type Catalysis," J. Chem. Phys. 68(5), 2337-2351 (1978).
Radamson et al.,"Growth of Sn-alloyed Group IV Materials for Photonic and Electronic Applications", Manufacturing Nano Structures, 5, 129-144.
Schmatz et al., "Unusual Isomerization Reactions in 1.3-Diaza-2-Silcyclopentanes," Organometallics, 23, 1180-1182 (2004).
Scientific and Technical Information Center EIC 2800 Search Report dated Feb. 16, 2012.
S.D. Athavale et al., "Realization of Atomic Layer Etching of Silicon", Journal of Vacuum Science and Technology B, 14, 3702-3705 (1996).
Sham Ma et al., "PDL Oxide Enabled Doubling," Proc. of SPIE, 6924, 69240D, 1-10 (2008).
Varma, et al., "Effect of Metal Halides on Thermal, Mechanical, and Electrical Properties of Polypyromelitimide Films," Journal of Applied Polymer Science, 32, 3987-4000, (1986).
Wirths, et al, "SiGeSn Growth tudies Using Reduced Pressure Chemical Vapor Deposition Towards Optoeleconic Applications," This Soid Films, 557, 183-187 (2014).
Yun et al., "Behavior of Various Organosilicon Molecules in PECVD Processes for Hydrocarbon-Doped Silicon Oxide Films," Solid State Phenomena, 124-126, 347-350 (2007).

* cited by examiner

METHOD FOR FORMING TI-CONTAINING FILM BY PEALD USING TDMAT OR TDEAT

BACKGROUND OF THE INVENTION

Field of the Invention

The present invention generally relates to a method for forming a Ti-containing film by plasma enhanced atomic layer deposition (PEALD) using tetrakis(dimethylamino) titanium (TDMAT) and/or tetrakis(diethylamino)titanium (TDEAT).

Description of the Related Art

Ti-based films have been formed for a long time by sputtering method, PVD method, and CVD method, and, for example, TiN films having low sheet resistance have been commercially used as copper-diffusion blocking films. In addition, with recent shrinkage of device nodes, spacer-defined double patterning (SDDP) has gradually started being used as a technology for miniaturization, and TiO and TiN are considered to be good candidates for hard masks for SDDP. For the SDDP hard masks, conformal films having good step coverage are required in view of the nature of the hard masks, and therefore those skilled in the art have used and evaluated TiO- and TiN-based conformal films which are formed by the ALD method which generally provides good step coverage. In particular, TiN generally has difficulty controlling stress and it is likely to become strongly compressive, and thus controlling stress is one of the challenges. Furthermore, due to the miniaturiation of device nodes, it has been difficult to form conformal films having good step coverage by conventional methods such as sputtering method, PVD method, and CVD method, and thus, as an alternative method, a method of forming films having good step coverage and low sheet resistance has come into demand.

SUMMARY OF THE INVENTION

According to some embodiments of the present invention, in using tetrakis(dimethylamino)titanium (TDMAT) or tetrakis(diethylamino)titanium (TDEAT) as a precursor for plasma enhanced atomic layer deposition (PEALD), merely by changing a reactant gas, various types of film such as TiN, TiCN, TiO, TiON, and TiOCN films can be formed, and also, film quality of each film which is typical to the film can be controlled. In some embodiments, no ammonia is used simultaneously with TDMAT or TDEAT, so that although TDMAT or TDEAT is highly reactive to ammonia, reaction between the precursor and ammonia used together with the precursor can be avoided.

Among the various types of film, TiN films and thermally-annealed TiO films may be constituted by crystalline components. TiCN films may be constituted by a mixture of crystalline and amorphous components, and if the carbon content of TiCN films is high, the films are constituted entirely by amorphous components. Other types of films are constituted by amorphous components. In forming TiN and TiCN films, a nitrogen-supplying gas is often used for nitridation. However, in some embodiments, in forming TiN films, ammonia which is a nitrogen-supplying gas is not used, but hydrogen is used as a reactant gas, thereby forming TiN films by using nitrogen contained in the precursor itself. In some embodiments, only hydrogen gas is used as the reactant gas for forming TiN films. In some embodiments, nitrogen gas may be used; however, the nitrogen gas is essentially not used as a nitrogen-supplying gas but is used for controlling carbon concentration, film stress, and/or sheet resistance. Thus, some embodiments are characterized in that TiN films can be formed using the precursor which is a methylamine species having nitrogen-titanium bonds, and by combining hydrogen flow, nitrogen flow, and/or RF power as parameters with other film-forming conditions, the film quantity can effectively be controlled.

Any discussion of problems and solutions involved in the related art has been included in this disclosure solely for the purposes of providing a context for the present invention, and should not be taken as an admission that any or all of the discussion were known at the time the invention was made.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

Figure 1:
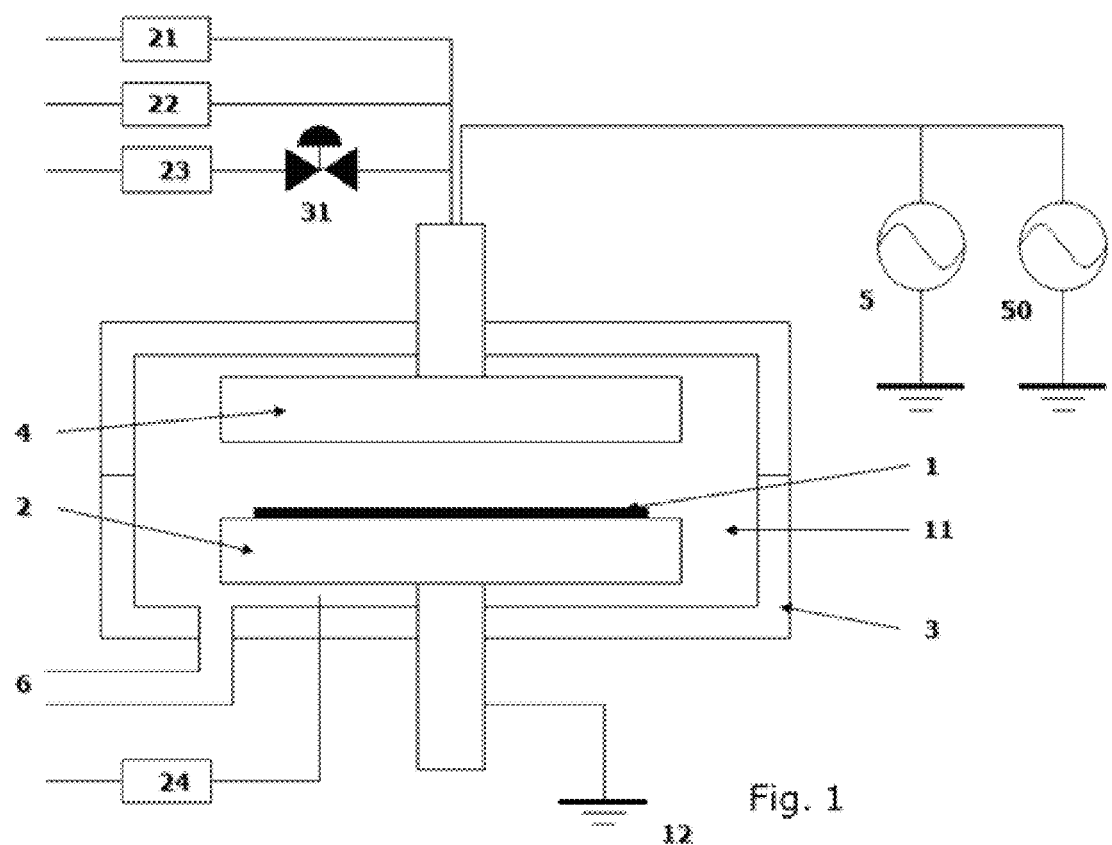
FIG. 1 is a schematic representation of a PEALD apparatus for depositing a dielectric film usable in an embodiment of the present invention.

In this disclosure, "gas" may include vaporized solid and/or liquid and may be constituted by a single gas or a mixture of gases. Likewise, an article "a" or "an" refers to a species or a genus including multiple species. In this disclosure, a process gas such as a precursor gas and a reactant gas is introduced to a reaction chamber through a showerhead and may be comprised of, consist essentially of, or consist of an active gas and an inert gas. That is, in this disclosure, a "precursor gas" may be introduced with a carrier gas such as a rare gas, and likewise, a "reactant gas" may be introduced with a carrier gas such as a rare gas. Alternatively, the precursor or the reactant gas may consist of an active gas. A rare gas can be introduced intermittently or continuously through a showerhead as a purge gas. A gas other than the process gas, i.e., a gas introduced without passing through the showerhead, may be used for, e.g., sealing the reaction space, which includes a seal gas such as a rare gas. In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers. Further, in this disclosure, any two numbers of a variable can constitute an workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

In this disclosure, any defined meanings do not necessarily exclude ordinary and customary meanings in some embodiments.

In some embodiments, a method for forming a Ti-containing film on a substrate by plasma-enhanced atomic layer deposition (PEALD) using tetrakis(dimethylamino)titanium (TDMAT) or tetrakis(diethylamino)titanium (TDEAT), comprises: (i) introducing TDMAT and/or TDEAT in a pulse to a reaction space where a substrate is placed; (ii) continuously introducing a $NH_3$-free reactant gas to the reaction space; (iii) applying RF power in a pulse to the reaction space wherein the pulse of TDMAT and/or TDEAT and the pulse of RF power do not overlap; and (iv) repeating steps (i) to (iii) to deposit a Ti-containing film on the substrate.

In some embodiments, TDMAT and TDEAT may include derivatives equivalent thereto, wherein methyl groups and ethyl groups can interchangeably be used.

In the above, "continuously" refers to without breaking a vacuum, without interruption as a timeline, without changing treatment conditions, or immediately thereafter in some embodiments.

In some embodiments, the $NH_3$-free reactant gas is $H_2$ and/or $N_2$. In some embodiments, the $NH_3$-free reactant gas contains none of nitrogen, oxygen, and carbon. In some embodiments, the $NH_3$-free reactant gas consists of $H_2$ and a rare gas (e.g., He, Ar), thereby depositing a TiN crystalline film as the Ti-containing film in step (iv). Alternatively, in some embodiments, the $NH_3$-free reactant gas consists of $H_2$, $N_2$, and a rare gas (e.g., He, Ar), thereby depositing a TiCN amorphous film as the Ti-containing film in step (iv). Alternatively, in some embodiments, the $NH_3$-free reactant gas comprises oxygen, thereby forming a TiO film as the Ti-containing film in step (iv). In some embodiments, the method further comprises annealing the Ti-containing film on the substrate in an atmosphere of oxygen after step (iv), so as to form a TiO film having an anatase crystal as the Ti-containing film in step (iv) wherein the amorphous TiO is changed to anatase crystals. The TiO film having an anatase crystal exhibits photocatalytic activity. After annealing, the surface of the TiO film obtains hydrophilicity, which is superhydrophilicity unique to TiO photocatalysis.

Figure 5:
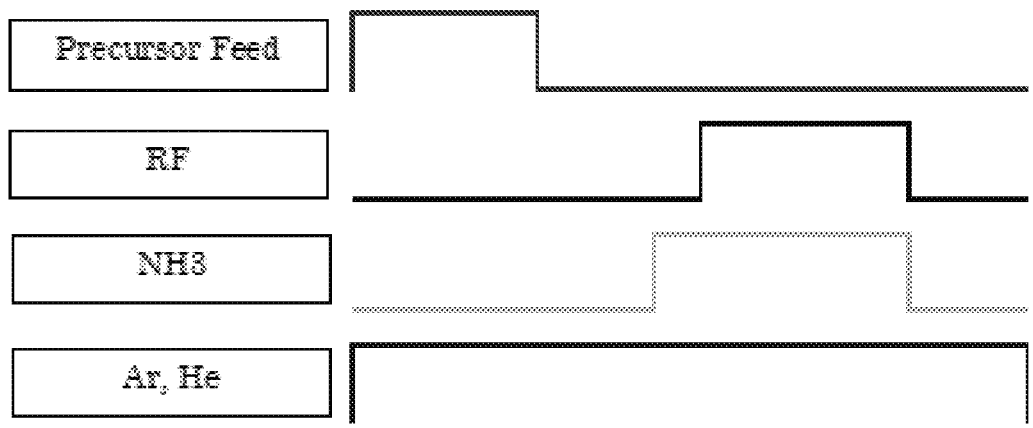
FIG. 5 shows process steps of a PEALD method for depositing a dielectric film using ammonia as a reactant gas according to an embodiment of the present invention.
Figure 6:
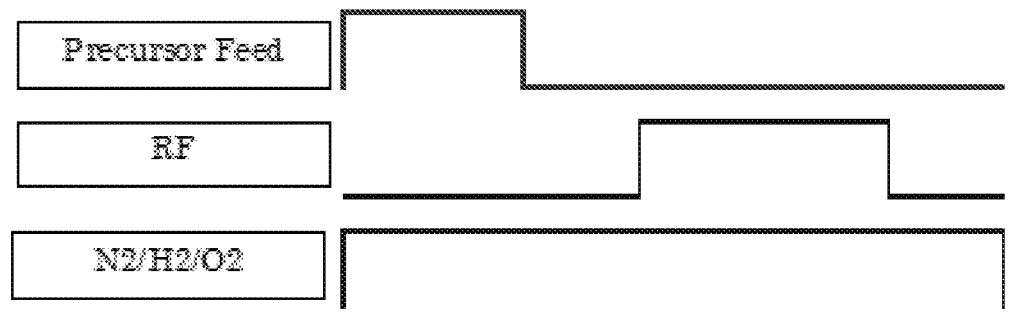
FIG. 6 shows process steps of a PEALD method for depositing a dielectric film according to some embodiments of the present invention.
Figure 7:
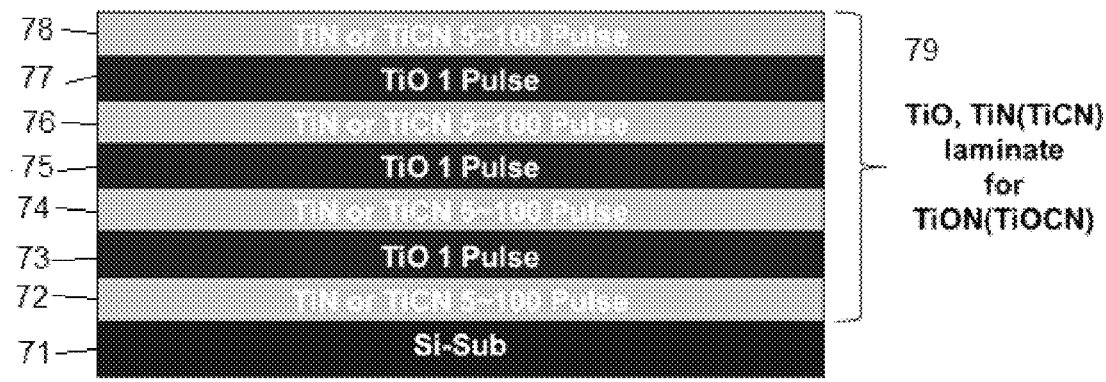
FIG. 7 is a schematic illustration showing a laminate structure of a TiON or TiOCN film consisting of TiN and TiO films or TiCN and TiO films according to an embodiment of the present invention.

In some embodiments, the $NH_3$-free reactant gas is comprised of a reactant gas containing no oxygen and a reactant gas containing oxygen, and in step (iv), when steps (i) to (iii) are repeated, the $NH_3$-free oxygen-free reactant gas and the $NH_3$-free oxygen-containing gas are alternately used at set intervals. For example, the $NH_3$-free oxygen-free reactant gas is hydrogen gas without nitrogen gas, and the $NH_3$-free oxygen-containing gas is oxygen gas, thereby forming a TiON film consisting of TiO films and TiN films deposited alternately at set intervals. Alternatively, in some embodiments, the $NH_3$-free oxygen-free reactant gas is hydrogen gas and nitrogen gas, and the $NH_3$-free oxygen-containing gas is oxygen gas thereby forming a TiOCN film consisting of TiO films and TiCN films deposited alternately at set intervals. FIG. 7 is a schematic illustration showing a laminate structure of a TiON or TiOCN film 79 consisting of TiN or TiCN films 72, 74, 76, 78 and TiO films 73, 75, 77 formed on a substrate 71 according to an embodiment of the present invention. In this embodiment, first, a cycle of forming a TiN or TiCN sub-layer is performed 5 to 100 times to form the TiN or TiCN film 72 on the substrate 71, and then, a cycle of forming a TiO sub-layer is performed once to form the TiO film 73 on top of the TiN or TiCN film 72. Likewise, the TiN or TiCN film 74, the TiO film 75, the TiN or TiCN film 76, the TiO film 77, and the TiN or TiCN film 78 are deposited in this order to form the laminate 79. In some embodiments, the number of cycles of forming a TiO film is significantly less than that of cycles of forming a TiN or TiCN film, i.e., the thickness of TiO film is significantly less than that of TiN or TiCN film. In some embodiments, the number of laminates (each laminate constituted by a single TiN/TiCN film, which film may be comprised of one or more TiN/TiCN sub-layers, and a single TiO film, which film may be comprised of one or more TiO sub-layers) is about 3 to 200, typically 5 to 100. In some embodiments, the ratio of the number of cycles of forming a TiO film to that of cycles of forming a TiN/TiCN film in one laminate may be 1:1 to 1:200, typically 1:3 to 1:100, more typically 1:5 to 1:25. Further, FIG. 5 shows process steps of a PEALD method for depositing a dielectric film using ammonia as a reactant gas. FIG. 6 shows process steps of a PEALD method for depositing a dielectric film according to some embodiments of the present invention. In the embodiments illustrated in FIG. 6, because no ammonia is used as a reactant gas, the reactant gas (nitrogen, hydrogen, and/or oxygen) can continuously be supplied, and can also function as a purge gas between the pulse of the precursor feed and the pulse of RF power application. In the above, the reactant gas is supplied together with a rare gas (not shown) used as a carrier gas. In contrast, in FIG. 5, because ammonia is used as the reactant gas, the reactant gas must be supplied in a pulse different from the pulse of the precursor feed, which must not overlap each other, requiring a more complicated control system.

In this disclosure, TiN, TiON, TiCN, TiOCN, TiO films, and other Ti-containing film refer to films whose matrixes are constituted substantially or predominantly by the above indicated elements, but do not exclude impurities, unsubstantial elements such as hydrogen, and unsubstantial amounts of material elements, or refer to films characterized mainly by the indicated elements, films represented by the indicated elements, or films which a skilled artisan in the art would so recognize.

In some embodiments, a TiN film can be formed under conditions shown in Table 1 below. Since ALD is a self-limiting adsorption reaction process, the amount of deposited precursor molecules is determined by the number of reactive surface sites and is independent of the precursor exposure after saturation, and a supply of the precursor is such that the reactive surface sites are saturated thereby per cycle.

TABLE 1

(the numbers are approximate)

| | Preferably | Typically |
|---|---|---|
| Precursor flow | 1 sccm to 100 sccm | 0.1 sccm to 500 sccm |
| Carrier gas flow (continuous) | Ar; 500 sccm to 3,000 sccm | Ar; 200 sccm to 10,000 sccm |
| Reactant gas flow (continuous) | $H_2$; 50 sccm to 1,000 sccm | $H_2$; 10 sccm to 5,000 sccm |
| Purge gas flow (continuous) | Ar; 500 sccm to 2,000 sccm | Ar; 100 sccm to 5,000 sccm |
| Substrate temperature | 150° C. to 210° C. | 70° C. to 250° C. |
| RF power (13.56 MHz) | 200 W to 1,000 W | 50 W to 2,000 W |
| Precursor supply time | 0.2 sec. to 2 sec. | 0.1 sec. to 5 sec. |
| Purge time after precursor pulse | 0.2 sec. to 2 sec. | 0.1 sec. to 5 sec. |
| RF plasma exciting time | 0.2 sec. to 5 sec. | 0.1 sec.to 10 sec. |
| Purge time after RF application | 0.1 sec. to 1 sec. | 0.1 sec. to 2 sec. |
| Number of cycles | 5 to 1,000 | 1 to 5,000 |

In some embodiments, a TiCN film can be formed under conditions shown in Table 2 below.

TABLE 2

(the numbers are approximate)

| | Preferably | Typically |
|---|---|---|
| Precursor flow | 1 sccm to 100 sccm | 0.1 sccm to 500 sccm |
| Carrier gas flow (continuous) | Ar; 500 sccm to 3,000 sccm | Ar; 200 sccm to 10,000 sccm |
| Reactant gas flow (continuous) | $H_2$; 0 sccm to 500 sccm | $H_2$; 0 sccm to 1,000 sccm |
| Reactant gas flow (continuous) | $N_2$; 50 sccm to ,2000 sccm | $N_2$; 0 sccm to 5,000 sccm |
| Purge gas flow (continuous) | Ar; 500 sccm to 2,000 sccm | Ar; 100 sccm to 5,000 sccm |
| Substrate temperature | 150° C. to 210° C. | 70° C. to 250° C. |
| RF power (13.56 MHz) | 200 W to 1,000 W | 50 W to 2,000 W |
| Precursor supply time | 0.2 sec. to 2 sec. | 0.1 sec. to 5 sec. |
| Purge time after precursor pulse | 0.2 sec. to 2 sec. | 0.1 sec. to 5 sec. |
| RF plasma exciting time | 0.2 sec. to 5 sec. | 0.1 sec. to 10 sec. |
| Purge time after RF application | 0.1 sec. to 1 sec. | 0.1 sec. to 2 sec. |
| Number of cycles | 5 to 1,000 | 1 to 5,000 |

In some embodiments, a TiON film can be formed under conditions shown in Table 4 below.

TABLE 4

(the numbers are approximate)

| | | Preferably | Typically |
|---|---|---|---|
| TiN film formation cycle (one layer) | Precursor flow | 1 sccm to 100 sccm | 0.1 sccm to 500 sccm |
| | Carrier gas flow (continuous) | Ar; 500 sccm to 3,000 sccm | Ar; 200 sccm to 10,000 sccm |
| | Reactant gas flow (continuous) | $H_2$; 50 sccm to 1,000 sccm | $H_2$; 10 sccm to 5,000 sccm |
| | Purge gas flow (continuous) | Ar; 500 sccm to 2,000 sccm | Ar; 100 sccm to 5,000 sccm |
| | Substrate temperature | 150° C. to 210° C. | 70° C. to 250° C. |
| | RF power (13.56 MHz) | 200 W to 1,000 W | 50 W to 2,000 W |
| | Precursor supply time | 0.2 sec. to 2 sec. | 0.1 sec. to 5 sec. |
| | Purge time after precursor pulse | 0.2 sec. to 2 sec. | 0.1 sec. to 5 sec. |
| | RF plasma exciting time | 0.2 sec. to 5 sec. | 0.1 sec. to 10 sec. |
| | Purge time after RF application | 0.1 sec. to 1 sec. | 0.1 sec. to 2 sec. |
| | Number of cycles | 5 to 50 | 2 to 100 |
| TiO film formation cycle (one layer) | Precursor flow | 1 sccm to 100 sccm | 0.1 sccm to 500 sccm |
| | Carrier gas flow (continuous) | Ar; 500 sccm to 3,000 sccm | Ar; 200 sccm to 10,000 sccm |
| | Reactant gas flow (continuous) | $O_2$; 50 sccm to 2,000 sccm | $O_2$; 20 sccm to 5,000 sccm |
| | Purge gas flow (continuous) | Ar; 500 sccm to 2,000 sccm | Ar; 100 sccm to 5,000 sccm |
| | Substrate temperature | 150° C. to 210° C. | 70° C. to 250° C. |
| | RF power (13.56 MHz) | 50 W to 1,000 W | 10 W to 2,000 W |
| | Precursor supply time | 0.2 sec. to 2 sec. | 0.1 sec. to 5 sec. |
| | Purge time after precursor pulse | 0.2 sec. to 2 sec. | 0.1 sec. to 5 sec. |
| | RF plasma exciting time | 0.2 sec. to 5 sec. | 0.1 sec. to 10 sec. |
| | Purge time after RF application | 0.1 sec. to 1 sec. | 0.1 sec. to 2 sec. |
| | Number of cycles | 1 to 5 | 1 to 10 |
| Total number of layers | | 10 to 1,000 | 2 to 5,000 |

In some embodiments, a TiOCN film can be formed under conditions shown in Table 5 below.

TABLE 5

(the numbers are approximate)

| | | Preferably | Typically |
|---|---|---|---|
| TiCN film formation cycle (one layer) | Precursor flow | 1 sccm to 100 sccm | 0.1 sccm to 500 sccm |
| | Carrier gas flow (continuous) | Ar; 500 sccm to 3,000 sccm | Ar; 200 sccm to 10,000 sccm |
| | Reactant gas flow (continuous) | $H_2$; 0 sccm to 500 sccm | $H_2$; 0 sccm to 1,000 sccm |
| | Reactant gas flow (continuous) | $N_2$; 50 sccm to 2,000 sccm | $N_2$; 0 sccm to 5,000 sccm |
| | Purge gas flow (continuous) | Ar; 500 sccm to 2,000 sccm | Ar; 100 sccm to 5,000 sccm |
| | Substrate temperature | 70° C. to 150° C. | 50° C. to 200° C. |
| | RF power (13.56 MHz) | 200 W to 1,000 W | 50 W to 2,000 W |
| | Precursor supply time | 0.2 sec. to 2 sec. | 0.1 sec. to 5 sec. |
| | Purge time after precursor pulse | 0.2 sec. to 2 sec. | 0.1 sec. to 5 sec. |
| | RF plasma exciting time | 0.2 sec. to 5 sec. | 0.1 sec. to 10 sec. |
| | Purge time after RF application | 0.1 sec. to 1 sec. | 0.1 sec. to 2 sec. |
| | Number of cycles | 10 to 100 | 5 to 500 |
| TiO film formation cycle (one layer) | Precursor flow | 1 sccm to 100 sccm | 0.1 sccm to 500 sccm |
| | Carrier gas flow (continuous) | Ar; 500 sccm to 3,000 sccm | Ar; 200 sccm to 10,000 sccm |
| | Reactant gas flow (continuous) | $O_2$; 50 sccm to 2,000 sccm | $O_2$; 20 sccm to 5,000 sccm |
| | Purge gas flow (continuous) | Ar; 500 sccm to 2,000 sccm | Ar; 100 sccm to 5,000 sccm |
| | Substrate temperature | 70° C. to 150° C. | 50° C. to 200° C. |
| | RF power (13.56 MHz) | 20 W to 100 W | 10 W to 500 W |
| | Precursor supply time | 0.2 sec. to 2 sec. | 0.1 sec. to 5 sec. |
| | Purge time after precursor pulse | 0.2 sec. to 2 sec. | 0.1 sec. to 5 sec. |
| | RF plasma exciting time | 0.2 sec. to 5 sec. | 0.1 sec. to 10 sec. |
| | Purge time after RF application | 0.1 sec. to 1 sec. | 0.1 sec. to 2 sec. |
| | Number of cycles | 1 to 5 | 1 to 10 |
| Total number of layers | | 10 to 1000 | 2 to 5000 |

In some embodiments, the thickness of the Ti-containing film may be in a range of about 0.3 nm to about 60 nm, typically about 0.06 nm to about 300 nm, depending on the compositions of the films, the intended use of the films, etc.

In some embodiments, the TiO film is subjected to annealing under conditions shown in Table 6 below so as to form anatase crystals.

TABLE 6

(the numbers are approximate)

| | Preferably | Typically |
|---|---|---|
| Gas type | $O_2$ | Atmosphere, $O_2$, $N_2$, Ar, He, H2 |
| Gas flow (continuous) | 200 sccm to 1000 sccm | 0 sccm to 5000 sccm |
| Substrate temperature | 550° C. to 650° C. | 500° C. to 800° C. |
| Duration | 10 min. to 120 min. | 5 min. to 180 min. |

By conducting the annealing, anatase-type crystals, rutile-type crystals, or brookite-type crystals can be formed, depending on the annealing temperature. For example, when the film is annealed at about 600° C., anatase-type crystals are formed. For the annealing, any gas can be used as long as it provides an oxidization atmosphere.

Figure 12:
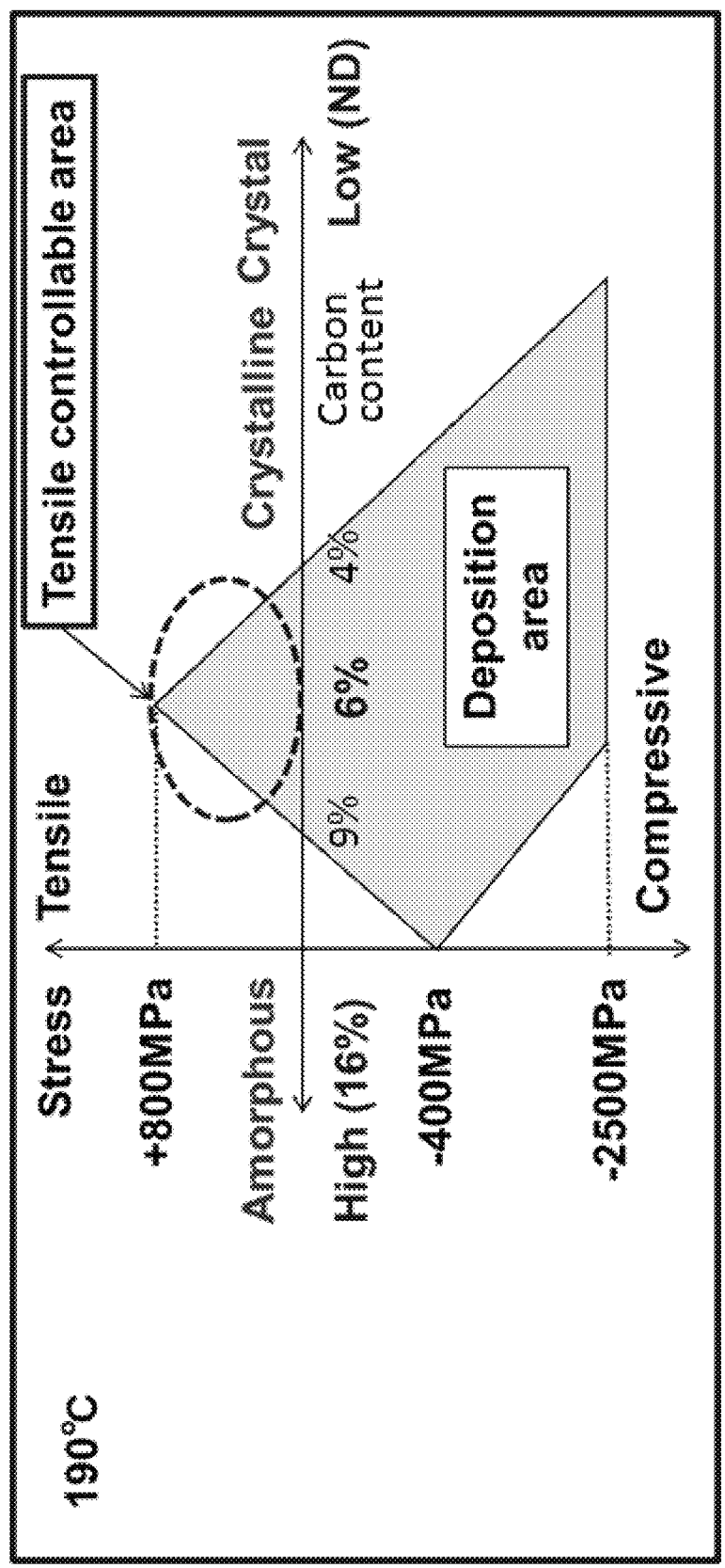
FIG. 12 is a graph showing a range of film stress in relation to crystalline of TiN/TiCN film according to some embodiments of the present invention.

In some embodiments, the Ti-containing film has a film stress of −2,500 MPa to 800 MPa. FIG. 12 is a graph showing a range of film stress in relation to crystalline of TiN/TiCN film according to some embodiments of the present invention. As shown in FIG. 12, when a film is highly crystalline, i.e., has low carbon content, the film has high compressive stress, and when a film is entirely amorphous, the film has a compressive stress of about −400 MPa. When the carbon content of a film is between about 4% and about 9%, the film can have tensile stress, depending on the types of crystal structure contained in the film. That is, film stress appears to be related to two or more types of crystal structure, and depending on the proportions of the crystal structures, the film demonstrates high to low film stress. However, when the carbon content of a film is less than about 4% or more than about 9%, it appears to be difficult to form crystal structures showing tensile stress. In some embodiments, when the carbon content of a film is about 6%, the film has the highest tensile stress, about 800 MPa. The lowest compressive stress of a film may be about −2,500 MPa or lower, and when the carbon content of a film is not detectable (ND), the film may exhibit the lowest compressive stress. When the carbon content of a film is more than about 6%, the film may not exhibit the lowest compressive stress.

The crystalline of a film can be adjusted by changing film formation parameters. In some embodiments, the method further comprises: (a) setting a target film stress for the Ti-containing film, which is greater than a film stress of a TiN crystalline film being deposited by steps (i) to (iv) under deposition conditions including a reference flow rate of $H_2$ used as the reactant gas in step (ii), reference RF power used in step (iii), and a reference deposition temperature throughout steps (i) to (iii); and (b) setting a flow rate of $H_2$ used as the reactant gas in step (ii), RF power used in step (iii), and a deposition temperature throughout steps (i) to (iii), wherein only one or more of the flow rate of $H_2$, the RF power, and the deposition temperature are used as control parameters for changing the film stress, and are different from the reference flow rate of $H_2$, the reference RF power, and the reference deposition temperature, followed by conducting steps (i) to (iv) for depositing the Ti-containing film. In general, the higher the RF power, the lower the film stress becomes, the higher the temperature, the higher the film stress becomes, and the higher the hydrogen content, the higher the film stress becomes. With reference to the reference values of control parameters, by adjusting the control parameters, the Ti-containing film can be configured to have tensile film stress. For example, for providing tensile film stress, the flow rate of $H_2$ can be set to be lower than the reference flow rate of $H_2$ used for the TiN crystalline film, the RF power can be set to be lower than the reference RF power used for the TiN crystalline film, and/or the deposition temperature can be set to be higher than the reference deposition temperature used for the TiN crystalline film. In some embodiments, when the Ti-containing film contains about 4% to about 9% carbon, the film has tensile film stress.

Film stress varies depending on the bonding state in the film. In some embodiments, a Ti-containing film shows peaks at 2,000 $cm^{-1}$ and at 1,400 $cm^{-1}$ in a Fourier Transform Infrared Spectroscopy (FT-IR) graph. In general, a peak at 2,000 $cm^{-1}$ represents tensile stress, whereas a peak at 1,400 $cm^{-1}$ represents compressive stress. The sum of these stresses represents stress of the film. If there are no peaks at 2,000 $cm^{-1}$ and at 1,400 $cm^{-1}$, the film exhibits strong compressive stress, indicating that the film is constituted by TiN crystals. When the flow of hydrogen gas used as a reactant gas is increased, first, a peak at 1,400 $cm^{-1}$ disappears, and the film becomes a film having tensile stress. In this state, when RF power is increased, a peak at 2,000 $cm^{-1}$ disappears, indicating that the crystalline of the film increases, and the film becomes a film having strong compressive stress. Thus, by adjusting the two parameters (the hydrogen gas flow and the RF power), peaks in an FT-IR graph can be controlled; i.e., film stress can be controlled. Although it is not known what bonds correspond to each peak, it is expected that the peaks are related to carbon because when either peaks at 2,000 $cm^{-1}$ and at 1,400 $cm^{-1}$ are decreased, the carbon content in the film is reduced. In some embodiments, based on the height of the peak at 1,400 $cm^{-1}$ in an FT-IR graph, the relationship between hydrogen flow and film stress can be determined. A peak at 1,400 $cm^{-1}$ can more easily disappear than a peak at 2,000 $cm^{-1}$ by manipulating the hydrogen flow and the RF power. In some embodiments, a peak at 2,000 $cm^{-1}$ can be controlled by temperature for film formation. When the temperature is high, a peak at 2,000 $cm^{-1}$ becomes high.

In some embodiments, by increasingly introducing hydrogen as a reactant gas, a peak at 1,400 $cm^{-1}$ is lowered, and only a peak at 2,000 $cm^{-1}$ is maintained, thereby rendering the resultant film tensile. In this situation, by increasing RF power, a peak at 2,000 $cm^{-1}$ also disappears, thereby rendering the resultant film compressive, which film is constituted by TiN crystals. When the RF power is increased without using hydrogen gas flow, a peak at 1,400 $cm^{-1}$ becomes higher, and the film stress becomes highly compressive. In some embodiments, a peak at 1,400 $cm^{-1}$ corresponds to multiple bonds, i.e., multiple peaks collectively constitute a peak at 1,400 $cm^{-1}$, which peaks represent compressive stress and tensile stress, wherein when the hydrogen gas flow increases, first the peak representing tensile stress disappears, and then the peak representing compressive stress disappears, thereby rendering the peak at 1,400 $cm^{-1}$ nonexistent and leaving a peak at 2,000 $cm^{-1}$ representing tensile stress only. As a result, a film having tensile stress is obtained. In some embodiments, increasing RF power is equivalent to prolonging the duration of RF power application, and they can be used interchangeably.

Figure 2A:
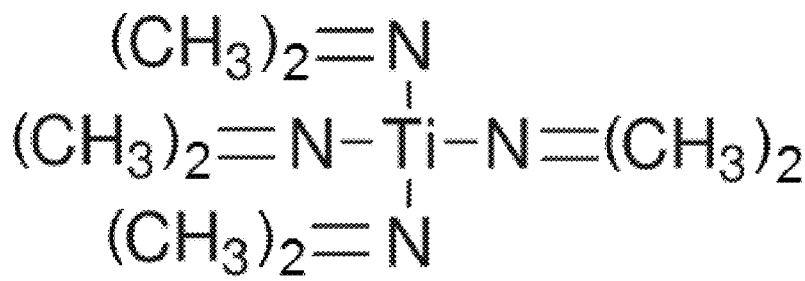
FIG. 2(a) shows a chemical formula of tetrakis(dimethylamino)titanium (TDMAT).
Figure 2B:
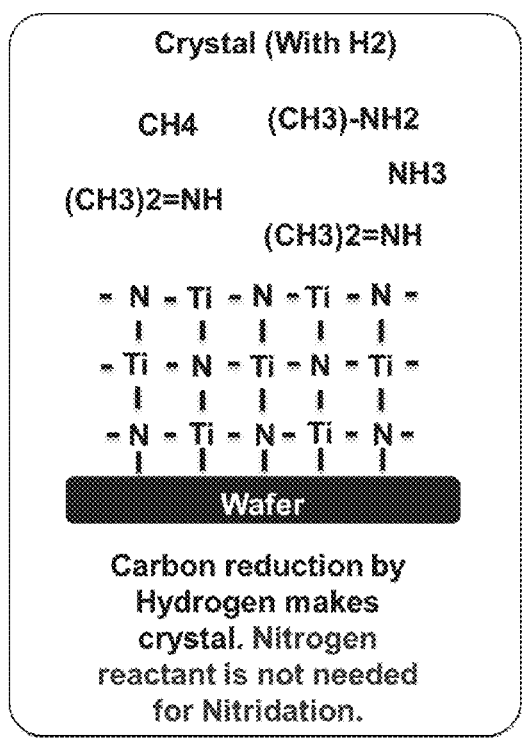
FIG. 2(b) is a schematic illustration showing a matrix structure of a crystalline TiN film formed using a hydrogen plasma according to an embodiment of the present invention, where N—C bonds are broken, and carbons do not get into the matrix.
Figure 2C:
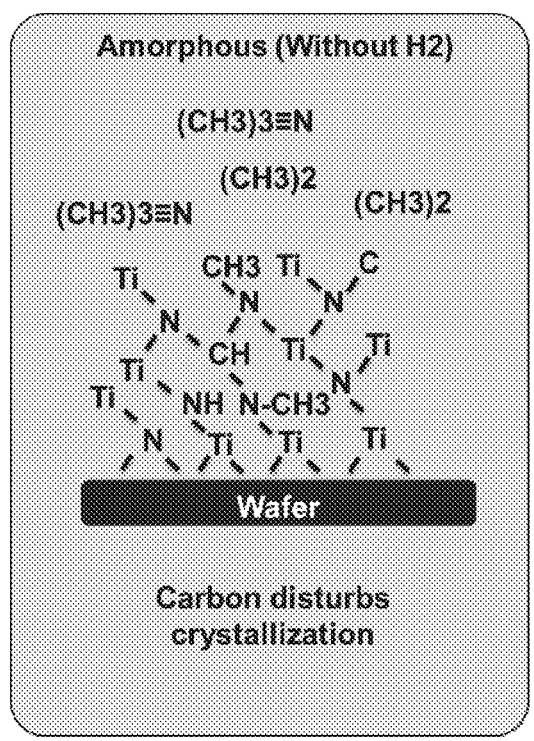
FIG. 2(c) is a schematic illustration showing a matrix structure of an amorphous TiCN film formed without using a hydrogen plasma, where N—C bonds are maintained, and carbons get into the matrix and interfere with formation of a crystalline structure.

The structurally important feature of TDMAT and TDEAT is that there are no bonds such as Ti—C and Ti—H on titanium, but all four hands of Ti are Ti—N bonds. FIG. 2(a) shows a chemical formula of tetrakis(dimethylamino)titanium (TDMAT). Due to this feature, the nitrogens contained in the molecular structure can efficiently be incorporated into a film, and carbons present in form of dimethylamine can easily be removed by a hydrogen plasma, thereby removing carbons which are impurities and promoting crystallization of TiN. FIG. 2(b) is a schematic illustration showing a matrix structure of a crystalline TiN film formed using a hydrogen plasma according to an embodiment of the present invention, where N—C bonds are broken, and carbons do not get into the matrix. The reduction of carbons by a hydrogen plasma renders the matrix structure of the film crystalline, and nitrogens for forming the matrix structure are provided from the precursor, not from a reactant gas. FIG. 2(c) is a schematic illustration showing a matrix structure of an amorphous TiCN film formed without using a hydrogen plasma, where N—C bonds are maintained, and carbons get into the matrix and interfere with formation of a crystalline structure. On the other hand, by weakening the effect of hydrogen plasma and using nitrogen as a reactant gas, carbons can reside in a film, thereby leaving carbons which are impurities in the film and thus forming an amorphous film which is constituted by TiCN.

Further, in combination with the use of TDMAT and/or TDEAT, by PEALD which is a surface plasma treatment method where a material adsorbed on a surface of a substrate is treated, a risk of degrading the film quality by forming Ti—C and Ti—H bonds due to re-bonding of dissociated ligands such as dimethylamine with Ti in a gas phase can be reduced as compared with PECVD which is a gas-phase reaction method, and carbons can efficiently be removed without cutting Ti—N bonds in the molecular structure. The above are superior features of TDMAT and TDEAT as a precursor and are the reasons that deposition of various types of film is made easier.

Further, as a feature of Ti, it can bond to oxygen tightly, and thus, oxidization of Ti is very easy, thereby forming a TiO film easily. However, the tight bonding between Ti and oxygen contributes to removal of other elements such as carbon and nitrogen, and thus, when oxygen is used for forming a TiO film, carbon and nitrogen are removed by oxygen and do not reside in the film. Thus, in some embodiments, when leaving oxygen as well as nitrogen and/or carbon simultaneously in the film, i.e., when forming a TiON or TiOCN film, it can be formed by using a lamination method where TiO films and TiN or TiCN films are alternately laminated.

In general, a crystal of TiN is conductive, and when crystalline of TiN is improved, sheet resistance is lowered. When carbons or oxygens are contained in the film, the crystalline is degraded, rendering the structure amorphous. In some embodiments, by controlling hydrogen gas flow and RF power, film stress and carbon concentration can be controlled, thereby controlling crystalline of the film and controlling the sheet resistance. There is no strong correlation observed between carbon concentration and film stress, but when the carbon concentration is extremely low and the crystalline is high, the film is characterized by being compressive. This may be because the crystalline is improved due to the reduction of carbon concentration, thereby rendering the film compressive.

In controlling film stress, for obtaining a film having tensile stress, it is extremely important to control hydrogen supply and RF power in combination. When the hydrogen flow is too low or RF power is too high as compared with that set for forming a film having tensile stress, the film stress changes to compressive stress, and thus, controlling both hydrogen flow and RF power is very important.

Since TDMAT cannot be supplied simultaneously with ammonia, when ammonia is used to deposit a film, after supplying the precursor, a step of switching the gas from the precursor to ammonia is required. However, in some embodiments, no ammonia is used, and thus, no switching step is required after supplying the precursor, thereby improving film growth rate.

It has been discovered while evaluating TiON films that dry etch rate by $NF_3$ and wet etch rate by hydrogen fluoride are changed at boundaries between alternately laminated TiO layers and TiN layers. That is, when the laminate has boundaries between TiO layers and TiN layers, the resistance to dry etching by $NF_3$ of the laminate is high, and the resistance to wet etching rate by hydrogen fluoride of the laminate is degraded, as compared with a TiO or TiN single layer. The above correlation is enhanced when the number of boundaries between TiO layers and TiN layers increases. That is, the higher the number of boundaries, the higher the resistance to dry etching and the lower the resistance to wet etching become.

In some embodiments, step coverage of films is about 90% to about 105%, typically about 95% or higher.

The embodiments will be explained with respect to preferred embodiments. However, the present invention is not limited to the preferred embodiments.

FIG. 1 is a schematic view of a PEALD apparatus, desirably in conjunction with controls programmed to conduct the sequences described below, usable in some embodiments of the present invention. In this figure, by providing a pair of electrically conductive flat-plate electrodes 4, 2 in parallel and facing each other in the interior 11 of a reaction chamber 3, applying HRF power (13.56 MHz or 27 MHz) 5 and LRF power of 5 MHz or less (400 kHz-500 kHz) 50 to one side, and electrically grounding 12 to the other side, a plasma is excited between the electrodes. A temperature regulator is provided in a lower stage 2 (the lower electrode), and a temperature of a substrate 1 placed thereon is kept constant at a given temperature. The upper electrode 4 serves as a shower plate as well, and reaction gas and rare gas are introduced into the reaction chamber 3 through a gas flow controller 23, a pulse flow control valve 31, and the shower plate. Additionally, in the reaction chamber 3, an exhaust pipe 6 is provided, through which gas in the interior 11 of the reaction chamber 3 is exhausted. Additionally, the reaction chamber is provided with a seal gas flow controller 24 to introduce seal gas into the interior 11 of the reaction chamber 3 (a separation plate for separating a reaction zone and a transfer zone in the interior of the reaction chamber is omitted from this figure).

A skilled artisan will appreciate that the apparatus includes one or more controller(s) (not shown) programmed or otherwise configured to cause the deposition and reactor cleaning processes described elsewhere herein to be conducted. The controller(s) are communicated with the various power sources, heating systems, pumps, robotics and gas flow controllers or valves of the reactor, as will be appreciated by the skilled artisan.

EXAMPLES

Examples 1 to 6

Ti-containing films were deposited on substrates having patterns (aspect ratio: 2:1) under conditions shown in Tables 7 and 8 below using the sequence illustrated in FIG. 6 and the apparatus illustrated in FIG. 1.

TABLE 7

| Ex. | Temp. (° C.) | Precursor | RF Power (13.65 MHz) (W) | $N_2/H_2/O_2$ flow (sccm) | Reactant gas |
|---|---|---|---|---|---|
| 1 | 200 | TDMAT | 400 | 200/0/0 | $N_2$ |
| 2 | 200 | TDMAT | 400 | 200/100/0 | $N_2/H_2$ |
| 3 | 200 | TDMAT | 400 | 200/600/0 | $N_2/H_2$ |
| 4 | 200 | TDMAT | 600 | 200/600/0 | $N_2/H_2$ |
| 5 | 200 | TDMAT | 400 | 0/600/0 | $H_2$ |
| 6 | 200 | TDMAT | 100 | 0/0/200 | $O_2$ |

TABLE 8

Common conditions in Examples 1 to 10

| | |
|---|---|
| Precursor flow | 50 sccm |
| Carrier gas flow (continuous) | Ar; 2,000 sccm |
| Purge gas flow (continuous) | Ar; 1,000 sccm |
| Precursor supply time | 0.3 sec. |
| Purge time after precursor pulse | 0.7 sec. |
| RF plasma exciting time | 2.0 sec. |
| Purge time after RF application | 0.1. sec. |
| Number of cycles | 500 |

The thus-obtained films were evaluated, and the results are shown in Table 9.

TABLE 9

| Examples | 100:1 DHF Etch rate (nm/min) | Compositions (atomic %) | | | | | Stress (MPa) | Step coverage Side/Top (%) | Sheet Resistance (Ω/sq.) |
|---|---|---|---|---|---|---|---|---|---|
| | | Ti | N | C | H | O | | | |
| 1 | Not etched | 23.0 | 48.0 | 16.0 | 13.0 | ND | −610 | 97% | 1400 |
| 2 | Not etched | 33.0 | 39 | 7.0 | 21.0 | ND | −2300 | 97% | 220 |
| 3 | Not etched | 37.0 | 40.0 | 6.0 | 17.0 | ND | +620 | 100% | 120 |
| 4 | Not etched | 38.0 | 45.0 | ND | 17.0 | ND | −3800 | 102% | 50 |
| 5 | Not etched | 42.0 | 44.0 | ND | 12.0 | ND | +500 | 95% | 150 |
| 6 | 1.5 | 33 | ND | ND | 2 | 65 | −200 | 98% | 100,000 |

Figure 4:
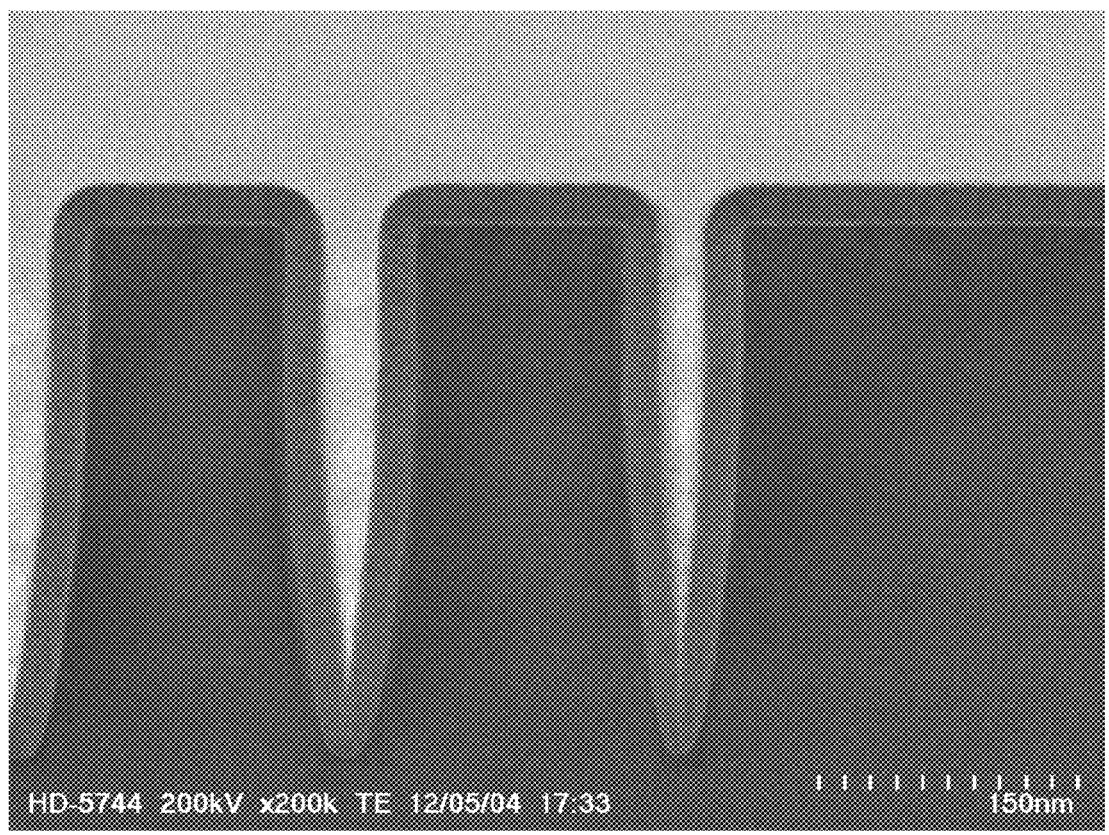
FIG. 4 is a Transmission Electron Microscope (TEM) photograph of a cross-sectional view of a conformal TiCN film according to an embodiment of the present invention.

As shown in Table 9, TiN films were formed using relatively high flow of hydrogen without nitrogen flow (Example 5) and using relatively high flow of hydrogen with relatively high RF power (Example 4). When nitrogen flow was increased relative to hydrogen flow, the carbon content in the films was increased, thereby forming TiCN films (Examples 1 to 3). In Examples 1 to 5, the step coverage of each film was 95% or higher, and the film stress was changed between −3,800 MPa and +620 MPa, and also, each film exhibited high resistance to wet etching. In Example 6, a high quality TiO film was formed. FIG. 4 is a Transmission Electron Microscope (TEM) photograph of cross-sectional views of the conformal TiCN film formed in Example 3.

Examples 7-10

Ti-containing films were deposited on substrates having patterns (aspect ratio: 2:1) under conditions shown in Table 8 and Table 10 below using the sequence illustrated in FIG. 6 and the apparatus illustrated in FIG. 1.

TABLE 10

| Ex. | Temp. (° C.) | Precursor | RF Power (13.65 MHz) (W) | $N_2/H_2/O_2$ flow (sccm) | Reactant gas |
|---|---|---|---|---|---|
| 7 | 80~200 | TDMAT | 200~1000 | 200/0/0 | $N_2$ |
| 8 | 80~200 | TDMAT | 200~1000 | 200/600/0 | $N_2/H_2$ |
| 9 | 80~200 | TDMAT | 200~1000 | 0/600/0 | $H_2$ |
| 10 | 80~200 | TDMAT | 0~1000 | 0/0/200 | $O_2$ |

The thus-obtained films were evaluated, and the results are shown in Tables 11 to 13.

TABLE 11

Substrate temperature 80° C.

| Ex. | RF Power (W) | 100:1 DHF Etch rate (nm/min) | C content (atomic %) | Stress (MPa) | Step coverage Side/Top (%) |
|---|---|---|---|---|---|
| 7 | 200 | 72 | 17 | −630 | ~100 |
| | 400 | 63 | 19 | −820 | ~100 |
| | 600 | 32 | 21 | −1390 | ~100 |
| | 1000 | 21 | 26 | −1430 | ~100 |
| 8 | 200 | Not etched | 3 | −420 | ~100 |
| | 400 | Not etched | ND | −360 | ~100 |

TABLE 11-continued

Substrate temperature 80° C.

| Ex. | RF Power (W) | 100:1 DHF Etch rate (nm/min) | C content (atomic %) | Stress (MPa) | Step coverage Side/Top (%) |
|---|---|---|---|---|---|
| | 600 | Not etched | ND | −1780 | ~100 |
| | 1000 | Not etched | ND | −1930 | ~100 |
| 9 | 200 | Not etched | 2 | −250 | ~100 |
| | 400 | Not etched | ND | −210 | ~100 |
| | 600 | Not etched | ND | −1900 | ~100 |
| | 1000 | Not etched | ND | −2120 | ~100 |
| 10 | 30 | 7.2 | ND | −120 | ~100 |
| | 100 | 7 | ND | −150 | ~100 |
| | 200 | 6.3 | ND | −160 | ~100 |
| | 500 | 5.6 | ND | −190 | ~100 |

TABLE 12

Substrate temperature 150° C.

| Ex. | RF Power (W) | 100:1 DHF Etch rate (nm/min) | C content (atomic %) | Stress (MPa) | Step coverage Side/Top (%) |
|---|---|---|---|---|---|
| 7 | 200 | Not etched | 16 | −540 | ~100 |
| | 400 | Not etched | 18 | −500 | ~100 |
| | 600 | Not etched | 20 | −2100 | ~100 |
| | 1000 | Not etched | 23 | −2530 | ~100 |
| 8 | 200 | Not etched | 7 | 640 | ~100 |
| | 400 | Not etched | 5 | 790 | ~100 |
| | 600 | Not etched | ND | −2690 | ~100 |
| | 1000 | Not etched | ND | −2950 | ~100 |
| 9 | 200 | Not etched | 7 | 820 | ~100 |
| | 400 | Not etched | 4 | −210 | ~100 |
| | 600 | Not etched | ND | −1900 | ~100 |
| | 1000 | Not etched | ND | −2120 | ~100 |
| 10 | 30 | 4.2 | ND | −120 | ~100 |
| | 100 | 3 | ND | −150 | ~100 |
| | 200 | 2.1 | ND | −160 | ~100 |
| | 500 | 1.2 | ND | −190 | ~100 |

TABLE 13

Substrate temperature 200° C.

| Ex. | RF Power (W) | 100:1 DHF Etch rate (nm/min) | C content (atomic %) | Stress (MPa) | Step coverage Side/Top (%) |
|---|---|---|---|---|---|
| 7 | 200 | Not etched | 17 | −430 | ~100 |
|   | 400 | Not etched | 19 | −330 | ~100 |
|   | 600 | Not etched | 21 | −2310 | ~100 |
|   | 1000 | Not etched | 26 | −2640 | ~100 |
| 8 | 200 | Not etched | 3 | 1920 | ~100 |
|   | 400 | Not etched | ND | 2010 | ~100 |
|   | 600 | Not etched | ND | −3700 | ~100 |
|   | 1000 | Not etched | ND | −4520 | ~100 |
| 9 | 200 | Not etched | 2 | 1670 | ~100 |
|   | 400 | Not etched | ND | 1780 | ~100 |
|   | 600 | Not etched | ND | −4010 | ~100 |
|   | 1000 | Not etched | ND | −4310 | ~100 |
| 10 | 30 | 1.3 | ND | 50 | ~100 |
|   | 100 | 1 | ND | 10 | ~100 |
|   | 200 | 0.5 | ND | −20 | ~100 |
|   | 500 | 0.3 | ND | −80 | ~100 |

In Examples 7 to 9, as a tendency, when the RF power was lower, and the temperature was higher, the carbon content was higher. As shown in Tables 11 to 13, by reducing the RF power and increasing the temperature, the carbon content of the film was reduced, and the film stress became compressive (Examples 7 to 9). In Examples 7 to 9, the step coverage of each film was about 100%, and the film stress was changed between about −4,500 MPa and +2,000 MPa, and also, each film exhibited high resistance to wet etching. In Example 10, a high quality TiO film was formed, which was not significantly affected by the changes of the RF power and the temperature.

Examples 11-16

Ti-containing films constituted by laminates were deposited on substrates having patterns (aspect ratio: 2:1) under conditions shown in Tables 14 and 15 below using the sequence illustrated in FIG. 6 and the apparatus illustrated in FIG. 1.

TABLE 14

| Ex. | Type of film | Substrate temp. (degC) | TiO Pulse | TiN Pulse | Number of laminate units | Thickness (nm) | Remarks |
|---|---|---|---|---|---|---|---|
| 11 | TiO | 200 | 300 | 0 | 0 | 19.4 | TiO base film |
| 12 | TiN | 200 | 0 | 300 | 0 | 21.3 | TiN base film |
| 13 | TiON | 200 | 15 | 285 | 15 | 25.4 | 19 cycles for TiN, then 1 cycle for TiO |
| 14 | TiON | 200 | 50 | 250 | 50 | 24.3 | 5 cycles for TiN, then 1 cycle for TiO |
| 15 | TiON | 200 | 50 | 250 | 10 | 25.6 | 25 cycles for TiN, then 5 cycles for TiO |
| 16 | TiOCN | 100 | 10 | 290 | 10 | 26.7 | 29 cycles for TiCN, then 1 cycle for TiO |

TABLE 15

| TiN film formation cycle (one layer) | Precursor flow | 50 sccm |
|---|---|---|
| | Carrier gas flow (continuous) | Ar; 2000 sccm |
| | Reactant gas flow (continuous) | $H_2$; 600 sccm |
| | Purge gas flow (continuous) | Ar; 1000 sccm |
| | RF power (13.56 MHz) | 400 W |
| | Precursor supply time | 0.3 sec. |
| | Purge time after precursor pulse | 0.7 sec. |
| | RF plasma exciting time | 2.0 sec. |
| | Purge time after RF application | 0.1 sec. |
| TiO film formation cycle (one layer) | Precursor flow | 50 sccm |
| | Carrier gas flow (continuous) | Ar; 2000 sccm |
| | Reactant gas flow (continuous) | $O_2$; 500 sccm |
| | Purge gas flow (continuous) | Ar; 1000 sccm |
| | RF power (13.56 MHz) | 200 W |
| | Precursor supply time | 0.3 sec. |
| | Purge time after precursor pulse | 0.7 sec. |
| | RF plasma exciting time | 2.0 sec. |
| | Purge time after RF application | 0.1 sec. |

In Example 16, each TiCN layer was formed under the same conditions as in Example 1.

The thus-obtained films were evaluated, and the results are shown in Table 16.

TABLE 16

| Ex | 100:1 DHF Etch rate (nm/min) | NF3 Dry etch rate (nm/sec) | Compositions (atomic %) | | | | | Sheet Resistance (Ω/sq.) |
|---|---|---|---|---|---|---|---|---|
| | | | Ti | N | C | H | O | |
| 11 | 1.5 | 13.2 | 33.0 | ND | ND | 2.0 | 65 | 100,000 or more |
| 12 | Not etched | 24.1 | 39.0 | 42.0 | ND | 19.0 | ND | 120 |
| 13 | 3.4 | 3.8 | 29.0 | 18.0 | ND | 17.0 | 36.0 | 85,000 |
| 14 | 6.8 | 0.4 | 29.0 | 13.0 | ND | 15.0 | 43.0 | 100,000 or more |
| 15 | 2.5 | 5.2 | 28.0 | 15.0 | ND | 16.0 | 41.0 | 100,000 or more |
| 16 | 17.1 | 58.2 | 12.0 | 24.0 | 19.0 | 23.0 | 22.0 | 100,000 or more |

As shown in Table 16, the wet and dry etch rate properties of the laminates in Examples 13-16 did not fall within a range between those of the two base films in Examples 11 and 12, but were different from both of them. When the number of the boundaries between the TiN film and the TiO film increased, dry etch rate was decreased whereas wet etch rate was increased (Examples 13-15).

Examples 17-19

Figure 8:
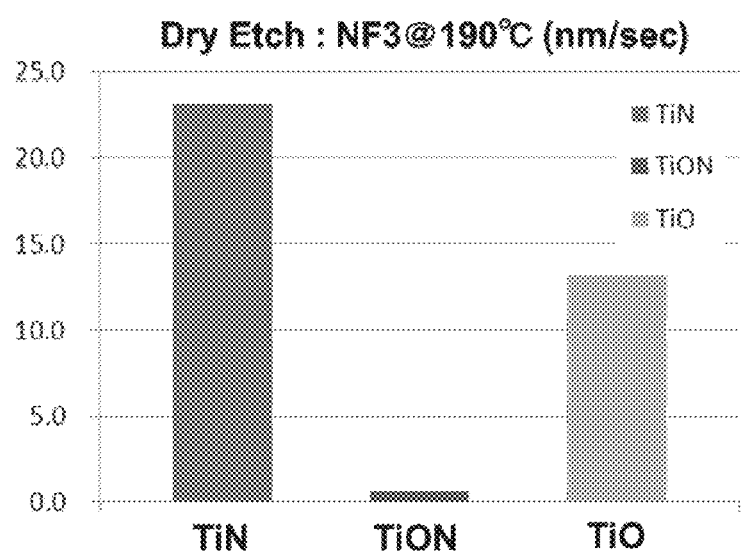
FIG. 8 is a graph showing dry etch rates of a TiN film, a TiO film, and a TiON film according to some embodiments of the present invention.
Figure 9:
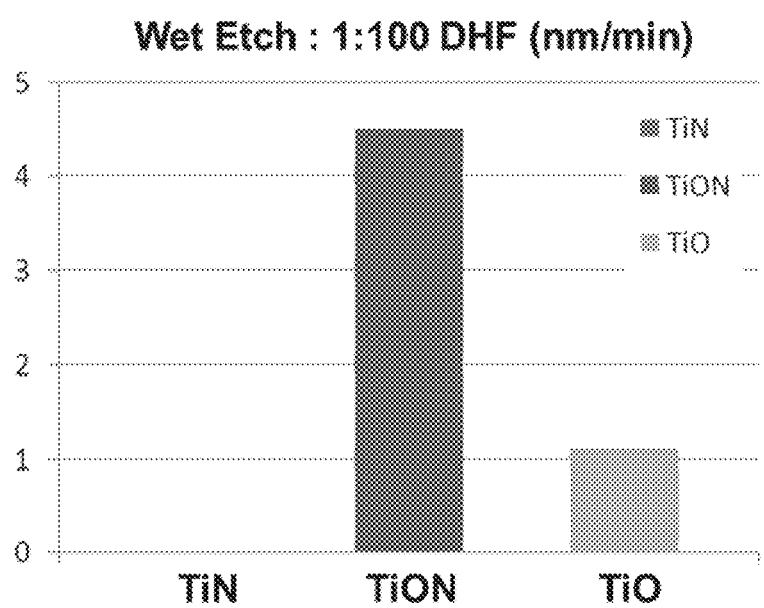
FIG. 9 is a graph showing wet etch rates of a TiN film, a TiO film, and a TiON film according to some embodiments of the present invention.

Films were formed under the same conditions as in Examples 11, 12, and 14, and dry etch rate and wet etch rate were measured for each film. FIG. 8 is a graph showing dry etch rates of the TiN film formed in Example 18, the TiO film formed in Example 17, and the TiON film formed in Example 19. The dry etch rate of the TiON film was remarkably lower than that of the TiN film and that of the TiO film. FIG. 9 is a graph showing wet etch rates of the TiN film formed in Example 18, the TiO film formed in Example 17, and the TiON film formed in Example 19. The wet etch rate of the TiON film was remarkably higher than that of the TiN film and that of the TiO film.

Example 20

Figure 3:
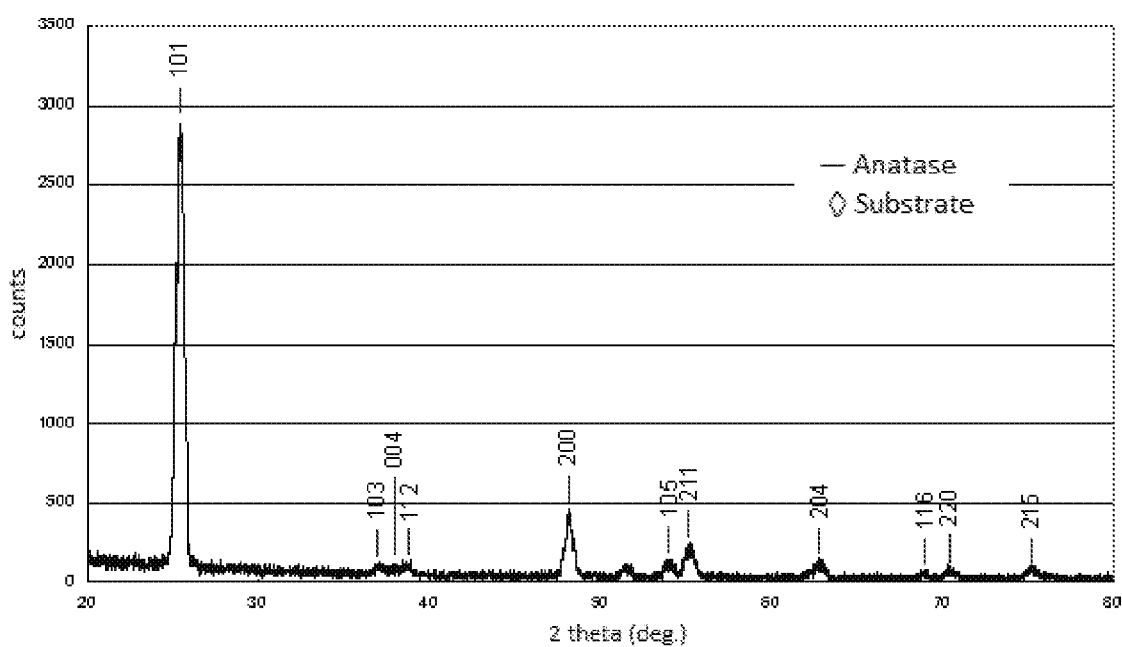
FIG. 3 shows the result of an X-ray diffraction analysis of the annealed film, indicating that the film forms anatase-type crystals, according to an embodiment of the present invention.

A film was formed under the same conditions as in Example 6 except that after the film formation process, the film was annealed at about 600° C. for about two hours. FIG. 3 shows the result of an X-ray diffraction analysis of the annealed film, indicating that the film forms anatase-type crystals.

Examples 21-32

Ti-containing films were deposited on substrates having patterns (aspect ratio: 2:1) under conditions shown in Table 8 and Table 17 below using the sequence illustrated in FIG. 6 and the apparatus illustrated in FIG. 1.

TABLE 17

| Ex. | Depo. Temp. (° C.) | Precursor | RF Power (13.65 MHz) (W) | N$_2$/H$_2$ flow (sccm) | Reactant gas |
|---|---|---|---|---|---|
| 21 | 190 | TDMAT | 400 | 200/600 | N$_2$/H$_2$ |
| 22 | 190 | TDMAT | 400 | 200/100 | N$_2$/H$_2$ |
| 23 | 190 | TDMAT | 400 | 200/0 | N$_2$ |
| 24 | 190 | TDMAT | 600 | 200/600 | N$_2$/H$_2$ |
| 25 | 190 | TDMAT | 400 | 0/600 | H$_2$ |
| 26 | 100 | TDMAT | 400 | 200/600 | N$_2$/H$_2$ |
| 27 | 140 | TDMAT | 400 | 200/600 | N$_2$/H$_2$ |
| 28 | 170 | TDMAT | 400 | 200/600 | N$_2$/H$_2$ |
| 29 | 190 | TDMAT | 400 | 200/600 | N$_2$/H$_2$ |
| 30 | 190 | TDMAT | 400 | 200/0 | N$_2$ |

TABLE 17-continued

| Ex. | Depo. Temp. (° C.) | Precursor | RF Power (13.65 MHz) (W) | N$_2$/H$_2$ flow (sccm) | Reactant gas |
|---|---|---|---|---|---|
| 31 | 190 | TDMAT | 800 | 200/0 | N$_2$ |
| 32 | 190 | TDMAT | 1200 | 200/0 | N$_2$ |

The thus-obtained films were evaluated, and the results are shown in Table 18.

TABLE 18

| Examples | Compositions (atomic %) | | | | | Stress (MPa) |
|---|---|---|---|---|---|---|
| | Ti | N | C | H | O | |
| 21 | 37 | 40 | 6 | 17 | ND | 440 |
| 22 | 33 | 39 | 7 | 21 | ND | −1499 |
| 23 | 23 | 48 | 16 | 13 | ND | −413 |
| 24 | 36 | 45 | 2 | 17 | ND | −2406 |
| 25 | 38 | 40 | 7 | 15 | ND | 892 |
| 26 | 34 | 45 | ND | 21 | ND | −800 |
| 27 | 33 | 43 | 2 | 22 | ND | −965 |
| 28 | 30 | 41 | 4 | 25 | ND | 315 |
| 29 | 37 | 40 | 6 | 17 | ND | 500 |
| 30 | 23 | 48 | 16 | 13 | ND | −413 |
| 31 | 21 | 45 | 20 | 14 | ND | −1557 |
| 32 | 20 | 39 | 25 | 16 | ND | −2434 |

Figure 10:
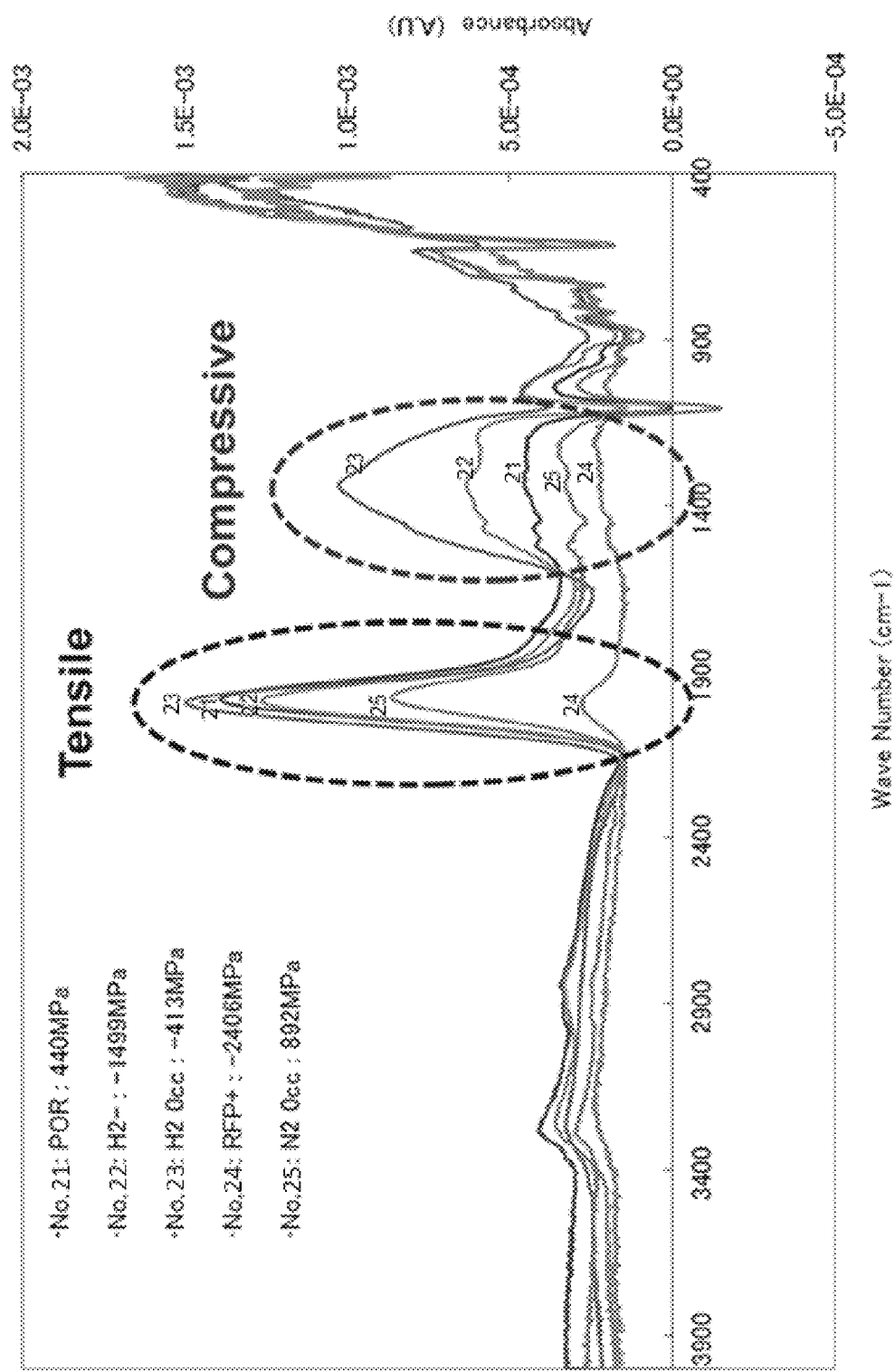
FIG. 10 shows Fourier Transform Infrared (FT-IR) spectra of TiCN films according to some embodiments of the present invention.

FIG. 10 shows Fourier Transform Infrared (FT-IR) spectra of TiCN films formed in Examples 21 to 25 wherein Example 21 is a reference example ("POR", process of record). Film stress varied depending on the bonding state in the film. In general, a peak at 2,000 cm$^{-1}$ represents tensile stress, whereas a peak at 1,400 cm$^{-1}$ represents compressive stress. The sum of these stresses represents stress of the film. When the flow of hydrogen gas used as a reactant gas was decreased in Examples 21 to 23, a peak at 1,400 cm$^{-1}$ increased, and the film became compressive. In Example 21, when RF power was increased in Example 24, a peak at 2,000 cm$^{-1}$ decreased, indicating that the crystalline of the film increased, and the film became highly compressive.

Figure 11:
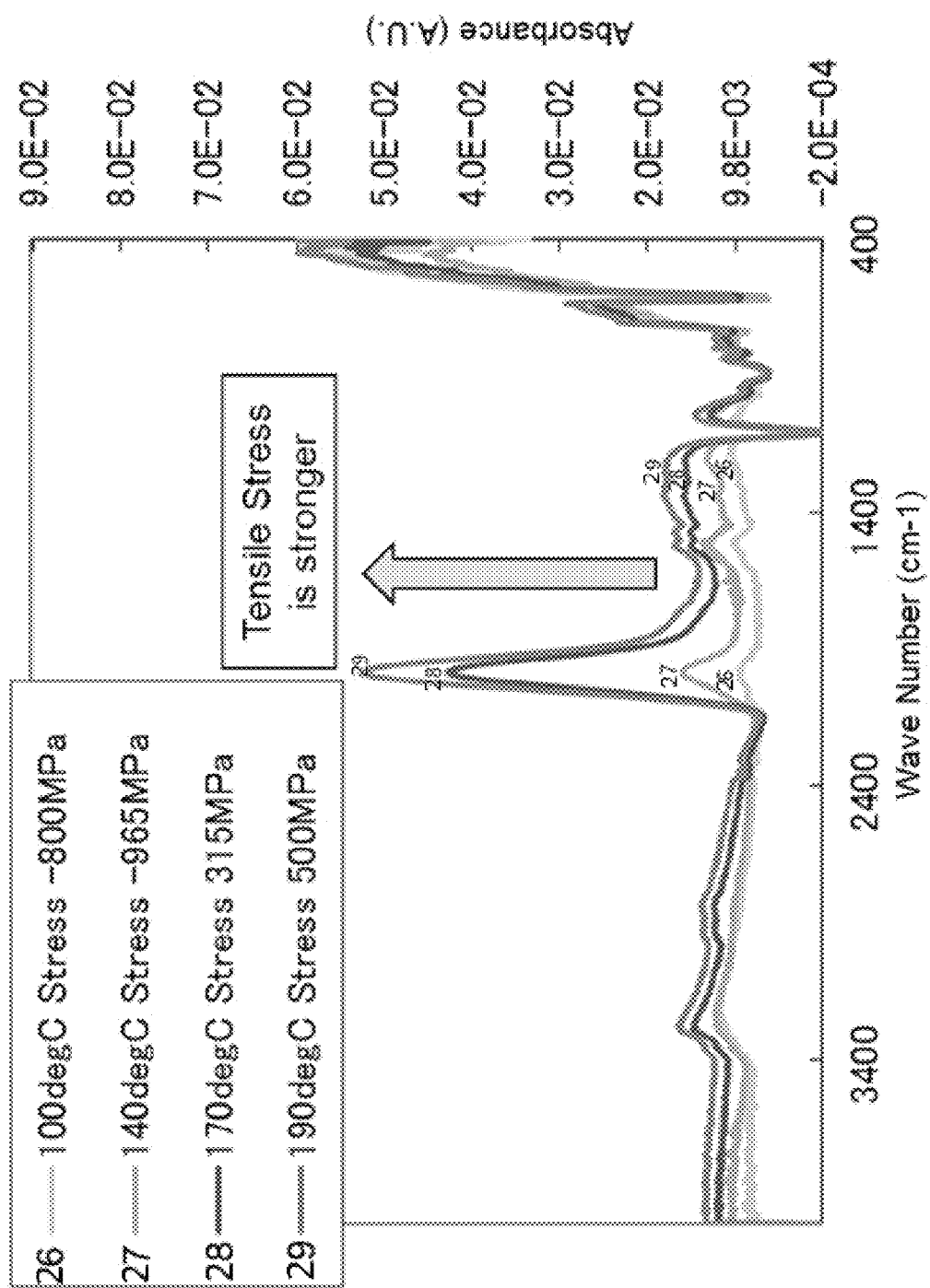
FIG. 11 shows Fourier Transform Infrared (FT-IR) spectra of TiCN films according to some embodiments of the present invention.

FIG. 11 shows Fourier Transform Infrared (FT-IR) spectra of TiCN films formed in Examples 26 to 29. When the temperature was higher in Examples 26 to 29, a peak at 2,000 cm$^{-1}$ became higher. A peak at 2,000 cm$^{-1}$ can be controlled by temperature for film formation.

Figure 13:
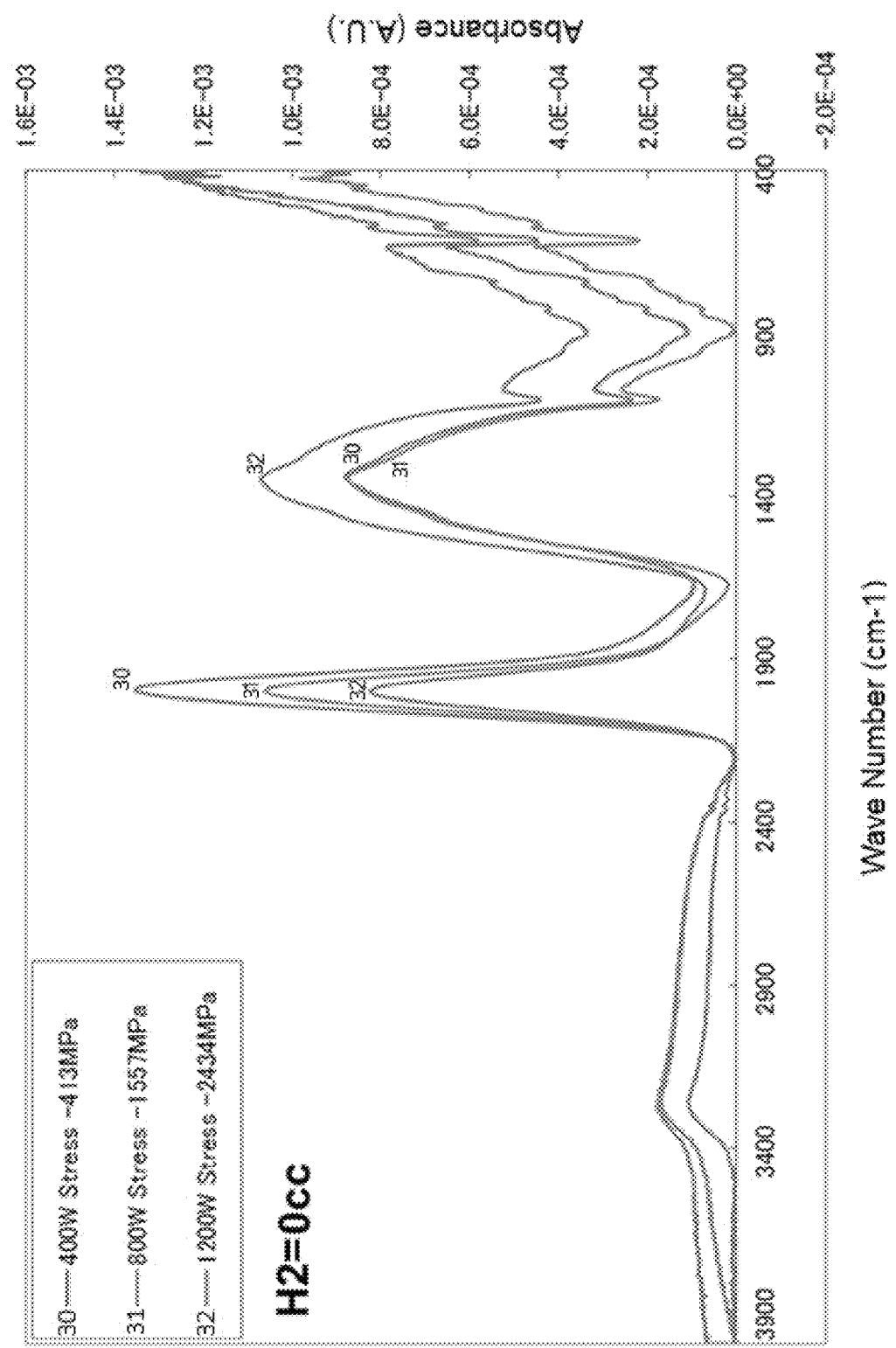
FIG. 13 shows Fourier Transform Infrared (FT-IR) spectra of TiCN films according to some embodiments of the present invention.

FIG. 13 shows Fourier Transform Infrared (FT-IR) spectra of TiCN films formed in Examples 30 to 32. When the RF power was increased without using hydrogen gas flow in Examples 30 to 32, a peak at 1,400 cm$^{-1}$ became higher, a peak at 2,00 cm$^{-1}$ became lower, and the film stress became highly compressive.

Figure 14:
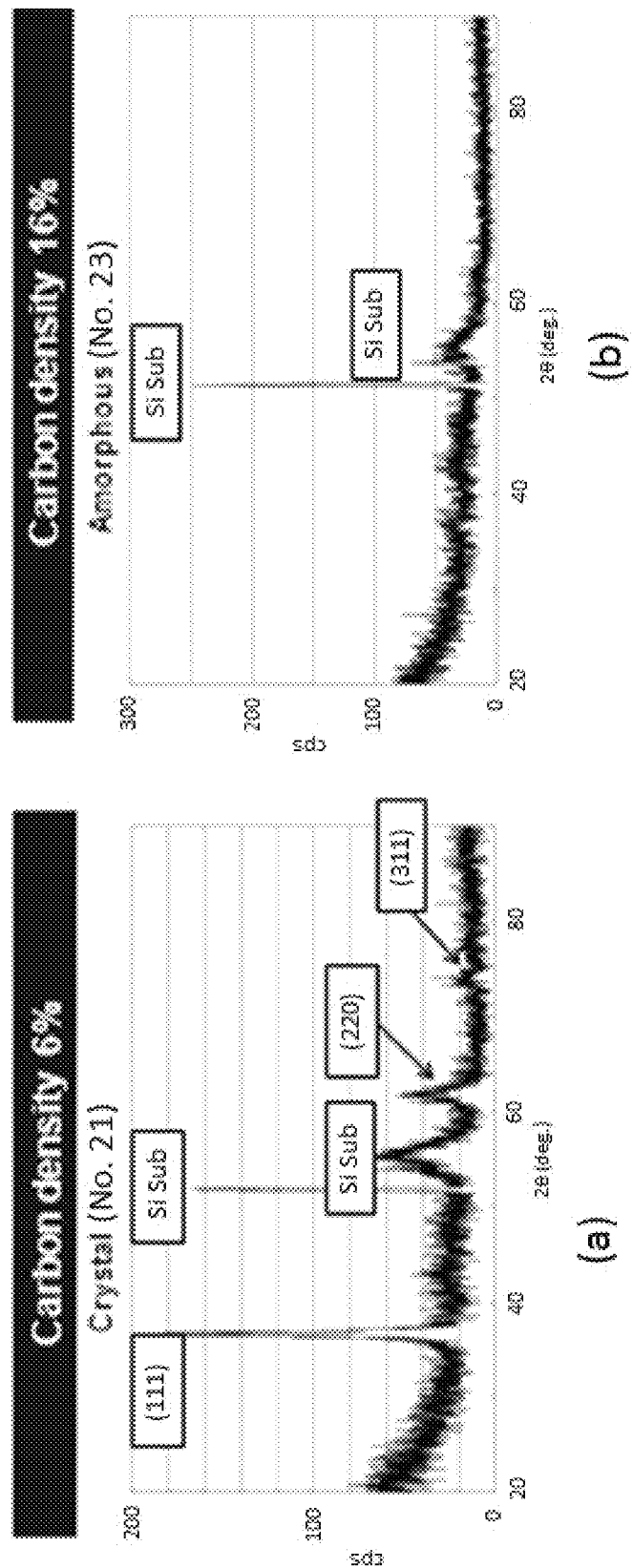
FIG. 14 shows: (a) the result of an X-ray diffraction analysis of a TiCN film (carbon content: 6%), and (b) the result of an X-ray diffraction analysis of a TiCN film (carbon content: 16%) according to some embodiments of the present invention.

FIG. 14 shows: (a) the result of an X-ray diffraction analysis of the TiCN film obtained in Example 21 (carbon content: 6%), and (b) the result of an X-ray diffraction analysis of the TiCN film obtained in Examples 23 (carbon content: 16%). As shown in (a) in FIG. 14, the film having a low carbon content (6%) was crystalline (Example 21), whereas as shown in (b) in FIG. 14, the film having a high carbon content (16%) was amorphous (Example 23). The crystals constituting the film were Osbornite TiN having a fcc (face-centered cubic) structure, which is substantially the same as NaCl. The film contained multiple crystals but they mainly grew on the (111) surface.

Figure 15:
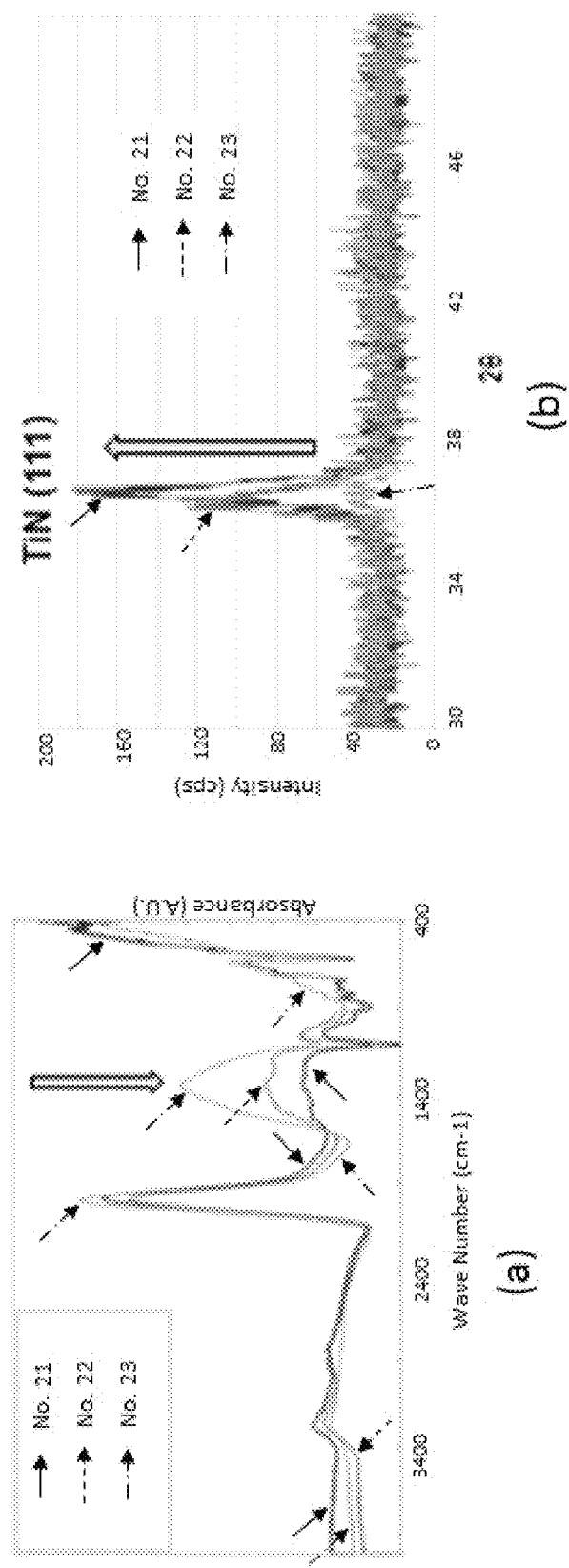
FIG. 15 shows: (a) Fourier Transform Infrared (FT-IR) spectra of TiCN films, and (b) results of an X-ray diffraction analysis of TiCN films according to some embodiments of the present invention.

FIG. 15 shows: (a) Fourier Transform Infrared (FT-IR) spectra of the TiCN films formed in Examples 21 to 23, and (b) results of an X-ray diffraction (XRD) analysis of the TiCN films formed in Examples 21 to 23. As shown in (a) and (b) in FIG. 15, when a peak at 1,400 cm$^{-1}$ was decreased, a peak of (111) in XRD was increased, indicating that the peak at 1,400 cm$^{-1}$ was associated with atomic arrangement on the (111) crystal surface.

Figure 16:
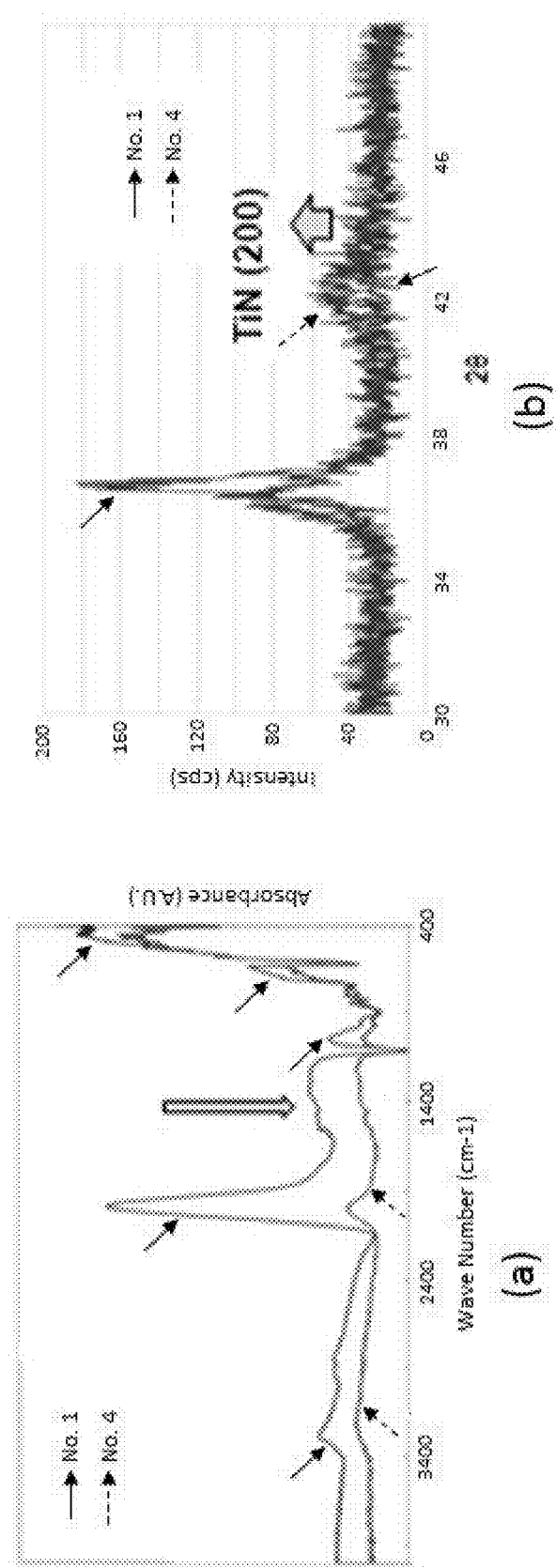
FIG. 16 shows: (a) Fourier Transform Infrared (FT-IR) spectra of TiCN films, and (b) results of an X-ray diffraction (XRD) analysis of TiCN films according to some embodiments of the present invention.

FIG. 16 shows: (a) Fourier Transform Infrared (FT-IR) spectra of the TiCN films formed in Examples 21 and 24, and (b) results of an X-ray diffraction (XRD) analysis of the TiCN films formed in Examples 21 and 24. As shown in (a) and (b) in FIG. 16, when a peak at 2,000 cm$^{-1}$ was decreased, a peak of (200) in XRD was increased, indicating that the peak at 2,000 cm$^{-1}$ was associated with atomic arrangement on the (200) crystal surface. In general, when FT-IR peaks (at 1,400 cm$^{-1}$ and 2,000 cm$^{-1}$) are decreased, the crystalline of the film is improved.

Examples 33-40

Ti-containing films were deposited on substrates having patterns (aspect ratio: 2:1) under conditions shown in Table 8 and Table 19 below using the sequence illustrated in FIG. 6 and the apparatus illustrated in FIG. 1.

TABLE 19

| Ex. | Temp. (° C.) | Precursor | RF Power (13.65 MHz) (W) | $N_2/H_2$ flow (sccm) |
|---|---|---|---|---|
| 33 | 190 | TDMAT | 400 | 200/0 |
| 34 | 190 | TDMAT | 400 | 200/200 |
| 35 | 190 | TDMAT | 400 | 200/600 |
| 36 | 190 | TDMAT | 400 | 200/1000 |
| 37 | 190 | TDMAT | 250 | 200/600 |
| 38 | 190 | TDMAT | 300 | 200/600 |
| 39 | 190 | TDMAT | 400 | 200/600 |
| 40 | 190 | TDMAT | 600 | 200/600 |

Figure 17:
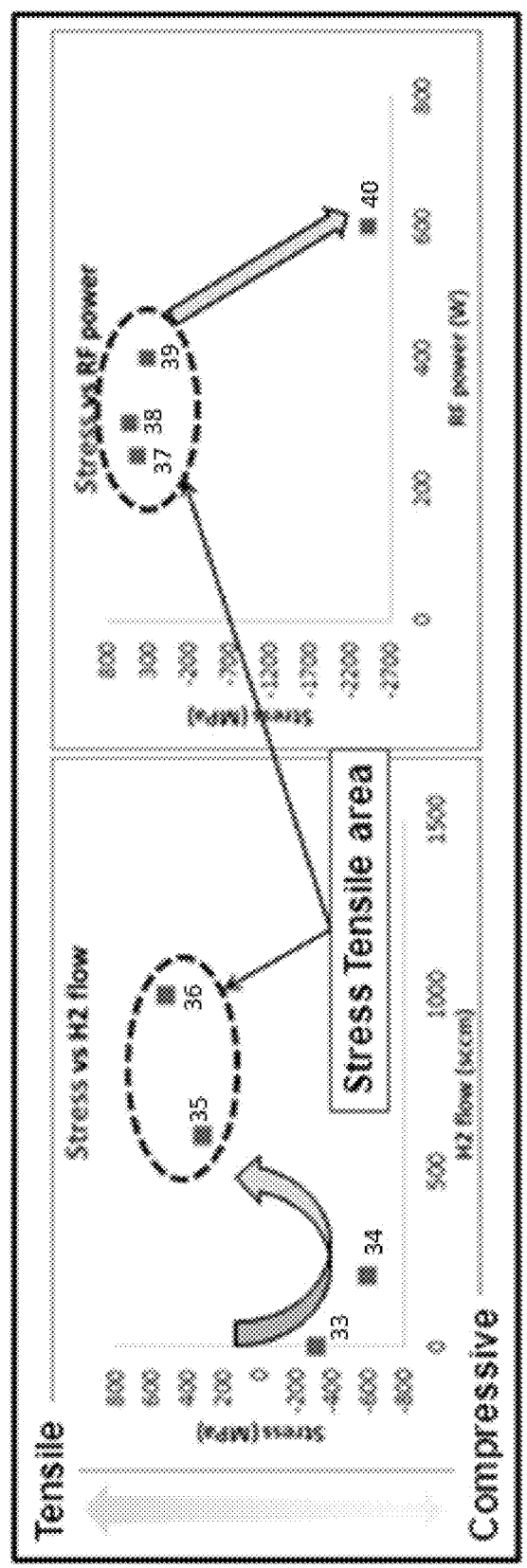
FIG. 17 shows a graph indicating the relationship between film stress and hydrogen flow, and a graph indicating the relationship between film stress and RF power according to some embodiments of the present invention.

The thus-obtained films were evaluated, and the results are shown in FIG. 17. FIG. 17 shows a graph indicating the relationship between film stress and hydrogen flow in Examples 33 to 36, and a graph indicating the relationship between film stress and RF power in Examples 37 to 40. As shown in FIG. 17, film stress was controlled by hydrogen flow, and when the hydrogen flow was increased, the film stress became tensile (Examples 35 and 36). Further, when the RF power was increased, the film stress became compressive (Example 40). By using hydrogen flow and RF power in combination as control parameters, film stress can be adjusted between about −2,500 MPa and about +1,000 MPa.

Examples 41-44

Ti-containing films were deposited on substrates having patterns (aspect ratio: 2:1) under conditions shown in Table 8 and Table 20 below using the sequence illustrated in FIG. 6 and the apparatus illustrated in FIG. 1.

TABLE 20

| Ex. | Temp. (° C.) | Precursor | RF Power (13.65 MHz) (W) | $N_2/H_2/O_2$ flow (sccm) | Reactant gas |
|---|---|---|---|---|---|
| 41 | 200 | TDEAT | 200~1000 | 200/0/0 | $N_2$ |
| 42 | 200 | TDEAT | 200~1000 | 200/600/0 | $N_2/H_2$ |
| 43 | 200 | TDEAT | 200~1000 | 0/600/0 | $H_2$ |
| 44 | 200 | TDEAT | 0~1000 | 0/0/200 | $O_2$ |

The thus-obtained films were evaluated, and the results are shown in Table 21.

TABLE 21

| | Substrate temperature 200° C. | | | | |
|---|---|---|---|---|---|
| Ex. | RF Power (W) | 100:1 DHF Etch rate (nm/min) | C content (atomic %) | Stress (MPa) | Step coverage Side/Top (%) |
|---|---|---|---|---|---|
| 41 | 200 | Not etched | 17 | −550 | ~100 |
| | 400 | Not etched | 19 | −430 | ~100 |
| | 600 | Not etched | 21 | −2400 | ~100 |
| | 1000 | Not etched | 26 | −2710 | ~100 |
| 42 | 200 | Not etched | 3 | 1520 | ~100 |
| | 400 | Not etched | ND | 1850 | ~100 |
| | 600 | Not etched | ND | −2500 | ~100 |
| | 1000 | Not etched | ND | −3800 | ~100 |
| 43 | 200 | Not etched | 2 | 1030 | ~100 |
| | 400 | Not etched | ND | 1990 | ~100 |
| | 600 | Not etched | ND | −2610 | ~100 |
| | 1000 | Not etched | ND | −4880 | ~100 |
| 44 | 30 | 2.0 | ND | 65 | ~100 |
| | 100 | 1.5 | ND | 23 | ~100 |
| | 200 | 0.8 | ND | −45 | ~100 |
| | 500 | 0.4 | ND | −104 | ~100 |

In Examples 41 to 44, TDEAT was used in place of TDMAT. As shown in Table 21, the effect of RF power on the films derived from TDEAT was significantly different from that on the films derived from TDMAT. When nitrogen was used (Example 41), when the RF power was lower, the carbon content was lower, whereas when hydrogen was used or included (Examples 42 and 43), when the RF power was lower, the carbon content was higher. When oxygen was used (Example 44), when the RF power did not affect the carbon content. In Examples 41 to 44, the step coverage of each film was about 100%, and the film stress was changed between about −5,000 MPa and +2,000 MPa, and also, each film exhibited high resistance to wet etching. In Examples 41 to 44, the film stress drastically changed at an RF power between 400 W and 600 W, indicating that the crystalline state changed as a function of RF power.

The present invention includes the above mentioned embodiments and other various embodiments including the following:

1) In a method for forming a Ti-containing film by ALD using TDMAT or TDEAT, the method is characterized in that the deposition temperature is in a range of 50° C. to 250° C. (e.g., lower than 150° C.), and solely by changing reactant gases, various films selected from TiO, TiON, TiN, TiCN, and TiOCN films having a step coverage of 95% or higher can be deposited on a substrate. Particularly, the method is characterized in that a TiN film can be deposited using a hydrogen-containing reactant as well as nitrogen contained in a precursor itself without any nitrogen-containing reactant such as ammonia and nitrogen. The method is also characterized in that a TiN film having a tensile stress can be deposited by using hydrogen as a reactant gas in combination with RF power control for the purpose of controlling film stress and sheet resistance control.

2) The method according to 1) is characterized in that a TiCN film is deposited when nitrogen or nitrogen in combination with hydrogen as a reactant.

3) In the method according to 1), a TiON film and a TiOCN film can be deposited by adding oxygen to films mainly constituted by TiN and TiCN, respectively, wherein a laminate structure is formed by alternately depositing a TiO layer and a TiN or TiCN layer. Particularly, the method is characterized in that when a TiON film is formed, dry etch rate using NF3, wet etch rate using hydrogen fluoride, and sheet resistance can be controlled.

4) The method according to 1) is characterized in that a TiO film can be deposited by using TDMAT or TDEAT as well as oxygen.

5) In the method according to 1), a reactant gas is one gas or mixed gases selected from the group consisting of He, Ar, $H_2$, $N_2$, $O_2$, $N_2O$, and $H_2O$ to form a TiO, TiON, TiN, TiCN, or TiOCN film, wherein a flow rate of He is 0 to 8000 sccm, a flow rate of Ar is 0 to 8000 sccm, a flow rate of $H_2$ is 0 to 5000 sccm, a flow rate of $N_2$ is 0 to 500 sccm, a flow rate of $O_2$ is 0 to 5000 sccm, a flow rate of $N_2O$ is 0 to 5000 sccm, and a flow rate of $H_2O$ is 0 to 5000 sccm.

6) In the method according to 1), the compositions of the film deposited can be controlled as follows: C: 0 atomic % to 25 atomic %; Ti: 10 atomic % to 40 atomic %; N: 0 atomic % to 50 atomic %; O: 0 atomic % to 70 atomic %; H: 3 atomic % to 25 atomic %.

7) The method according to 1) is characterized in that film stress can be controlled by changing at least any one of the following: process temperature, flow rate of $H_2$ used as a reactant gas, and RF power.

8) In the method according to 7), film stress can be controlled in a range of −5,000 MPa to +1,500 MPa.

9) In the method according to 7), tensile stress can be obtained under conditions where the substrate temperature is 70° C. to 250° C., a flow rate of $H_2$ is 50 sccm to 2,000 sccm, and RF power is 150 W to 500 W.

10) In the method according to 1), sheet resistance can be controlled in a range of 10 Ω/sq. to 5,000 Ω/sq.

11) In the method according to 3), the thickness of each layer of TiO and TiN or TiCN is in a range of 0.06 nm to 10 nm.

12) In the method according to 3), the ratio of the number of TiO layers to the number of TiN or TiCN layers is in a range of 1:333 to 333:1 for a laminate having a thickness of 20 nm, for example.

13) The method according to 3) is characterized in that the overall oxygen concentration can be controlled by decreasing or increasing the thickness of TiO layers, i.e., relatively increasing or decreasing the thickness of TiN or TiCN layers. The above method can also be used for controlling carbon concentration and nitrogen concentration.

14) In the method according to 3), a TiON film is formed, and its dry etch rate using $NF_3$ and wet etch rate using hydrogen fluoride can be controlled by changing the number of TiO layers and TiN layers to be laminated.

15) In the method according to 14), the dry etch rate using $NF_3$ can be controlled to be 0.03 times to one time as low as that of TiO single film, wherein when the number of layers constituting the laminate increases, resistance to dry etch is improved, i.e., increased.

16) In the method according to 14), wet etch rate using hydrogen fluoride can be controlled to be one time to ten times as high as that of TiO single film, wherein when the number of layers constituting the laminate increases, resistance to wet etch is degraded, i.e., decreased.

17) The method according to 1) is characterized in that an amorphous TiO film can be formed not only by PEALD but also by thermal ALD due to the characteristic of Ti which is easily oxidized.

18) The method according to 1) is characterized in that by conducting thermal annealing at a temperature of 400° to 1,000° after forming a TiO film, anatase-type $TiO_2$ crystals, rutile-type $TiO_2$ crystals, or brookite-type $TiO_2$ crystals can be formed depending on the annealing temperature.

19) The method according to 18) is characterized in that the anatase-type $TiO_2$ crystals or rutile-type TiO2 crystals exhibit photocatalytic activity, and further, the anatase-type $TiO_2$ crystals exhibit superhydrophilicity.

20) In the method according to 1), the RF power is in a range of 10 W to 2,000 W.

21) The method according to 1) is characterized in that the step coverage of the film is 95% or higher.

22) The method according to 1) is characterized in that the temperature of a susceptor holding a silicon substrate is in a range of 0° C. to 600° C., and a plasma generator installed in the apparatus has any frequency between 1 MHz and 60 MHz.

It will be understood by those of skill in the art that numerous and various modifications can be made without departing from the spirit of the present invention. Therefore, it should be clearly understood that the forms of the present invention are illustrative only and are not intended to limit the scope of the present invention.

The invention claimed is:

1. A method for forming a TiN film on a substrate by plasma-enhanced atomic layer deposition (PEALD) using tetrakis(dimethylamino)titanium (TDMAT) or tetrakis(diethylamino)titanium (TDEAT), said PEALD comprising multiple deposition cycles, each deposition cycle comprising:
  (i) introducing TDMAT and/or TDEAT in a pulse to a reaction space where a substrate is placed;
  (ii) continuously introducing a $NH_3$-free reactant gas to the reaction space, wherein the $NH_3$-free reactant gas contains neither nitrogen nor oxygen atoms and wherein the $NH_3$-free reactant gas is $H_2$; and
  (iii) applying RF power in a pulse to the reaction space wherein the pulse of TDMAT and/or TDEAT and the pulse of RF power do not overlap; and
  wherein (iv) steps (i) to (iii) are repeated to deposit a TiN film on the substrate, and
  said method further comprising:
  setting a target film stress for the TiN film, which is greater than a film stress of a reference TiN crystalline film being deposited by steps (i) to (iv) under deposition conditions including a reference flow rate of $H_2$ used as the reactant gas in step (ii), and reference RF power used in step (iii); and
  setting a flow rate of $H_2$ used as the reactant gas in step (ii), and RF power used in step (iii), wherein only one or more of the flow rate of $H_2$, and the RF power are used as control parameters for changing the film stress, and are different from the reference flow rate of $H_2$ and the reference RF power, followed by conducting steps (i) to (iv) for depositing the TiN film.

2. The method according to claim 1, wherein the NH$_3$-free reactant gas consists of H$_2$ and a rare gas, thereby depositing a TiN crystalline film.

3. The method according to claim 1, wherein the TiN film has a film stress of −2,500 MPa to 800 MPa.

4. The method according to claim 1, wherein the TiN film has tensile film stress.

5. The method according to claim 4, wherein the set flow rate of H$_2$ is lower than the reference flow rate of H$_2$ used for the reference TiN crystalline film.

6. The method according to claim 4, wherein the set RF power is lower than the reference RF power used for the reference TiN crystalline film.

7. The method according to claim 4, wherein the Ti-containing film contains about 4% to about 9% carbon.

8. The method according to claim 4, wherein the Ti-containing film shows a peak at 2,000 cm$^{-1}$ and substantially no peak at 1,400 cm$^{-1}$ in a Fourier Transform Infrared Spectroscopy (FT-IR) graph.

* * * * *